(12) United States Patent
Park

(10) Patent No.: US 12,310,175 B2
(45) Date of Patent: May 20, 2025

(54) DISPLAY PANEL AND DISPLAY DEVICE HAVING CENTER AND ADJACENT CORNER AREAS SPACED APART FROM EACH OTHER BY A PENETRATION AREA

(71) Applicant: Samsung Display Co., Ltd., Yongin-si (KR)

(72) Inventor: Junhyeong Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 614 days.

(21) Appl. No.: 17/561,615

(22) Filed: Dec. 23, 2021

(65) Prior Publication Data

US 2022/0328569 A1 Oct. 13, 2022

(30) Foreign Application Priority Data

Apr. 8, 2021 (KR) .......................... 10-2021-0046087

(51) Int. Cl.
*H01L 27/32* (2006.01)
*H01L 51/52* (2006.01)
(Continued)

(52) U.S. Cl.
CPC ....... *H10K 59/121* (2023.02); *H10K 50/8428* (2023.02); *H10K 50/844* (2023.02); *H10K 50/8445* (2023.02); *H10K 59/122* (2023.02); *H10K 59/124* (2023.02); *H10K 59/8723* (2023.02); *H10K 59/8731* (2023.02);
(Continued)

(58) Field of Classification Search
CPC ...... H10K 59/18; H10K 59/19; H10K 59/121; H10K 59/1213; H10K 59/1216; H10K 59/122; H10K 59/35–353; H10K 59/8723; H10K 59/873; H10K 59/8731;
(Continued)

(56) References Cited

U.S. PATENT DOCUMENTS 7,501,759 B2 3/2009 Han et al.
10,209,413 B2 2/2019 Wang et al.
(Continued)

FOREIGN PATENT DOCUMENTS

CN 108766977 11/2018
CN 111799310 10/2020
(Continued)

*Primary Examiner* — Victoria K. Hall
(74) *Attorney, Agent, or Firm* — KILE PARK REED & HOUTTEMAN PLLC

(57) ABSTRACT

A display panel including a substrate having a central area and a corner area including a central corner area including a plurality of extension areas and a first adjacent corner area adjacent to the central corner area, a plurality of display elements including a first display element arranged in the plurality of extension areas and a second display element and a third display element arranged in the first adjacent corner area, and an organic pattern surrounding each of the first display element, the second display element, and the third display element. Ends of the plurality of adjacent extension areas are spaced apart from each other by a first penetration area, and an end of the central corner area and an end of the first adjacent corner area that are adjacent to each other are spaced apart from each other by a second penetration area.

15 Claims, 40 Drawing Sheets

(51) Int. Cl.
*H01L 51/56* (2006.01)
*H10K 50/842* (2023.01)
*H10K 50/844* (2023.01)
*H10K 59/121* (2023.01)
*H10K 59/122* (2023.01)
*H10K 59/124* (2023.01)
*H10K 59/80* (2023.01)
*H10K 59/88* (2023.01)
*H10K 71/00* (2023.01)
*H10K 71/80* (2023.01)
*H10K 77/10* (2023.01)
*H10K 59/12* (2023.01)
*H10K 59/18* (2023.01)
*H10K 59/19* (2023.01)
*H10K 59/82* (2023.01)

(52) U.S. Cl.
CPC ............ *H10K 59/88* (2023.02); *H10K 71/00* (2023.02); *H10K 71/80* (2023.02); *H10K 71/851* (2023.02); *H10K 77/111* (2023.02); *H10K 59/1201* (2023.02); *H10K 59/18* (2023.02); *H10K 59/19* (2023.02); *H10K 59/82* (2023.02)

(58) Field of Classification Search
CPC ............ H10K 50/8428; H10K 50/844; H10K 50/8445; H10K 77/111
See application file for complete search history.

(56) References Cited

U.S. PATENT DOCUMENTS

| | | | |
|---|---|---|---|
| 10,535,118 | B2 | 1/2020 | Park et al. |
| 10,638,619 | B2 | 4/2020 | Seo et al. |
| 10,939,547 | B2 | 3/2021 | Lee et al. |
| 11,621,308 | B2 * | 4/2023 | Seo ................ G06F 3/0443 345/174 |
| 11,683,951 | B2 * | 6/2023 | Kim ................ H10K 59/8722 257/40 |
| 11,716,885 | B2 * | 8/2023 | Lee ................ H10K 59/131 257/773 |
| 11,785,797 | B2 * | 10/2023 | Joo ................ H10K 59/131 257/40 |
| 11,825,702 | B2 * | 11/2023 | Song ................ H10K 71/00 |
| 12,016,195 | B2 * | 6/2024 | Lee ................ H10K 59/121 |
| 12,016,216 | B2 * | 6/2024 | Lee ................ H10K 59/121 |
| 2020/0176696 | A1 | 6/2020 | Dai |
| 2020/0342816 | A1 | 10/2020 | Bok |
| 2021/0384465 | A1 * | 12/2021 | Park ................ H10K 50/844 |
| 2022/0005877 | A1 * | 1/2022 | Seo ................ H10K 50/844 |
| 2022/0013746 | A1 * | 1/2022 | Joo ................ H10K 59/131 |
| 2022/0052141 | A1 * | 2/2022 | Lee ................ H10K 59/123 |
| 2022/0069051 | A1 * | 3/2022 | Lee ................ H10K 59/122 |
| 2022/0077242 | A1 * | 3/2022 | Yoon ................ G06F 1/1643 |
| 2022/0077271 | A1 * | 3/2022 | Lee ................ H10K 59/131 |
| 2022/0085327 | A1 * | 3/2022 | Kim ................ H10K 59/124 |
| 2022/0085342 | A1 * | 3/2022 | Kim ................ H10K 77/10 |
| 2022/0093897 | A1 * | 3/2022 | Lee ................ H10K 59/8731 |
| 2022/0149303 | A1 * | 5/2022 | Lee ................ H10K 77/111 |
| 2022/0149324 | A1 * | 5/2022 | Park ................ H10K 50/844 |
| 2022/0165805 | A1 * | 5/2022 | Choi ................ H10K 50/844 |
| 2022/0199920 | A1 * | 6/2022 | Kim ................ H10K 50/844 |
| 2022/0216276 | A1 * | 7/2022 | Lee ................ H10K 59/122 |
| 2022/0320189 | A1 * | 10/2022 | Lee ................ H10K 59/353 |
| 2023/0094306 | A1 * | 3/2023 | Park ................ H10K 77/10 257/40 |
| 2023/0147646 | A1 * | 5/2023 | Kim ................ H10K 59/873 257/40 |

FOREIGN PATENT DOCUMENTS

| | | |
|---|---|---|
| KR | 10-0667933 | 1/2007 |
| KR | 10-2018-0052837 | 5/2018 |
| KR | 10-2018-0137644 | 12/2018 |
| KR | 10-2019-0102123 | 9/2019 |
| KR | 10-2020-0126467 | 11/2020 |

* cited by examiner

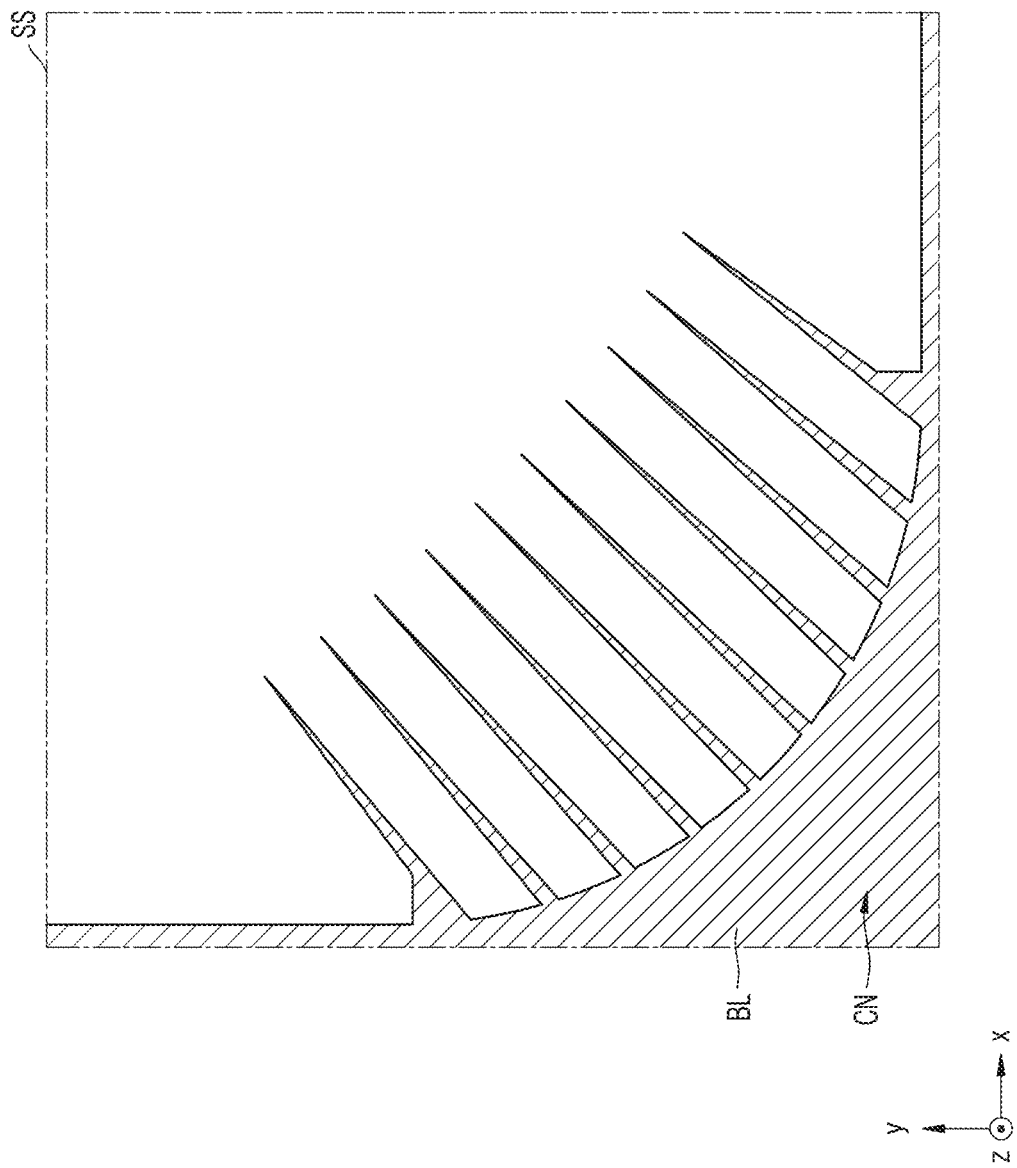

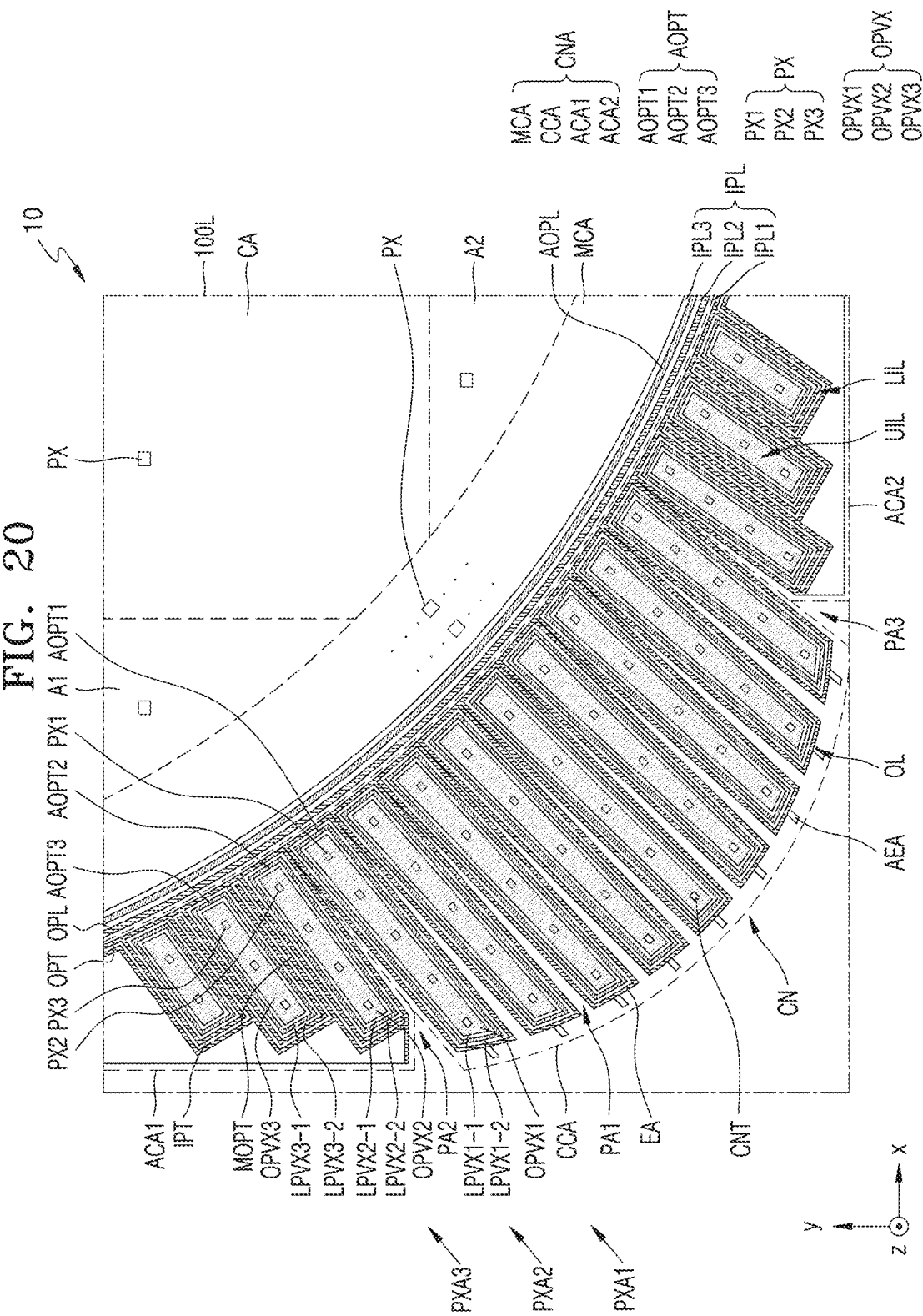

DISPLAY PANEL AND DISPLAY DEVICE HAVING CENTER AND ADJACENT CORNER AREAS SPACED APART FROM EACH OTHER BY A PENETRATION AREA

CROSS-REFERENCE TO RELATED APPLICATION

This application claims priority from and the benefit of Korean Patent Application No. 10-2021-0046087, filed on Apr. 8, 2021, which is hereby incorporated by reference for all purposes as if fully set forth herein.

BACKGROUND

Field

Embodiments of the invention relate generally to a display panel in which an image display area is extended, a display device, and a method of manufacturing the display device.

Discussion of the Background

Electronic devices based on mobility are widely used. In addition to small electronic devices, such as mobile phones, tablet PCs have become recently widely used as mobile electronic devices.

Such mobile electronic devices include display devices having various functions, for example, providing visual information, such as images or videos, to a user. Recently, as other components for driving the display device are miniaturized, the proportion of the display device in electronic devices is gradually increased, and a structure that can be bent to have a certain angle in a flat state is being developed.

The above information disclosed in this Background section is only for understanding of the background of the inventive concepts, and, therefore, it may contain information that does not constitute prior art.

SUMMARY

One or more embodiments provide a display panel in which an image display area is extended while increasing reliability, a display device, and a method of manufacturing the display device.

Additional features of the inventive concepts will be set forth in part in the description which follows and, in part, will be apparent from the description, or may be learned by practice of the presented embodiments of the inventive concepts.

An embodiment of the present invention provides a display panel including a display panel including a substrate having a central area and a corner area, wherein the corner area includes a central corner area including a plurality of extension areas extending in a direction away from the central area and a first adjacent corner area adjacent to the central corner area, a plurality of display elements including a first display element arranged in the plurality of extension areas and a second display element and a third display element arranged in the first adjacent corner area, and an organic pattern arranged on the substrate and surrounding each of the first display element, the second display element, and the third display element. Ends of the plurality of adjacent extension areas are spaced apart from each other by a first penetration area, and an end of the central corner area and an end of the first adjacent corner area that are adjacent to each other are spaced apart from each other by a second penetration area.

The display device may further include an inorganic pattern arranged in the first adjacent corner area. Each of the first display elements, the second display element, and the third display element is provided in plurality to constitute a first pixel array, a second pixel array, respectively, and a third pixel array, the organic pattern surrounds each of the first pixel array, the second pixel array, and the third pixel array, and the inorganic pattern extends between the second pixel array and the third pixel array.

The inorganic pattern may surround at least a portion of each of the second pixel array and the third pixel array.

The inorganic pattern may include a first portion extending in a direction closer to the central area, a curved portion extending from the first portion in a curve shape, and a second portion extending from the curved portion in a direction away from the central area.

The display device may further include an inorganic pattern arranged in the first adjacent corner area, and an organic insulating layer arranged on the inorganic pattern and having a hole overlapping at least a portion of the inorganic pattern, wherein the plurality of display elements and the organic pattern are arranged on the organic insulating layer.

The display device may further include an upper inorganic pattern arranged between the organic insulating layer and the organic pattern and having a protruding tip protruding in a center direction of the hole.

The display device may further include an encapsulating layer covering the plurality of display elements and including at least one inorganic encapsulating layer and at least one organic encapsulating layer. The at least one organic encapsulating layer includes a first encapsulating area covering the first display element, a second encapsulating layer covering the second display element, and a third encapsulating area covering the third display element, and the first encapsulating area, the second encapsulating area, and the third encapsulating area are separated from each other based on the organic pattern.

The display device may further include an inorganic insulating layer arranged between the substrate and the plurality of display elements, and a lower organic insulating layer arranged between the inorganic insulating layer and the plurality of display elements. The inorganic insulating layer and the lower organic insulating layer arranged in the central corner area are disconnected from the inorganic insulating layer and the lower organic insulating layer arranged in the first adjacent corner area with the second penetration area therebetween, and the inorganic insulating layer and the lower organic insulating layer arranged in the first adjacent corner area are respectively continuously arranged.

The substrate may further include a first area extending from the center area in a first direction and a second area extending from the central area in a second direction crossing the first direction, and the corner area may surround at least a portion of the first area, the second area, and the central area, and at least a portion of the first area may be arranged between the central area and the first adjacent corner area in the first direction.

The corner area may further include a second adjacent corner area adjacent to the central corner area, and an end of the central corner area and an end of the second adjacent corner area may be spaced apart from each other by a third penetration area, and at least a portion of the second area may be arranged between the central area and the second adjacent corner area in the second direction.

Another embodiment of the present invention provides a display device including a display panel and a cover window arranged on the display panel. The display panel includes a substrate having a central area and a corner area being bent, wherein the corner area includes a central corner area including a plurality of extension areas extending in a direction away from the central area and a first adjacent corner area adjacent to the central corner area, a plurality of display elements including a first display element arranged in the plurality of extension areas and a second display element and a third display element arranged in the first adjacent corner area, and an organic pattern arranged on the substrate and surrounding each of the first display element, the second display element, and the third display element. Ends of the plurality of adjacent extension areas are spaced apart from each other by a first penetration area, and an end of the central corner area and an end of the first adjacent corner area are spaced apart from each other by a second penetration area.

The display device may further include an inorganic pattern arranged on the substrate, wherein each of the first display element, the second display element, and the third display element is provided in plurality to constitute a first pixel array, a second pixel array, and a third pixel array, respectively, and the organic pattern includes a first portion extending between the second pixel array and the third pixel array and extending in a direction closer to the central area, a curved portion extending from the first portion in a curve shape, and a second portion extending from the curved portion in a direction away from the central area.

The display panel may further include an encapsulating layer covering the plurality of display elements and including at least one inorganic encapsulating layer and at least one organic encapsulating layer, wherein the at least one organic encapsulating layer includes a first encapsulating area covering the first display element, a second encapsulating area covering the second display element, and a third encapsulating area covering the third display element, and the first encapsulating area, the second encapsulating area, and the third encapsulating area are spaced apart from each other based on the organic pattern.

The substrate may further include a first area extending from the central area in a first direction and a second area extending from the central area in a second direction crossing the first direction, wherein the corner area surrounds at least a portion of the first area, the second area, and the central area, and at least a portion of the first area and the first adjacent corner area are arranged and bent in the first direction.

The corner area may further include a second adjacent corner area adjacent to the central corner area, wherein an end of the central corner area and an end of the second adjacent corner area are spaced apart from each other by a third penetration area, and at least a portion of the second area and the second adjacent corner area may be arranged and bent in the second direction.

Another embodiment of the present invention provides a method of manufacturing a display device, including forming a substrate layer on a support substrate, wherein the substrate layer has a central area, a central corner area extending in a direction away from the central area, and a first adjacent corner area adjacent to the central corner area, forming a plurality of pixel electrodes, wherein the plurality of pixel electrodes include a first pixel electrode arranged in the central corner area, and a second pixel electrode and a third pixel electrode arranged in the first adjacent corner area, forming an organic pattern, wherein the organic pattern surrounds each of the first pixel electrode, the second pixel electrode, and the third pixel electrode, and removing at least a portion of the substrate layer between the central corner area and the first adjacent corner area.

The method may further include forming a plurality of display elements by forming an emission layer and an opposite electrode on each of the plurality of pixel electrodes, wherein the plurality of display elements include a first display element, a second display element, and a third display element, forming at least one inorganic encapsulating layer on the plurality of display elements, and forming at least one organic encapsulating layer on the at least one inorganic encapsulating layer, wherein the at least one organic encapsulating layer includes a first encapsulating area covering the first display element, a second encapsulating area covering the second display element, and a third encapsulating area covering the third display element, and the first encapsulating area, the second encapsulating area, and the third encapsulating area may be spaced apart from each other.

Each of the first display element, the second display element, and the third display element may be provided in plurality to constitute a first pixel array, a second pixel array, and a third pixel array, respectively, and the forming of the at least one organic encapsulating layer checking the first pixel array, the second pixel array, and the third pixel array and discharging monomer in consideration of the first pixel array, the second pixel array, and the third pixel array.

The method may further include forming an inorganic pattern on the substrate layer, and forming an organic insulating layer on the inorganic pattern, wherein the removing of at least a portion of the substrate layer includes forming a hole exposing at least a portion of the inorganic pattern when at least a portion of the substrate layer is removed.

The method may further include detaching the substrate layer from the support substrate, bending the central corner area, and arranging a cover window in the central area and the central corner area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 9 is a plan view illustrating a method of manufacturing a display device according to an embodiment.

FIGS. 18, 19, and 20 are plan views illustrating a method of manufacturing a display device according to another embodiment.

DETAILED DESCRIPTION

Figure 1:
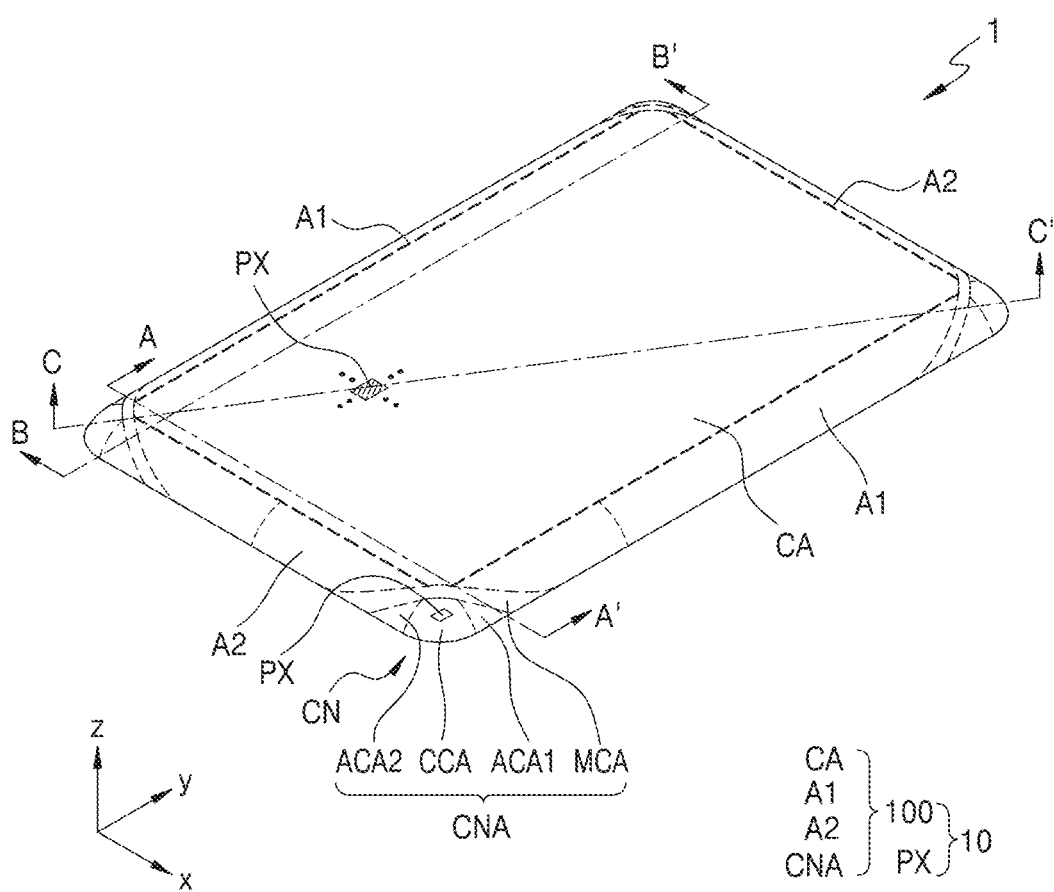
FIG. 1 is a perspective view schematically illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display device that is a device that displays a moving image or still image may be used as a display screen of portable electronic devices such as a mobile phone, a smart phone, a tablet personal computer (PC), a mobile communication terminal, an electronic notebook, an e-book, and a portable multimedia player (PMP), a navigation device, and an ultra mobile PC (UMPC) and a display screen of various products such as televisions, laptops, monitors, billboards, and Internet of things (IOT). Also, a display device according to an embodiment may be used in a wearable device such as a smart watch, a watch phone, a glasses-type display, and a head mounted display (HMD). Also, the display device according to an embodiment may be used as a center information display (CID) disposed on an instrumental panel of a vehicle, a center fascia or a dashboard of the vehicle, a room mirror display instead of a side mirror of the vehicle, or a display placed on a rear surface of a front seat as entertainment for a rear seat of the vehicle.

Figure 2A:
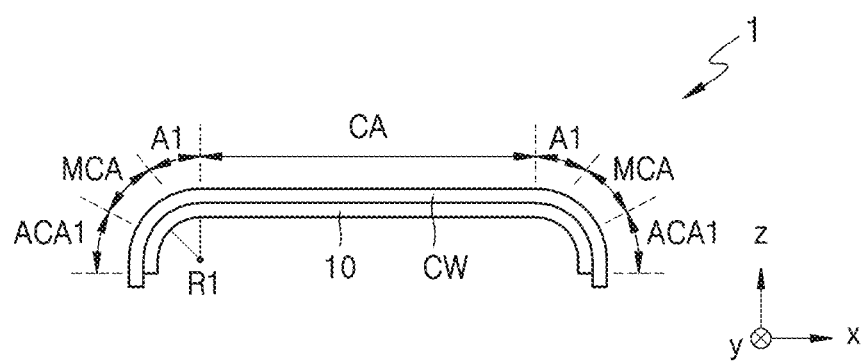
FIG. 2A is a cross-sectional view of the display device taken along line A-A' of FIG. 1.
Figure 2B:
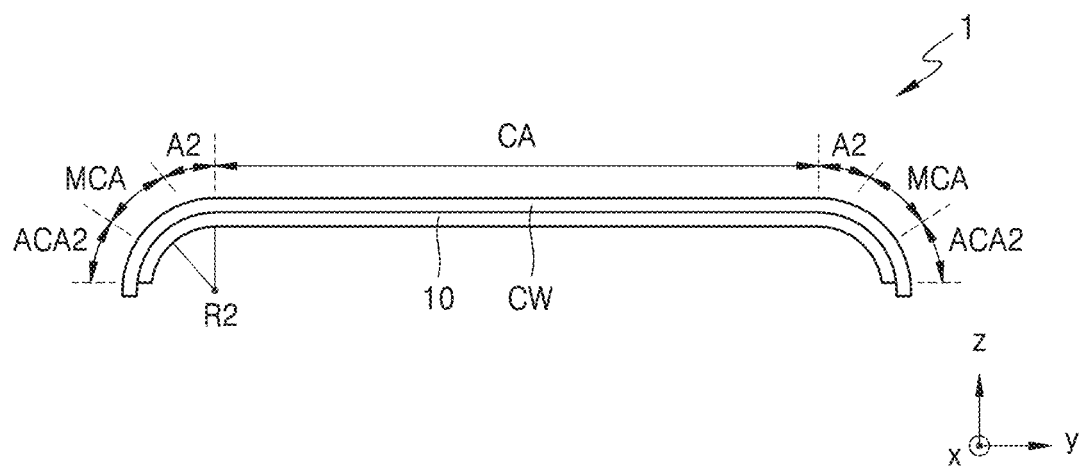
FIG. 2B is a cross-sectional view of the display device taken along line B-B' of FIG. 1.
Figure 2C:
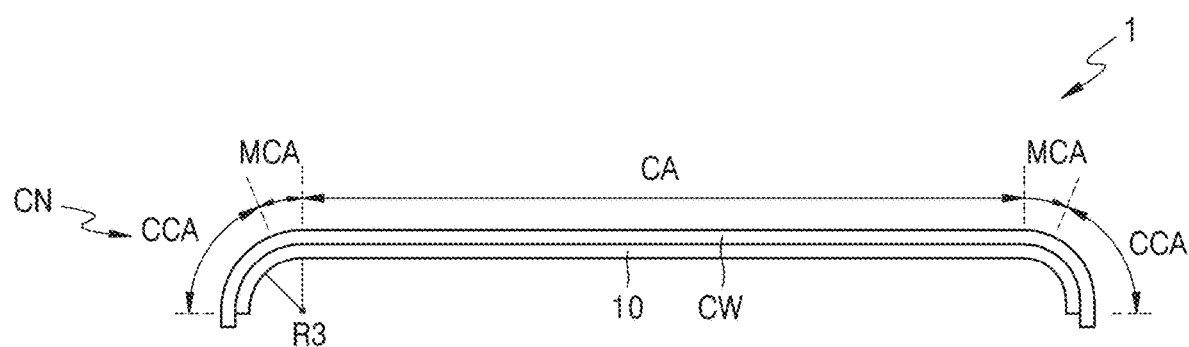
FIG. 2C is a cross-sectional view of the display device taken along line C-C' of FIG. 1.

FIG. 1 is a perspective view schematically illustrating a display device 1 according to an embodiment. FIG. 2A is a cross-sectional view of the display device 1 taken along line A-A' of FIG. 1. FIG. 2B is a cross-sectional view of the display device 1 taken along line B-B' of FIG. 1. FIG. 2C is a cross-sectional view of the display device 1 taken along line C-C' of FIG. 1.

Referring to FIGS. 1 and 2A through 2C, the display device 1 may display an image. The display device 1 may have an edge in a first direction and an edge in a second direction. Here, the first direction and the second direction may be directions crossing each other. For example, the first direction and the second direction may be at an acute angle to each other. In another example, the first direction and the second direction may form an obtuse angle with each other or may be orthogonal to each other. Hereinafter, a case where the first direction and the second direction are orthogonal to each other, will be described in detail. For example, the first direction may be an x-direction or an −x-direction, and the second direction may be a y-direction or a −y-direction.

In an embodiment, a corner CN in which the edge in the first direction (for example, an x-direction or an −x-direction) and the edge in the second direction (for example, a y-direction or a −y-direction) cross each other, may have a certain curvature.

The display device 1 may include a cover window CW and a display panel 10. The cover window CW may perform a function of protecting the display panel 10. In an embodiment, the cover window CW may be arranged on the display panel 10. In an embodiment, the cover window CW may be a flexible window. The cover window CW may be easily bent by an external force without occurrence of cracks and may protect the display panel 10. The cover window CW may include a glass, sapphire, or plastic. The cover window CW may be, for example, an ultra-thin glass (UTG) or colorless polyimide (CPI). In an embodiment, the cover window CW may have a structure in which a flexible polymer layer is disposed on one surface of a glass substrate, or may include only a polymer layer.

The display panel 10 may be disposed under the cover window CW. Although not shown, the display panel 10 may be attached to the cover window CW by using a transparent adhesive member, such as an optically clear adhesive (OCA).

The display panel 10 may display an image. The display panel 10 may include a substrate 100 and a pixel PX disposed on the substrate 100. In an embodiment, a plurality of pixels PX may be provided, and the plurality of pixels PX may emit light and display an image. In an embodiment, each of the plurality of pixels PX may include a red subpixel, a green subpixel, and a blue subpixel. Alternatively, each of the plurality of pixels PX may include a red subpixel, a green subpixel, a blue subpixel, and a white subpixel.

The substrate 100 may include a central area CA, a first area A1, a second area A2, and a corner area CNA. In an embodiment, the shape of the substrate 100 may define the shape of the display device 1. The pixels PX may be arranged in at least one of the central area CA, the first area A1, the second area A2, and the corner area CNA. In an embodiment, the plurality of pixels PX may be arranged in the central area CA, the first area A1, the second area A2, and the corner area CNA. In this case, the display device 1 may display an image in the central area CA, the first area A1, the second area A2, and the corner area CNA. In an embodiment, each of the plurality of pixels PX arranged in the central area CA, the first area A1, the second area A2, and the corner area CNA may provide an independent image. In another embodiment, each of the plurality of pixels PX arranged in the central area CA, the first area A1, the second area A2, and the corner area CNA may provide portions of any image.

The central area CA may be a flat area. In an embodiment, the display device 1 may provide most of images in the central area CA.

The first area A1 may extend and be bent from the central area CA in a first direction (for example, an x-direction or an −x-direction). The first area A1 may be defined as an area that is bent from the central area CA in a cross-section (for example, an xz-cross section) in the first direction (for example, an x-direction or an −x-direction). The first area A1 may extend in the second direction (for example, a y-direction or a −y-direction). In other words, the first area A1 may not be bent in a cross-section (for example, an yz-cross section) in the second direction (for example, a y-direction or a −y-direction). The first direction A1 may be connected to the central area CA in the first direction (for example, an x-direction or an −x-direction). In FIG. 2A, the first area A1 that extends and is bent from the central area CA in the x-direction, and the first area A1 that extends and is bent from the central area CA in the −x-direction have the same curvature. However, in another embodiment, the first area A1 that extends and is bent from the central area CA in the x-direction, and the first area A1 that extends and is bent from the central area CA in the −x-direction may have different curvatures.

The second area A2 may extend and be bent from the central area CA in the second direction (for example, a y-direction or a −y-direction). The second area A2 may be defined as an area that is bent from the central area CA in a cross-section (for example, an yz-cross section) in the second direction (for example, a y-direction or a −y-direction). The second area A2 may extend in the first direction (for example, an x-direction or an −x-direction). The second area A2 may not be bent in a cross-section (for example, an xz-cross section) that is orthogonal to the first direction (for example, an x-direction or an −x-direction). In FIG. 2B, the second area A2 that extends and is bent from the central area CA in the y-direction, and the second area A2 that extends and is bent from the central area CA in the −y-direction, have the same curvature. However, in another embodiment, the second area A2 that extends and is bent from the central area CA in the y-direction, and the second area A2 that extends and is bent from the central area CA in the −y-direction may have different curvatures.

The corner area CNA may be an area in the corner CN of the display device 1. In an embodiment, the corner area CNA may be an area in which the edge in the first direction (for example, an x-direction or an −x-direction) of the display device 1 or an edge in the second direction (for example, a y-direction or a −y-direction) cross each other. In an embodiment, the corner area CNA may surround at least a portion of the central area CA, the first area A1, and the second area A2. When the first area A1 extends and is bent in the first direction (for example, an x-direction or an −x-direction) and the second area A2 extends and is bent in the second direction (for example, a y-direction or a −y-direction), at least a portion of the corner area CNA may extend and be bent in the first direction (for example, an x-direction or an −x-direction) and may extend and be bent in the second direction (for example, a y-direction or a −y-direction). The corner area CNA may include a central corner area CCA, a first adjacent corner area ACA1, a second adjacent corner area ACA2, and a middle corner area MCA.

The central corner area CCA may extend and be bent in the first direction (for example, an x-direction or an −x-direction) and may extend and be bent in the second direction (for example, a y-direction or a −y-direction). The central corner area CCA may be bent in a cross-section (for example, an xz-cross section) in the first direction (for example, an x-direction or an −x-direction). The central corner area CCA may be bent in a cross-section (for example, an yz-cross section) in the second direction (for example, a y-direction or a −y-direction). The central corner area CCA may be a double curve area in which curvatures in a plurality of directions overlap.

The first adjacent corner area ACA1 may be adjacent to the central corner area CCA. In an embodiment, the first adjacent corner area ACA1 may be arranged between the central corner area CCA and the first area A1. In other words, at least a portion of the first area A1 may be arranged between the central area CA and the first adjacent corner area ACA1 in the first direction (for example, an x-direction or an −x-direction). The first adjacent corner area ACA1 may extend and be bent in the first direction (for example, an x-direction or an −x-direction). The first adjacent corner area ACA1 may be defined as a corner area CNA that is bent in a cross-section (for example, an xz-cross section) in the first direction (for example, an x-direction or an −x-direction). In an embodiment, at least a portion of the first area A1 and the first adjacent corner area ACA1 may be arranged and bent in the first direction (for example, an x-direction or an −x-direction). In an embodiment, the first adjacent corner area ACA1 may be a corner area CNA that is not substantially bent in a cross-section (for example, a yz-cross section) in the second direction (for example, a y-direction or a −y-direction).

The second adjacent corner area ACA2 may be adjacent to the central corner area CCA. In an embodiment, the central corner area CCA may be arranged between the first adjacent corner area ACA1 and the second adjacent corner area ACA2. In an embodiment, the second adjacent corner area ACA2 may be arranged between the central corner area CCA and the second area A2. In other words, at least a portion of the second area A2 may be arranged between the central area CA and the second adjacent corner area ACA2 in the second direction (for example, a y-direction or a −y-direction). The second adjacent corner area ACA2 may extend and be bent in the second direction (for example, a y-direction or a −y-direction). The second adjacent corner area ACA2 may be defined as a corner area CNA that is bent in a cross-section (for example, an yz-cross section) in the second direction (for example, a y-direction or a −y-direction). In an embodiment, at least a portion of the second area A2 and the second adjacent corner area ACA2 may be arranged and bent in the second direction (for example, a y-direction or a −y-direction). In an embodiment, the second adjacent corner area ACA2 may be a corner area CNA that is not substantially bent in a cross-section (for example, an yz-cross section) in the first direction (for example, an x-direction or −x-direction).

The middle corner area MCA may be arranged between the central area CA and the central corner area CCA. In an embodiment, the middle corner area MCA may extend between the first area A1 and the first adjacent corner area ACA1. In an embodiment, the middle corner area MCA may extend between the second area A2 and the second adjacent corner area ACA2. A driving circuit for providing an electrical signal to the pixels PX and/or a power line for providing power may be arranged in the middle corner area MCA. In this case, the pixels PX arranged in the middle corner area MCA may overlap the driving circuit and/or the power line. In some embodiments, the middle corner area MCA may be omitted.

Referring to FIG. 2A, the first area A1, the middle corner area MCA, and the first adjacent corner area ACA1 may have a first curvature radius R1 and may be bent. Referring to FIG. 2B, the second area A2, the middle corner area MCA, and the second adjacent corner area ACA2 may have a second curvature radius R2 and may be bent. The first curvature radius R1 and the second curvature radius R2 may be the same or different from each other. Referring to FIG. 2C, the middle corner area MCA and the central corner area CCA may have a third curvature radius R3 and may be bent.

The plurality of pixels PX may be arranged in the central area CA, the first area A1, the second area A2, and the corner area CNA so that the display device 1 may display an image. Thus, the proportion of a display area of the display device 1 in which an image is displayed, may increase. Also, because the display device 1 may be bent in the corner CN and may display an image, the sense of aesthetics may be enhanced.

Figure 3:
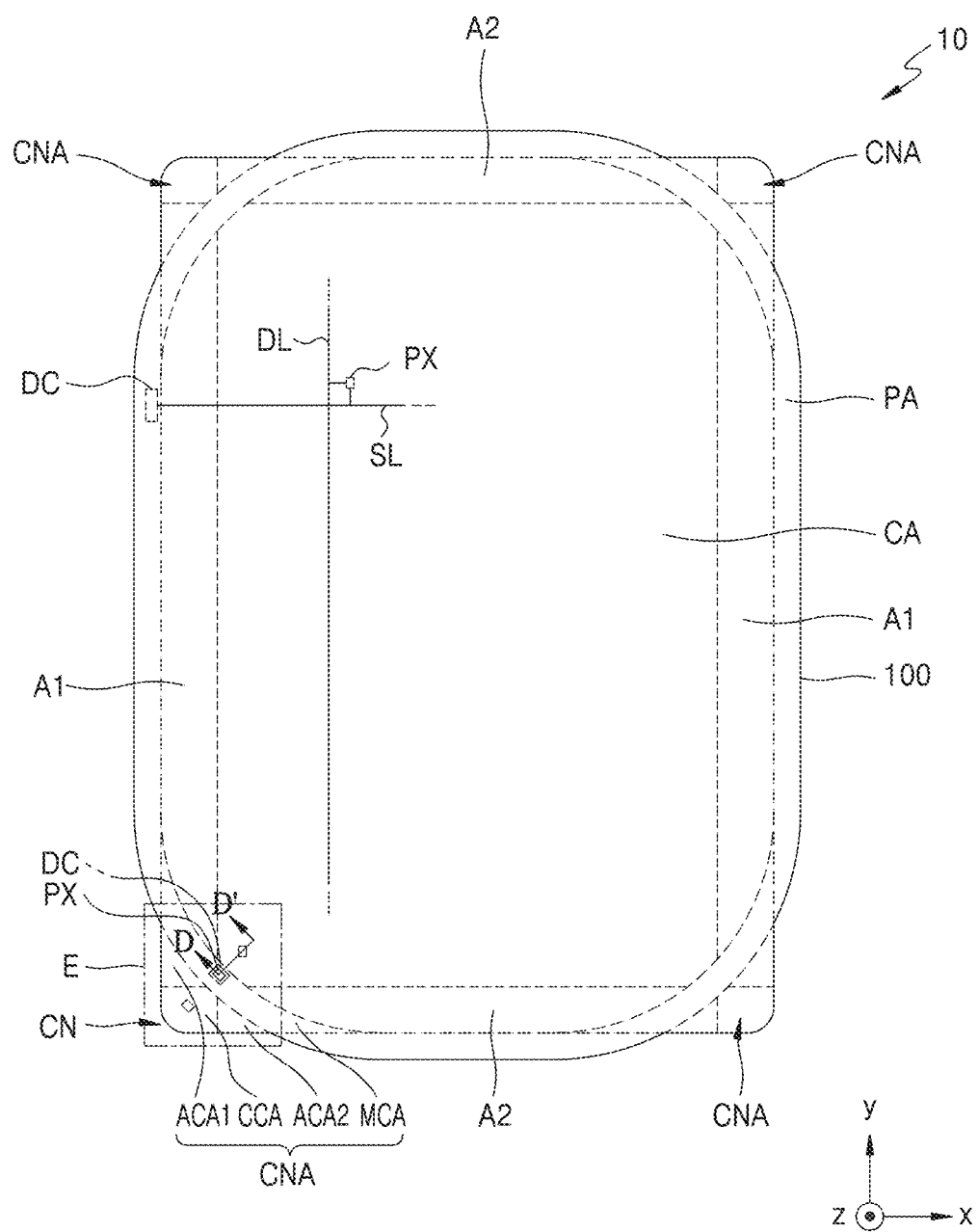
FIG. 3 is a plan view schematically illustrating a display panel according to an embodiment.

FIG. 3 is a plan view schematically illustrating a display panel 10 according to an embodiment. FIG. 3 is a plan view schematically illustrating a state in which the display panel 10 is in an unbending state.

Referring to FIG. 3, the display panel 10 may display an image. The display panel 10 may include a substrate 100 and a pixel PX arranged on the substrate 100. In an embodiment, a plurality of pixels PX may be provided.

The pixels PX may include a display element. In an embodiment, the display element may be an organic light emitting diode including an organic emission layer. Alternatively, the display element may be a light emitting diode (LED). The size of the light emitting diode (LED) may be a micro-scale or nano-scale. For example, the light emitting diode (LED) may be a micro LED. Alternatively, the lighting emitting diode (LED) may be a nanorod LED. The nanorod LED may include gallium nitride (GaN). In an embodiment, a color conversion layer may be arranged on the nanorod LED. The color conversion layer may include a quantum dot. Alternatively, the display element may be a quantum dot light emitting diode including a quantum dot emission layer. Alternatively, the display element may be an inorganic light emitting diode including an inorganic semiconductor.

The pixels PX may include a plurality of subpixels, and each of the plurality of subpixels may emit light of certain color by using the display element. In the present specification, the subpixel may refer to an emission area in a minimum unit for implementing an image. When the organic light emitting diode is used as the display element, the emission area may be defined by an opening of a pixel defining layer. This will be described later.

The substrate 100 may include a central area CA, a first area A1, a second area A2, a corner area CNA, and a peripheral area PA. In an embodiment, the shape of the substrate 100 may define the shape of the display device 1. The pixels PX may be arranged in at least one of the central area CA, the first area A1, the second area A2, and the corner area CNA.

The central area CA may be a flat area. In an embodiment, the display panel 10 may provide most of the images in the central area CA.

The first area A1 may extend from the central area CA in the first direction (for example, an x-direction or an −x-direction). The first area A1 may be connected to the central area CA in the first direction (for example, an x-direction or an −x-direction).

The second area A2 may extend from the central area CA in the second direction (for example, a y-direction or a −y-direction). The second area A2 may be connected to the central area CA in the second direction (for example, a y-direction or a −y-direction).

The corner area CNA may be an area in the corner CN of the display panel 10. In an embodiment, the corner area CNA may be an area in which the edge in the first direction (for example, an x-direction or an −x-direction) of the display panel 10 and the edge in the second direction (for example, a y-direction or a −y-direction) cross each other. In an embodiment, the corner area CNA may surround at least a portion of the central area CA, the first area A1, and the second area A2. The corner area CNA may include the central corner area CCA, the first adjacent corner area ACA1, the second adjacent corner area ACA2, and the middle corner area MCA.

The first adjacent corner area ACA1 may be adjacent to the central corner area CCA. In an embodiment, the first adjacent corner area ACA1 may be arranged between the central corner area CCA and the first area A1. In other words, at least a portion of the first area A1 may be arranged between the central area CA and the first adjacent corner area ACA1 in the first direction (for example, an x-direction or an −x-direction). In an embodiment, at least a portion of the first area A1 and the first adjacent corner area ACA1 may be arranged in the first direction (for example, an x-direction or an −x-direction).

The second adjacent corner area ACA2 may be adjacent to the central corner area CCA. In an embodiment, the central corner area CCA may be arranged between the first adjacent corner area ACA1 and the second adjacent corner area ACA2. In an embodiment, the second adjacent corner area ACA2 may be arranged between the central corner area CCA and the second area A2. In other words, at least a portion of the second area A2 may be arranged between the central area CA and the second adjacent corner area ACA2 in the second direction (for example, a y-direction or a −y-direction). In an embodiment, at least a portion of the second area A2 and the second adjacent corner area ACA2 may be arranged in the second direction (for example, a y-direction or a −y-direction).

The middle corner area MCA may be arranged between the central area CA and the central corner area CCA. In an embodiment, the middle corner area MCA may extend between the first area A1 and the first adjacent corner area ACA1. In an embodiment, the middle corner area MCA may extend between the second area A2 and the second adjacent corner area ACA2. A driving circuit DC for providing an electrical signal to the pixels PX and/or a power line for providing power may be arranged in the middle corner area MCA. In this case, the pixels PX arranged in the middle corner area MCA may overlap the driving circuit DC and/or the power line. In some embodiments, the middle corner area MCA may be omitted.

The peripheral area PA may be an area in which an image is not provided. The peripheral area PA may extend from the first area A1 and/or the second area A2 outwards. The driving circuit DC for providing an electrical signal to the pixels PX or the power line for providing power may be arranged in the peripheral area PA. The driving circuit DC may be arranged along the middle corner area MCA and/or the peripheral area PA.

The driving circuit DC may be a scan driving circuit for providing a scan signal to each of the pixels PX through a scan line SL. Alternatively, the driving circuit DC may be a data driving circuit for providing a data signal to each pixel PX through a data line DL. In an embodiment, the data driving circuit may be disposed adjacent to one side of the display panel. For example, the data driving circuit may be arranged in the peripheral area PA adjacent to the second area A2.

At least one of the first area A1, the second area A2, and the corner area CNA may be bent. The first area A1 and the first adjacent corner area ACA1 may be bent in a cross-section (for example, an xz-cross section) in the first direction (for example, an x-direction or an −x-direction). The second area A2 and the second adjacent corner area ACA2 may be bent in a cross-section (for example, an yz-cross section) in the second direction (for example, a y-direction or a −y-direction). The central corner area CCA may be bent in a cross-section (for example, an xz-cross section) in the first direction (for example, an x-direction or an −x-direction) and may be bent in a cross-section (for example, a yz-cross section) in the second direction (for example, a y-direction or a −y-direction).

When the central corner area CCA is bent, a compressive strain greater than a tensile strain may occur in the central corner area CCA. In this case, a contractible substrate 100 and a multilayer film structure on the substrate 100 need to be applied to the central corner area CCA. In an embodiment, the structure of the display panel 10 in the central corner area CCA may be different from that of the display panel 10 in the first adjacent corner area ACA1 and/or the second adjacent corner area ACA2.

Figure 4:
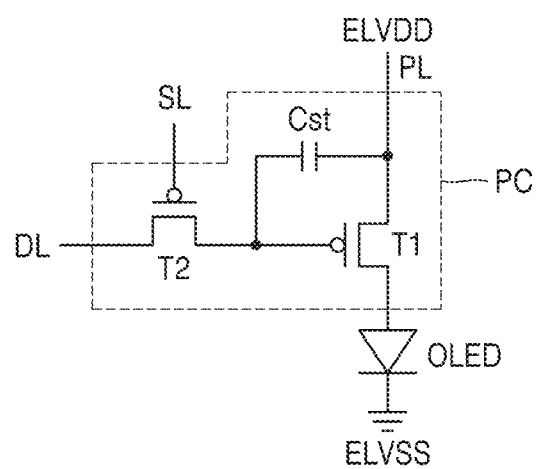
FIG. 4 is an equivalent circuit diagram schematically illustrating a pixel circuit that may be applied to the display panel.

FIG. 4 is an equivalent circuit diagram schematically illustrating a pixel circuit PC that may be applied to a display panel.

Referring to FIG. 4, the pixel circuit PC may be electrically connected to the display element, for example, an organic light emitting diode OLED.

The pixel circuit PC may include a driving thin-film transistor T1, a switching thin-film transistor T2, and a storage capacitor Cst. In an embodiment, the organic light emitting diode OLED may emit red, green, or blue light, or may emit red, green, blue, or white light.

The switching thin-film transistor T2 may be connected to the scan line SL and the data line DL and may transmit a data signal or data voltage input from the data line DL to a driving thin-film transistor T1 based on a scan signal or switching voltage input from the scan line SL. The storage capacitor Cst may be connected to a switching thin-film transistor T2 and a driving voltage line PL and may store a voltage corresponding to a difference between a voltage transmitted from the switching thin-film transistor T2 and a first power supply voltage ELVDD supplied to the driving voltage line PL.

The driving thin-film transistor T1 may be connected to the driving voltage line PL and the storage capacitor Cst and may control a driving current that flows through the organic light emitting diode OLED from the driving voltage line PL in correspondence to a value of a voltage stored in the storage capacitor Cst. The organic light emitting diode OLED may emit light having a certain luminance by the driving current. An opposite electrode of the organic light emitting diode OLED may receive a second power supply voltage ELVSS.

FIG. 4 illustrates that the pixel circuit PC includes two thin-film transistors and one storage capacitor. However, the pixel circuit PC may include more thin-film transistors.

Figure 5:
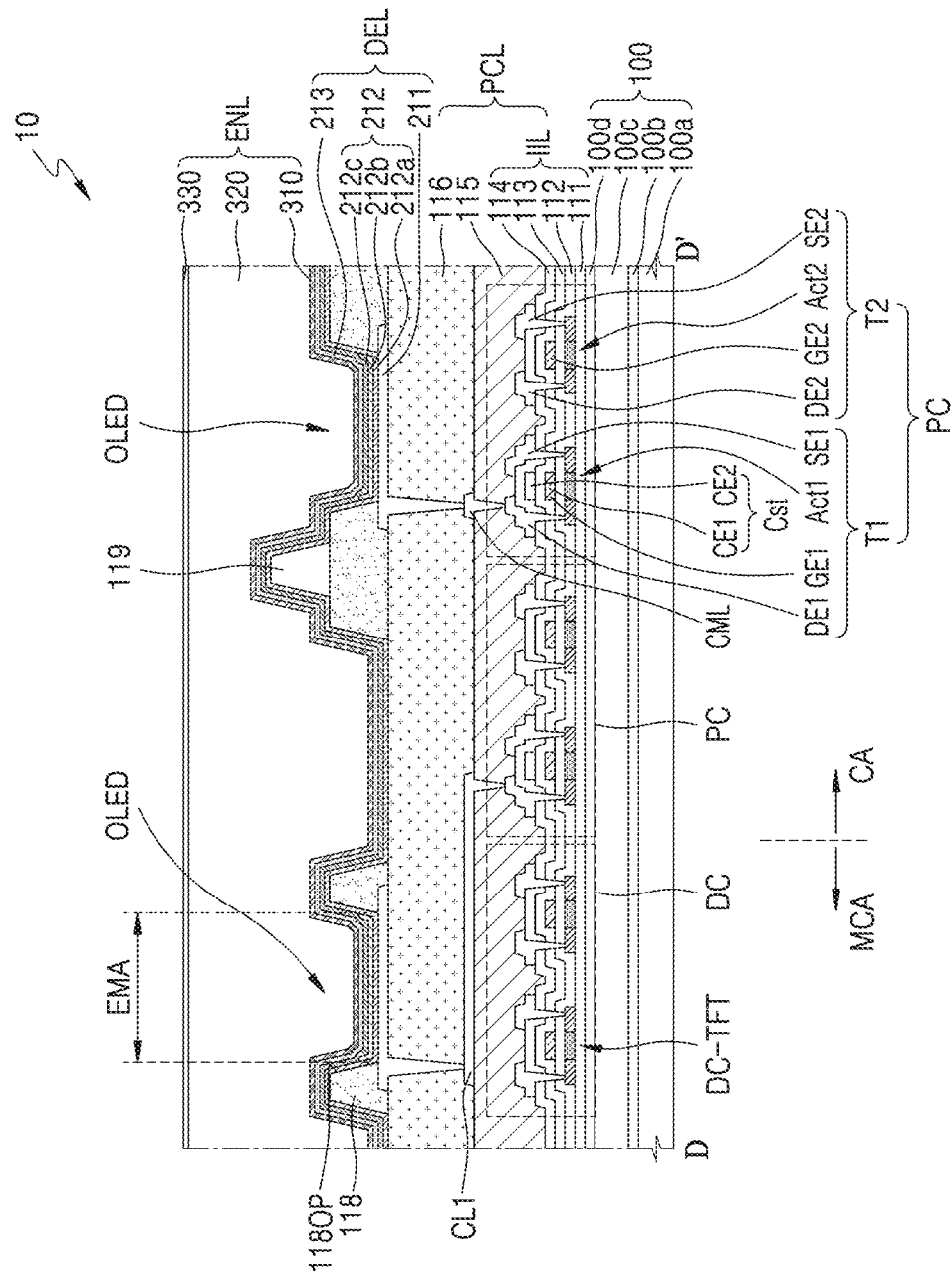
FIG. 5 is a cross-sectional view schematically illustrating the display panel taken along line D-D' of FIG. 3.

FIG. 5 is a cross-sectional view schematically illustrating the display panel 10 taken along line D-D' of FIG. 3.

Referring to FIG. 5, the display panel 10 may include a substrate 100, a pixel circuit layer PCL, a display element layer DEL, and an encapsulating layer ENL.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked and provided in the substrate 100. In another embodiment, the substrate 100 may include a glass.

At least one of the first base layer 100a and the second base layer 100c may include polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d that are barrier layers for preventing penetration of external foreign substances may include a single layer or multiple layers including an inorganic material, such as silicon nitride ($SiN_x$), silicon oxide ($SiO_2$), and/or silicon oxynitride (SiON).

The pixel circuit layer PCL may be arranged on the substrate 100. The pixel circuit layer PCL may include a driving circuit DC and a pixel circuit PC. In an embodiment, the driving circuit DC may be arranged in the middle corner area MCA. In another embodiment, the driving circuit DC may not be arranged in the middle corner area MCA. In this case, the driving circuit DC may be arranged in the peripheral area. Hereinafter, a case where the driving circuit DC is arranged in the middle corner area MCA will be described in detail.

The pixel circuit PC may be arranged in the central area CA. In an embodiment, the pixel circuit PC may be spaced apart from the middle corner area MCA. In other words, the pixel circuit PC may not overlap the middle corner area MCA. In another embodiment, the pixel circuit PC may overlap the middle corner area MCA.

The driving circuit DC may include a driving circuit thin-film transistor DC-TFT. In an embodiment, the driving circuit DC may be connected to the scan line. The pixel circuit PC may include at least one thin-film transistor. In an embodiment, the pixel circuit PC may include a driving thin-film transistor T1, a switching thin-film transistor T2, and a storage capacitor Cst.

The pixel circuit layer PCL may include an inorganic insulating layer IIL, a lower organic insulating layer 115, and an organic insulating layer 116, which are arranged under or/and on elements of the driving thin-film transistor T1. The inorganic insulating layer IIL may include a buffer layer 111, a first gate insulating layer 112, a second gate insulating layer 113, and an interlayer insulating layer 114. The driving thin-film transistor T1 may include a first semiconductor layer Act1, a first gate electrode GE1, a first source electrode SE1, and a first drain electrode DE1.

The buffer layer 111 may be arranged on the buffer layer 100. The buffer layer 111 may include an inorganic insulating material such as silicon nitride ($SiN_x$), silicon oxynitride (SiON), and silicon oxide ($SiO_2$), and may be a single layer or multiple layers including the inorganic insulating material described above.

The first semiconductor layer Act1 may be arranged on the buffer layer 111. The first semiconductor layer Act1 may include polysilicon. Alternatively, the first semiconductor layer Act1 may include amorphous silicon, an oxide semiconductor, or an organic semiconductor. The first semiconductor layer Act1 may include a channel area, and a drain area and a source area, which are respectively arranged at both sides of the channel area.

The first gate electrode GE1 may overlap the channel area. The first gate electrode GE1 may include a low-resistance metal material. The first gate electrode GE1 may include a conductive material including molybdenum (Mo), aluminum (Al), copper (Cu), and titanium (Ti), and may be formed as a single layer or multiple layers including the above-described material.

A first gate insulating layer 112 between the first semiconductor layer Act1 and the first gate electrode GE1 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. The second gate insulating layer 113 may include, similar to the first gate insulating layer 112, an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

An upper electrode CE2 of the storage capacitor Cst may be arranged on the second gate insulating layer 113. The upper electrode CE2 may overlap the first gate electrode GE1 thereunder. In this case, the first gate electrode GE1 and the upper electrode CE2 of the driving thin-film transistor T1 that overlap each other with the second gate insulating layer 113 interposed therebetween may provide the storage capacitor Cst. That is, the first gate electrode GE1 of the driving thin-film transistor T1 may function as a lower electrode CE1 of the storage capacitor Cst.

In this way, the storage capacitor Cst and the driving thin-film transistor T1 may overlap each other. In some embodiments, the storage capacitor Cst may not overlap the driving thin-film transistor T1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may be a single layer or multiple layers including the above-described material.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may include a single layer or multiple layers including the above-described inorganic insulating material.

Each of a first drain electrode DE1 and a first source electrode SE1 may be arranged on the interlayer insulating layer 114. The first drain electrode DE1 and the first source electrode SE1 may include a material having good conductivity. The first drain electrode DE1 and the first source electrode SE1 may include a conductive material including molybdenum (Mo), aluminum (Al), copper (Cu), and titanium (Ti) and may be formed as multiple layers or a single layer including the above-described material. In an embodiment, the first drain electrode DE1 and the first source electrode SE1 may have a multi-layer structure of Ti/Al/Ti.

The switching thin-film transistor T2 may include a second semiconductor layer Act2, a second gate electrode GE2, a second drain electrode DE2, and a second source electrode SE2. Because each of the second semiconductor layer Act2, the second gate electrode GE2, the second drain electrode DE2 and the second source electrode SE2 is similar to each of the first semiconductor layer Act1, the first gate electrode GE1, the first drain electrode DE1 and the first source electrode SE1, a detailed description thereof will be omitted.

The driving circuit thin-film transistor DC-TFT may include, similar to the switching thin-film transistor T2, a driving circuit semiconductor layer, a driving circuit gate electrode, a driving circuit source electrode, and a driving circuit drain electrode.

The lower organic insulating layer 115 may be arranged on at least one thin-film transistor. In an embodiment, the lower organic insulating layer 115 may cover the first drain electrode DE1 and the first source electrode SE1. The lower organic insulating layer 115 may include an organic material. For example, the lower organic insulating layer 115 may include an organic insulating material such as general-purpose polymer, for example, polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

A connection electrode CML and a first connection line CL1 may be arranged on the lower organic insulating layer 115. In this case, each of the connection electrode CML and the first connection line CL1 may be connected to each of the first drain electrode DE1 or the first source electrode SE1 through a contact hole of the lower organic insulating layer 115. The connection electrode CML and the first connection line CL1 may include a material having good conductivity. The connection electrode CML and the first connection line CL1 may include a conductive material, including molybdenum (Mo), aluminum (Al), copper (Cu), and titanium (Ti), and may be formed as multiple layers or a single layer including the above-described material. In an embodiment, the connection electrode CML and the first connection line CL1 may have a multi-layer structure of Ti/Al/Ti.

As shown in FIG. 5, the first connection line CL1 may extend from the central area CA to the middle corner area MCA. In another embodiment, the first connection line CL1 may extend from the peripheral area (see PA of FIG. 3) or the corner area (see CNA of FIG. 3). In another embodiment, the first connection line CL1 may extend from the first area (see A1 of FIG. 3) and/or the second area (see A2 of FIG. 3) to the middle corner area MCA. The first connection line CL1 may overlap the driving circuit thin-film transistor DC-TFT.

The organic insulating layer 116 may cover the connection electrode CML and the first connection line CL1. The organic insulating layer 116 may include an organic material. The organic insulating layer 116 may include an organic insulating material, such as general-purpose polymer, for example, polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

The display element layer DEL may be arranged on the pixel circuit layer PCL. The display element layer DEL may include an organic light-emitting diode OLED as a display element. The display element layer DEL may include a plurality of organic light-emitting diodes OLED. In an embodiment, any one of the plurality of organic light-emitting diodes OLED may be arranged in the central area CA. The other one of the plurality of organic light-emitting diodes OLED may be arranged in the middle corner area MCA. The organic light-emitting diodes OLED arranged in the middle corner area MCA may overlap the driving circuit DC. Thus, in the present embodiment, the display panel 10 may display an image even in the middle corner area MCA in which the driving circuit DC is arranged.

The organic light-emitting diodes OLED arranged in the central area CA may be electrically connected to the connection electrode CML through a contact hole of the organic insulating layer 116. The organic light-emitting diodes OLED arranged in the middle corner area MCA may be electrically connected to the first connection line CL1 through the contact hole of the organic insulating layer 116. The organic light-emitting diodes OLED may include a pixel electrode 211, an intermediate layer 212, and an opposite electrode 213.

The pixel electrode 211 may be electrically connected to the connection electrode CML or the first connection line CL1 through the contact hole of the organic insulating layer 116. The pixel electrode 211 may include conductive oxide, such as indium tin oxide (ITO), indium zinc oxide (IZO), zinc oxide (ZnO), indium oxide ($In_2O_3$), indium gallium oxide (IGO) or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr) or a compound thereof. In another embodiment, the pixel electrode 211 may further include a layer formed of ITO, IZO, ZnO or $In_2O_3$ on/under the above-described reflective layer.

A pixel-defining layer 118 having an opening 118OP exposing the center of the pixel electrode 211 may be arranged on the pixel electrode 211. The pixel-defining layer 118 may include an organic insulating material and/or an inorganic insulating material. The opening 118OP may define an emission area (hereinafter, referred to as an emission area EMA) of light emitted from the organic light-emitting diode OLED. For example, the width of the opening 118OP may correspond to the width of the emission area EMA. Also, the width of the opening 118OP may correspond to the width of a subpixel.

A spacer 119 may be arranged on the pixel-defining layer 118. The spacer 119 may prevent damage of the substrate 100 and/or multiple layers on the substrate 100 in a method of manufacturing a display panel and/or a display device. In the method of manufacturing the display panel and/or the display device, a mask sheet may be used. In this case, the mask sheet may enter the opening 118OP of the pixel-defining layer 118 or may be in close contact with the pixel-defining layer 118. The spacer 119 may prevent defects in which the substrate 100 or a portion of the multiple layers is damaged or destroyed by the mask sheet when a deposition material is deposited on the substrate 100.

The spacer 119 may include an organic material, such as polyimide. Alternatively, the spacer 119 may include an inorganic insulating material such as silicon nitride ($SiN_x$) or silicon oxide ($SiO_2$) or an organic insulating material and an inorganic insulating material.

In an embodiment, the spacer 119 may include material that is different from the pixel-defining layer 118. Alternatively, in another embodiment, the spacer 119 may include the same material as that of the pixel-defining layer 118. In this case, the pixel-defining layer 118 and the spacer 119 may be formed in a mask process using a halftone mask, etc.

The intermediate layer 212 may be arranged on the pixel-defining layer 118. The intermediate layer 212 may include an emission layer 212b arranged in the opening 118OP of the pixel-defining layer 118. The emission layer 212b may include a polymer or low-molecular weight organic material that emits a certain color light.

A first functional layer 212a and a second functional layer 212c may be arranged under and on the emission layer 212b. The first functional layer 212a may include a hole transport layer (HTL), for example, or an HTL and a hole injection layer (HIL). The second functional layer 212c that is an element disposed on the emission layer 212b may be optional. The second functional layer 212c may include an electron transport layer (ETL) and/or an electron injection layer (EIL). The first functional layer 212a and/or the second functional layer 212c may be a common layer formed to entirely cover the substrate 100, such as in the opposite electrode 213 to be described later.

The opposite electrode 213 may be arranged on the intermediate layer 212. The opposite electrode 213 may include a conductive material having a low work function. For example, the opposite electrode 213 may include a (semi-)transparent layer including Ag, Mg, Al, Pt, Pd, Au, Ni, Nd, Ir, Cr, lithium (Li), Ca, or an alloy thereof. Alternatively, the opposite electrode 213 may further include a layer such as ITO, IZO, ZnO or $In_2O_3$ on the (semi-)transparent layer including the above-described material.

In some embodiments, a capping layer (not shown) may be further disposed on the opposite electrode 213. The capping layer may include LiF, an inorganic material, or/and an organic material.

The encapsulating layer ENL may be arranged on the opposite electrode 213. In an embodiment, the encapsulating layer ENL may include at least one inorganic encapsulating layer and at least one organic encapsulating layer. In an embodiment, FIG. 5 illustrates that the encapsulating layer ENL includes a first inorganic encapsulating layer 310, an organic encapsulating layer 320 and a second inorganic encapsulating layer 330 that are sequentially stacked.

The first inorganic encapsulating layer 310 and the second inorganic encapsulating layer 330 may include at least one inorganic material among aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON). The organic encapsulating layer 320 may include a polymer-based material. The polymer-based material may include acryl-based resin, epoxy-based resin, polyimide, and polyethylene. In an embodiment, the organic encapsulating layer 320 may include acrylate.

Although not shown, a touch electrode layer may be arranged on the encapsulating layer ENL, and an optical functional layer may be arranged on the touch electrode layer. The touch electrode layer may obtain coordinate information according to an external input, for example, a touch event. The optical functional layer may reduce reflectance of light (external light) incident from the outside toward the display device, and/or may increase color purity of light emitted from the display device. In an embodiment, the optical functional layer may include a retarder and/or a polarizer. The retarder may be a film type or liquid crystal coating type and may include a λ/2 retarder and/or a λ/4 retarder. The polarizer may also be a film type or liquid crystal coating type. The film type may include an elongated synthetic resin film, and the liquid crystal coating type may include liquid crystals arranged in a certain arrangement. The retarder and the polarizer may further include a protective film.

In another embodiment, the optical functional layer may include a black matrix and color filters. The color filters may be arranged in consideration of the color of light emitted from each of pixels of the display device. Each of the color filters may include a red, green, or blue pigment or dye. Alternatively, each of the color filters may further include a quantum dot in addition to the above-described pigment or dye. Alternatively, a portion of the color filters may not include the above-described pigment or dye and may include scattering particles, such as titanium oxide.

In another embodiment, the optical functional layer may include a destructive interference structure. The destructive interference structure may include a first reflective layer and a second reflective layer, which are arranged on different layers. First reflected light and second reflected light respectively reflected from the first reflective layer and the second reflective layer may destructively interfere and thus, the reflectance of external light may be reduced.

An adhesive member may be arranged between the touch electrode layer and the optical functional layer. As the adhesive member, a general one known in the art may be employed without limitation. The adhesive member may be a pressure sensitive adhesive (PSA).

Figure 6A:
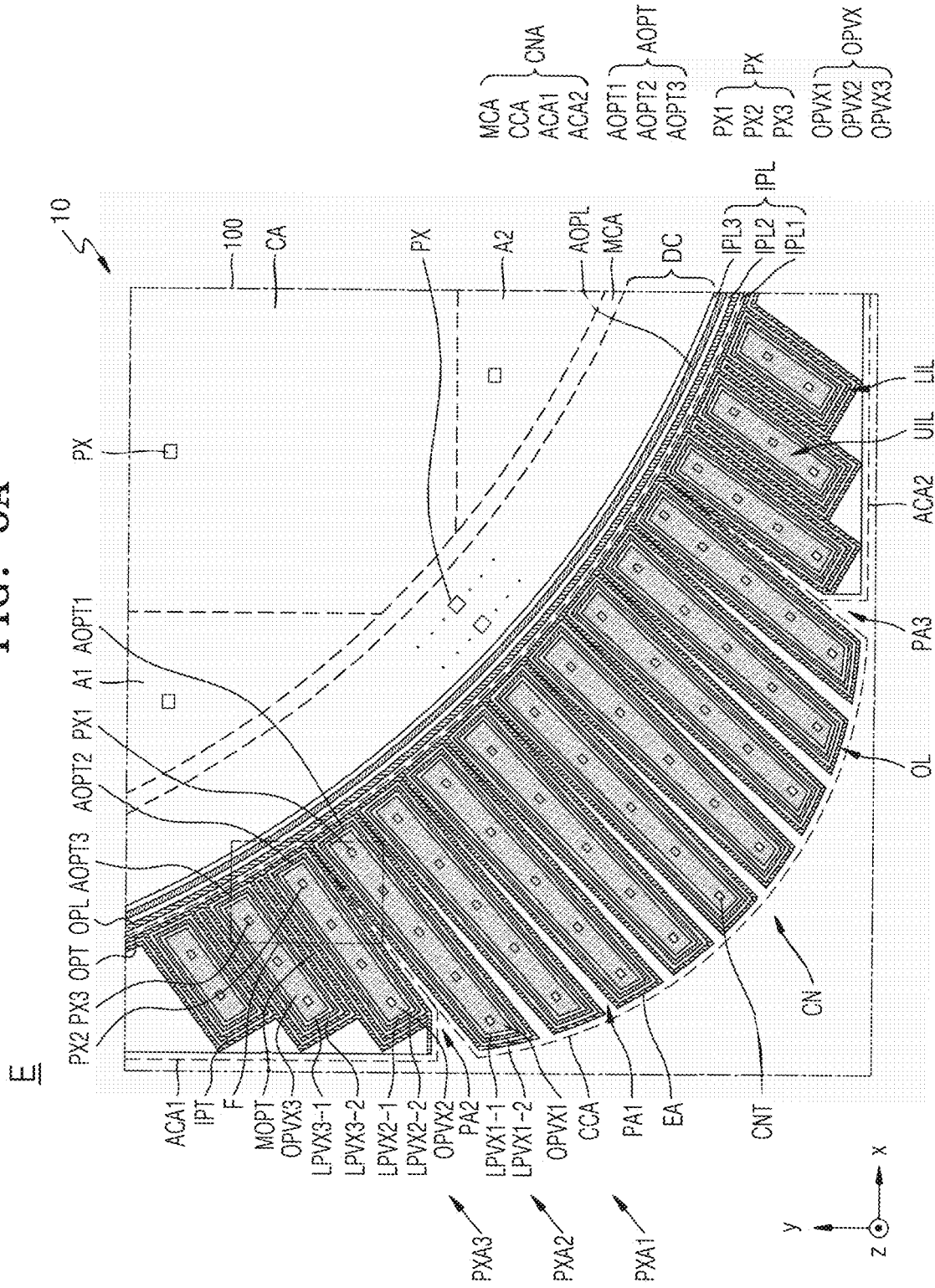
FIGS. 6A and 6B are enlarged views of portion E of the display panel of FIG. 3 according to various embodiments.
Figure 6B:
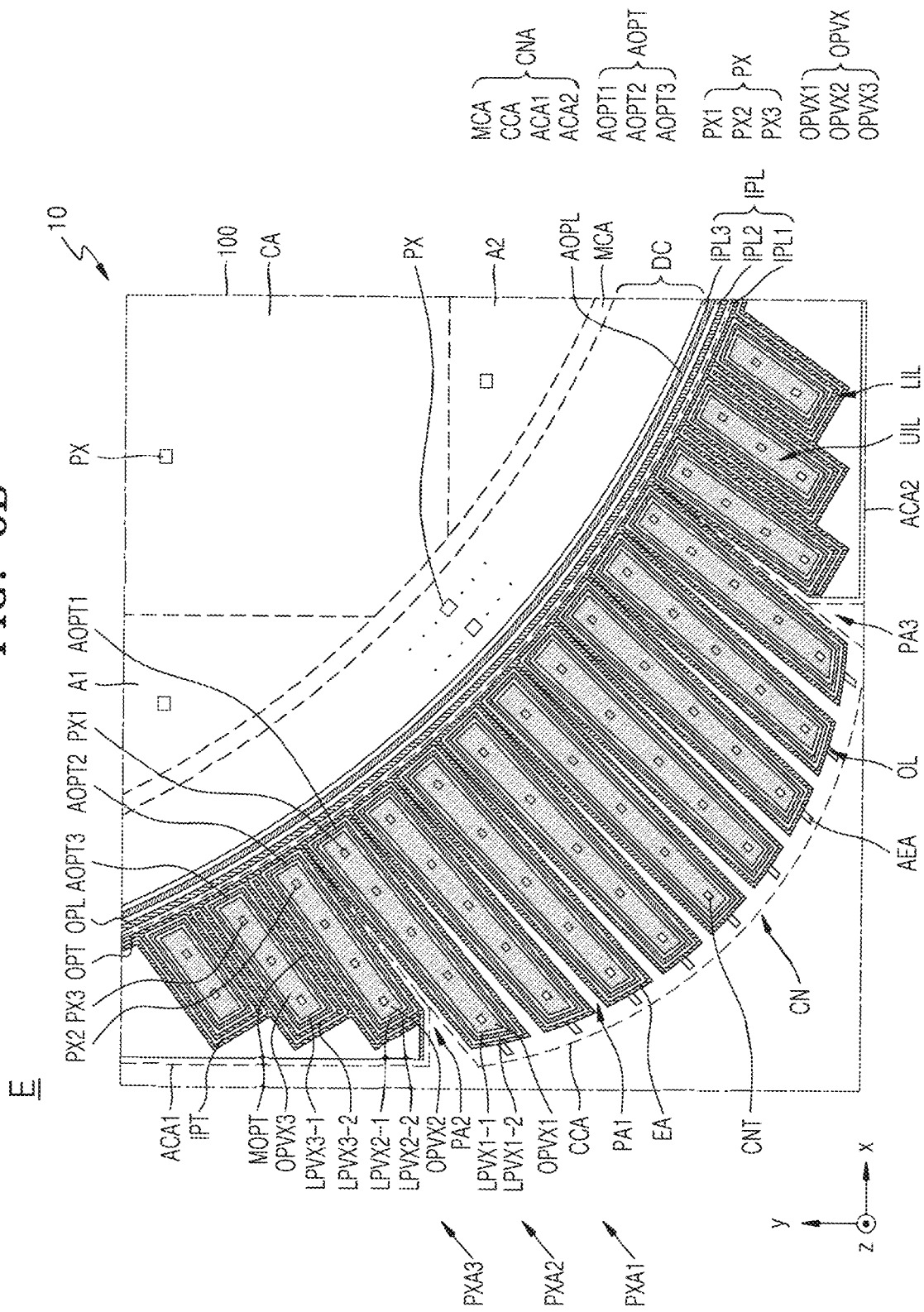
Figure 7:
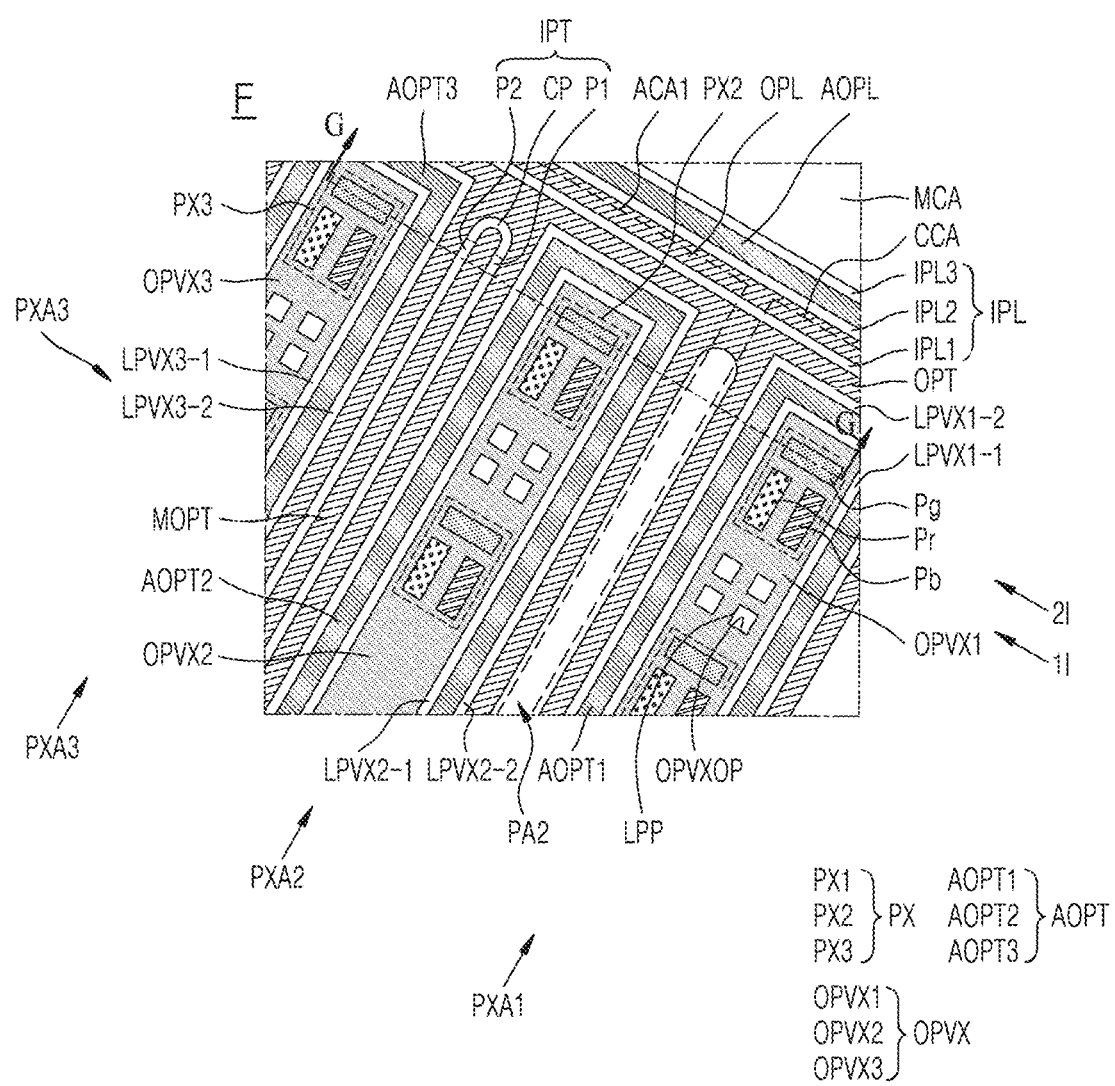
FIG. 7 is an enlarged view of portion F of the display panel of FIG. 6A.

FIGS. 6A and 6B are enlarged views of portion E of the display panel 10 of FIG. 3 according to various embodiments. FIG. 7 is an enlarged view of portion F of the display panel 10 of FIG. 6A.

Referring to FIGS. 6A, 6B, and 7, the display panel 10 may include a substrate 100, a pixel PX, an organic layer OL, an upper inorganic layer (UIL), and a lower inorganic layer (LIL). The substrate 100 may include a central area CA, a first area A1, a second area A2, and a corner area CNA.

The first area A1 may extend from the central area CA in a first direction (for example, an x-direction or –x-direction). The second area A2 may extend from the central area CA in a second direction (for example, a y-direction or –y-direction).

The corner area CNA may be an area in the corner CN of the display panel 10. In an embodiment, the corner area CNA may be an area in which an edge in a first direction (for example, an x-direction or an –x-direction) of the display panel 10 and an edge in the second direction (for example, a y-direction or a –y-direction) cross each other. In an embodiment, the corner area CNA may surround at least a portion of the central area CA, the first area A1, and the second area A2. The CNA may include a central corner area CCA, a first adjacent corner area ACA1, a second adjacent corner area ACA2, and a middle corner area MCA.

The central corner area CCA may extend in a direction away from the central area CA. The central corner area CCA may include a plurality of extension areas EA. The plurality of extension areas EA may extend in a direction away from the central area CA. In an embodiment, the plurality of extension areas EA may extend in a direction crossing a first direction (for example, an x-direction or an –x-direction) and/or a second direction (for example, a y-direction or a –y-direction).

Ends of the plurality of adjacent extension areas EA may be spaced apart from each other by a first penetration area PA1. The first penetration area PA1 may be an empty area of the display panel 10. Elements of the display panel 10 may not be arranged in the first penetration area PA1. In other words, edges of the plurality of adjacent extension areas EA may be defined by the first penetration area PA1. When the central corner area CCA is bent in the corner CN, a compressive strain greater than a tensile strain may occur in the central corner area CCA. Because ends of the plurality of adjacent extension areas EA are spaced apart from each other by the first penetration area PA1, the plurality of extension areas EA may be contracted. Thus, the display panel 10 may be bent without being damaged in the central corner area CCA.

In some embodiments, as shown in FIG. 6B, the central corner area CCA may include auxiliary extension area AEA that extend from end of the extension area EA. In an embodiment, the width of the auxiliary extension area AEA may be smaller than the extension area EA. The width of the auxiliary extension area AEA may be a distance between edges of the auxiliary extension area AEA in a direction perpendicular to the extension direction of the auxiliary extension area AEA. The width of the extension area EA may be a distance between edges of the extension area EA in a direction perpendicular to the extension area EA.

The first adjacent corner area ACA1 may be adjacent to the central corner area CCA. An end of the central corner area CCA and an end of the first adjacent corner area ACA1 that are adjacent to each other may be spaced apart from each other by the second penetration area PA2. The second penetration area PA2 may be an empty area of the display panel 10. Elements of the display panel 10 may not be arranged in the second penetration area PA2. In other words, an edge of the first adjacent corner area ACA1 and an edge of the extension area EA of the central corner area CCA that face each other may be defined by the second penetration area PA2.

At least a portion of the first area A1 may be arranged between the central area CA and the first adjacent corner area ACA1 in the first direction (for example, an x-direction or an –x-direction). In an embodiment, at least a portion of the first area A1 and the first adjacent corner area ACA1 may be arranged in the first direction (for example, an x-direction or an –x-direction). The first adjacent corner area ACA1 may extend and be bent in the first direction (for example, an x-direction or an –x-direction). The first adjacent corner area ACA1 may extend and not be bent in the second direction (for example, a y-direction or a –y-direction). Thus, a penetration area of the substrate 100 need not be defined in the first adjacent corner area ACA1, like the central corner area CCA.

The second adjacent corner area ACA2 may be adjacent to the central corner area CCA. The central corner area CCA may be arranged between the first adjacent corner area ACA1 and the second adjacent corner area ACA2. An end of the central corner area CCA and an end of the second adjacent corner area ACA2 that are adjacent to each other may be spaced apart from each other by a third penetration area PA3. The third penetration area PA3 may be an empty area of the display panel 10. Elements of the display panel 10 may not be arranged in the third penetration area PA3. In other words, an edge of the second adjacent corner area ACA2 and an edge of the extension area EA of the central corner area CCA that face each other may be defined by the third penetration area PA3.

At least a portion of the second area A2 may be arranged between the central area CA and the second adjacent corner area ACA2 in the second direction (for example, a y-direction or a –y-direction). In an embodiment, at least a portion of the second area A2 and the second adjacent corner area ACA2 may be arranged in the second direction (for example, a y-direction or a –y-direction). The second adjacent corner area ACA2 may extend and be bent in the second direction (for example, a y-direction or a −y-direction). The second adjacent corner area ACA2 may extend and not be bent in the first direction (for example, an x-direction or an −x-direction). Thus, a penetration area of the substrate 100 need not be defined in the second adjacent corner area ACA2, like the central corner area CCA. Because the second adjacent corner area ACA2 is similar to the first adjacent corner area ACA1, the first adjacent corner area ACA1 will be described in detail.

The middle corner area MCA may be arranged between the central area CA and the central corner area CCA. In an embodiment, the middle corner area MCA may extend between the first area A1 and the first adjacent corner area ACA1. In an embodiment, the middle corner area MCA may extend between the second area A2 and the second adjacent corner area ACA2. A driving circuit DC for providing an electrical signal to the pixels PX and/or a power line for providing power may be arranged in the middle corner area MCA. In this case, the pixels PX arranged in the middle corner area MCA may overlap the driving circuit DC and/or the power line. In some embodiments, the middle corner area MCA may be omitted.

The plurality of pixels PX may be arranged in the central area CA, the first area A1, the second area A2, and the corner area CNA. The display panel 10 may display an image in the central area CA, the first area A1, the second area A2, and the corner area CNA. The plurality of pixels PX may include a plurality of display elements.

The plurality of pixels PX may include a first pixel PX1, a second pixel PX2, and a third pixel PX3. The first pixel PX1, the second pixel PX2, and the third pixel PX3 may be arranged in the corner area CNA.

The first pixel PX1 may be arranged in a plurality of extension areas EA. A plurality of first pixels PX1 may be provided, and the plurality of first pixels PX1 may be arranged in the plurality of extension areas EA. The plurality of first pixels PX1 may be arranged in a direction away from the central area CA.

The plurality of first pixels PX1 may constitute a first pixel array PXA1. The first pixel array PXA1 may be arranged in any one of the plurality of extension areas EA. The first pixel array PXA1 may be a set of the plurality of first pixels PX1 arranged along one line or a set of the plurality of first pixels PX1 arranged along a plurality of lines.

In other words, the first pixel PX1 may include a first display element. In an embodiment, a plurality of first display elements may be provided, and the plurality of first display elements may constitute the first pixel array PXA1.

The second pixel PX2 and the third pixel PX3 may be arranged in the first adjacent corner area ACA1. Each of the second pixel PX2 and the third pixel PX3 may be provided in plurality, and a plurality of second pixels PX2 and a plurality of third pixels PX3 may be arranged in the first adjacent corner area ACA1. Each of the plurality of second pixels PX2 and the plurality of third pixels PX3 may be arranged in a direction away from the central area CA and/or the first area A1. Each of the plurality of second pixels PX2 and the plurality of third pixels PX3 may constitute a second pixel array PXA2 and a third pixel array PXA3. The second pixel array PXA2 and the third pixel array PXA3 may be arranged in the first adjacent corner area ACA1. The second pixel array PXA2 and the third pixel array PXA3 may be arranged in a direction away from the central area CA and/or the first area A1. The second pixel array PXA2 and the third pixel array PXA3 may be arranged similar to the first pixel array PXA1. The second pixel array PXA2 may be a set of a plurality of second pixels PX2 arranged along one line or a set of a plurality of second pixels PX2 arranged along a plurality of lines. The third pixel array PXA3 may be a set of a plurality of third pixels PX3 arranged along one line or a set of a plurality of third pixels PX3 arranged along a plurality of lines.

In other words, the second pixel PX2 may include a second display element. In an embodiment, a plurality of second display elements may be provided. The plurality of second display elements may constitute a second pixel array PXA2. The third pixel PX3 may include a third display element. A plurality of third display elements may be provided. The plurality of third display elements may constitute a third pixel array PXA3.

In an embodiment, the pixel PX may include a red subpixel Pr, a green subpixel Pg, and a blue subpixel Pb. The red subpixel Pr, the green subpixel Pg, and the blue subpixel Pb may emit red light, green light, and blue light, respectively.

The red subpixel Pr, the green subpixel Pg, and the blue subpixel Pb may be arranged in an S-stripe structure. The red subpixel Pr and the blue subpixel Pb may be arranged in a first column 1*l*, and the green subpixel Pg may be arranged in a second column 2*l* adjacent to the first column 1*l*. In an embodiment, a side of the green subpixel Pg may face each of a side of the red subpixel Pr and a side of the blue subpixel Pb.

Alternatively, unlike the drawings, the red subpixel Pr, the green subpixel Pg, and the blue subpixel Pb may be arranged side by side or in a pentile type.

An organic layer OL may include an organic pattern OPT, an organic pattern line OPL, an auxiliary organic pattern AOPT, an auxiliary organic pattern line AOPL, and a middle organic pattern MOPT. The organic pattern OPT may be arranged on the substrate 100. The organic pattern OPT may be arranged in the corner area CNA. The organic pattern OPT may surround each of the first pixel array PXA1, the second pixel array PXA2, and the third pixel array PXA3. In other words, the organic pattern OPT may surround each of a plurality of first pixels PX1 including a first display element, a plurality of second pixels PX2 including a second display element, and a plurality of third pixels PX3 including third display elements. Thus, the first pixel array PXA1, the second pixel array PXA2, and the third pixel array PXA3 may be separated from each other by the organic pattern OPT and defined by the organic pattern OPT. The organic pattern OPT may be disposed in a position so that, when the corner area CNA is formed, the first penetration area PA1, the second penetration area PA2 and the third penetration area PA3 are empty areas.

In an embodiment, a portion of the organic pattern OPT may extend between the central corner area CCA and the middle corner area MCA. A portion of the organic pattern OPT may surround at least one of the central area CA, the first area A1, the second area A2, and the middle corner area MCA.

The organic pattern line OPL may extend between the central corner area CCA and the middle corner area MCA. The organic pattern line OPL may surround at least one of the central area CA, the first area A1, the second area A2, and the middle corner area MCA. The organic pattern line OPL and the organic pattern OPT may be spaced apart from each other. In an embodiment, the organic pattern line OPL and the organic pattern OPT may include the same organic material.

In an embodiment, the organic pattern OPT and the organic pattern line OPL may block the flow of organic encapsulating layers arranged on the display element. For example, the organic encapsulating layer may be arranged in each of areas surrounded and separated by the organic pattern OPT. Also, the organic encapsulating layers may be entirely arranged in the central area CA, the first area A1, the second area A2, and the middle corner area MCA.

The auxiliary organic pattern AOPT may be spaced apart from the organic pattern OPT. In an embodiment, the auxiliary organic pattern AOPT may include a first auxiliary organic pattern AOPT1, a second auxiliary organic pattern AOPT2, and a third auxiliary organic pattern AOPT3.

The first auxiliary organic pattern AOPT1, the second auxiliary organic pattern AOPT2, and the third auxiliary organic pattern AOPT3 may surround the first pixel array PXA1, the second pixel array PXA2, and the third pixel array PXA3, respectively. The first auxiliary organic pattern AOPT1 may be arranged between the first pixel array PXA1 and the organic pattern OPT. The second auxiliary organic pattern AOPT2 may be arranged between the second pixel array PXA2 and the organic pattern OPT. The third auxiliary organic pattern AOPT3 may be arranged between the third pixel array PXA3 and the organic pattern OPT.

An auxiliary organic pattern line AOPL may extend between the central corner area CCA and the middle central area MCA. The organic pattern line OPL may surround the auxiliary organic pattern line AOPL. The auxiliary organic pattern line AOPL may extend similar to the organic pattern line OPL. The auxiliary organic pattern line AOPL may be spaced apart from the auxiliary organic pattern AOPT. In an embodiment, the auxiliary organic pattern line AOPL and the auxiliary organic pattern AOPT may include the same organic material.

The middle organic pattern MOPT may be arranged in the first adjacent corner area ACA1. The middle organic pattern MOPT may be arranged between the organic patterns OPT facing each other. In an embodiment, the middle organic pattern MOPT and the organic pattern OPT may be integrally provided.

The upper inorganic layer UIL may overlap the corner area CNA. The upper inorganic layer UIL may not overlap the central area CA. The upper inorganic layer UIL may include an overlapping inorganic pattern OPVX. Although not shown, the upper inorganic layer UIL may include an upper inorganic pattern that overlaps the organic pattern OPT, an auxiliary inorganic pattern that overlaps the auxiliary organic pattern AOPT, a first upper inorganic pattern line that overlaps the organic pattern line OPL, a second upper inorganic pattern line that overlaps the auxiliary organic pattern line AOPL, and a middle upper inorganic pattern that overlaps the middle organic pattern MOPT. The upper inorganic pattern may extend similarly to the organic pattern OPT. The auxiliary upper inorganic pattern may extend similarly to the auxiliary organic pattern AOPT. The first upper inorganic pattern line may extend similarly to the organic pattern line OPL. The second upper inorganic pattern line may extend similarly to the auxiliary organic pattern line AOPL. The middle upper inorganic pattern may extend similarly to the middle organic pattern MOPT. The upper inorganic layer UIL may include an inorganic material.

The overlapping inorganic pattern OPVX may be arranged in the corner area CNA. The overlapping inorganic pattern OPVX may not overlap at least one of the central area CA, the first area A1, and second area A2. The overlapping inorganic pattern OPVX may overlap the pixels PX and/or a display element arranged in the corner area CNA.

The overlapping inorganic pattern OPVX may include an overlapping inorganic pattern opening OPVXOP. The overlapping inorganic pattern opening OPVXOP may be a passage which is arranged under the overlapping inorganic pattern OPVX and through which gas generated from a layer including an organic material is discharged. Thus, the reliability of the display panel 10 may be increased. The overlapping inorganic pattern opening OPVXOP may not overlap the display element and/or the pixels PX. In an embodiment, the overlapping inorganic pattern opening OPVXOP and the pixels PX may be alternately arranged in a direction away from the central area CA.

The overlapping inorganic pattern OPVX may include a contact hole CNT arranged at a distal end of the overlapping inorganic pattern OPVX. The plurality of pixels PX arranged in the central corner area CCA, the first adjacent corner area ACA1, and the second adjacent corner area ACA2 may receive a second power supply voltage through the contact hole CNT of the overlapping inorganic pattern OPVX.

A plurality of overlapping inorganic patterns OPVX may be provided. Each of the plurality of overlapping inorganic patterns OPVX may extend in a direction away from the central area CA. The plurality of overlapping inorganic patterns OPVX may include a first overlapping inorganic pattern OPVX1, a second overlapping inorganic pattern OPVX2, and a third overlapping inorganic pattern OPVX3. The first overlapping inorganic pattern OPVX1 may overlap the first pixel array PXA1. The second overlapping inorganic pattern OPVX2 may overlap the second pixel array PXA2. The third overlapping inorganic pattern OPVX3 may overlap the third pixel array PXA3.

The lower inorganic layer LIL may overlap the corner area CNA. The lower inorganic layer LIL may not overlap the central area CA. The lower inorganic layer LIL may include a first inner inorganic pattern LPVX1-1, a second inner inorganic pattern LPVX2-1, and a third inner inorganic pattern LPVX3-1. The lower inorganic layer LIL may include a first outer inorganic pattern LPVX1-2, a second outer inorganic pattern LPVX2-2, and a third outer inorganic pattern LPVX3-2. The lower inorganic layer LIL may include an inorganic pattern line IPL, an inorganic pattern IPT, and a lower inorganic pattern portion LPP. The lower inorganic layer LIL may include an inorganic material.

The first inner inorganic pattern LPVX1-1, the second inner inorganic pattern LPVX2-1, and the third inner inorganic pattern LPVX3-1 may surround the first pixel array PXA1, the second pixel array PXA2, and the third pixel array PXA3, respectively. The first inner inorganic pattern LPVX1-1 may be arranged between the first overlapping inorganic pattern OPVX1 and the first auxiliary organic pattern AOPT1. The second inner inorganic pattern LPVX2-1 may be arranged between the second overlapping inorganic pattern OPVX2 and the second auxiliary organic pattern AOPT2. The third inner inorganic pattern LPVX3-1 may be arranged between the third overlapping inorganic pattern OPVX3 and the third auxiliary inorganic pattern AOPT3.

The first outer inorganic pattern LPVX1-2, the second outer inorganic pattern LPVX2-2, and the third outer inorganic pattern LPVX3-2 may surround the first inner inorganic pattern LPVX1-1, the second inner inorganic pattern LPVX2-1, and the third inner inorganic pattern LPVX3-1, respectively. The first outer inorganic pattern LPVX1-2 may be arranged between the first auxiliary organic pattern AOPT1 and the organic pattern OPT. The second outer inorganic pattern LPVX2-2 may be arranged between the second auxiliary organic pattern AOPT2 and the organic pattern OPT. The third outer inorganic pattern LPVX3-2 may be arranged between the third auxiliary organic pattern AOPT3 and the organic pattern OPT.

The inorganic pattern line IPL may extend between the central corner area CCA and the middle corner area MCA. The inorganic pattern line IPL may surround at least one of the central area CA, the first area A1, the second area A2, and the middle corner area MCA.

The inorganic pattern line IPL may include a first inorganic pattern line IPL1, a second inorganic pattern line IPL2, and a third inorganic pattern line IPL3. The first inorganic pattern line IPL1 may be arranged between the organic pattern OPT and the organic pattern line OPL. The second inorganic pattern line IPL2 may be arranged between the organic pattern line OPL and the auxiliary organic pattern line AOPL. The auxiliary organic pattern line AOPL may surround the third inorganic pattern line IPL3.

The inorganic pattern IPT may be arranged in at least one of the first adjacent corner area ACA1 and the second adjacent corner area ACA2. The inorganic pattern IPT may extend between the second pixel array PXA2 and the third pixel array PXA3. In other words, the inorganic pattern IPT may be arranged between the second pixel PX2 and the third pixel PX3. Alternatively, the inorganic pattern IPT may be arranged between a second display element and a third display element. The inorganic pattern IPT may extend in a serpentine shape.

The inorganic pattern IPT may surround at least a portion of each of pixel arrays arranged in the first adjacent corner area ACA1. In an embodiment, the inorganic pattern IPT may surround at least a portion of each of the second pixel array PXA2 and the third pixel array PXA3.

In an embodiment, the inorganic pattern IPT may include a first portion P1, a curved portion CP, and a second portion P2. The first portion P1 may extend in a direction closer to the central area CA. In an embodiment, the first portion P1 may extend between the second pixel array PXA2 and the third pixel array PXA3. The curved portion CP may extend from the first portion P1 in a curve shape. Thus, the extension direction of the inorganic pattern IPT may be changed in the curved portion CP. The second portion P2 may extend from the curved portion CP in a direction away from the central area CA. The second portion P2 may extend between the second pixel array PXA2 and the third pixel array PXA3. In an embodiment, the middle organic pattern MOPT may be arranged between the first portion P1 and the second portion P2.

In the present embodiment, the first adjacent corner area ACA1 may be bent. If, unlike the present embodiment, when the inorganic pattern IPT is not smoothly curved at a portion where the extension direction is changed, when the first adjacent corner area ACA1 is bent, stress may be concentrated on the portion. In the present embodiment, the inorganic pattern IPT may include the curved portion CP and may prevent a stress concentration phenomenon.

The lower inorganic pattern portion LPP may overlap the overlapping inorganic pattern opening OPVXOP of the overlapping inorganic pattern OPVX. The lower inorganic pattern portion LPP may include an inorganic material.

Figure 8A:
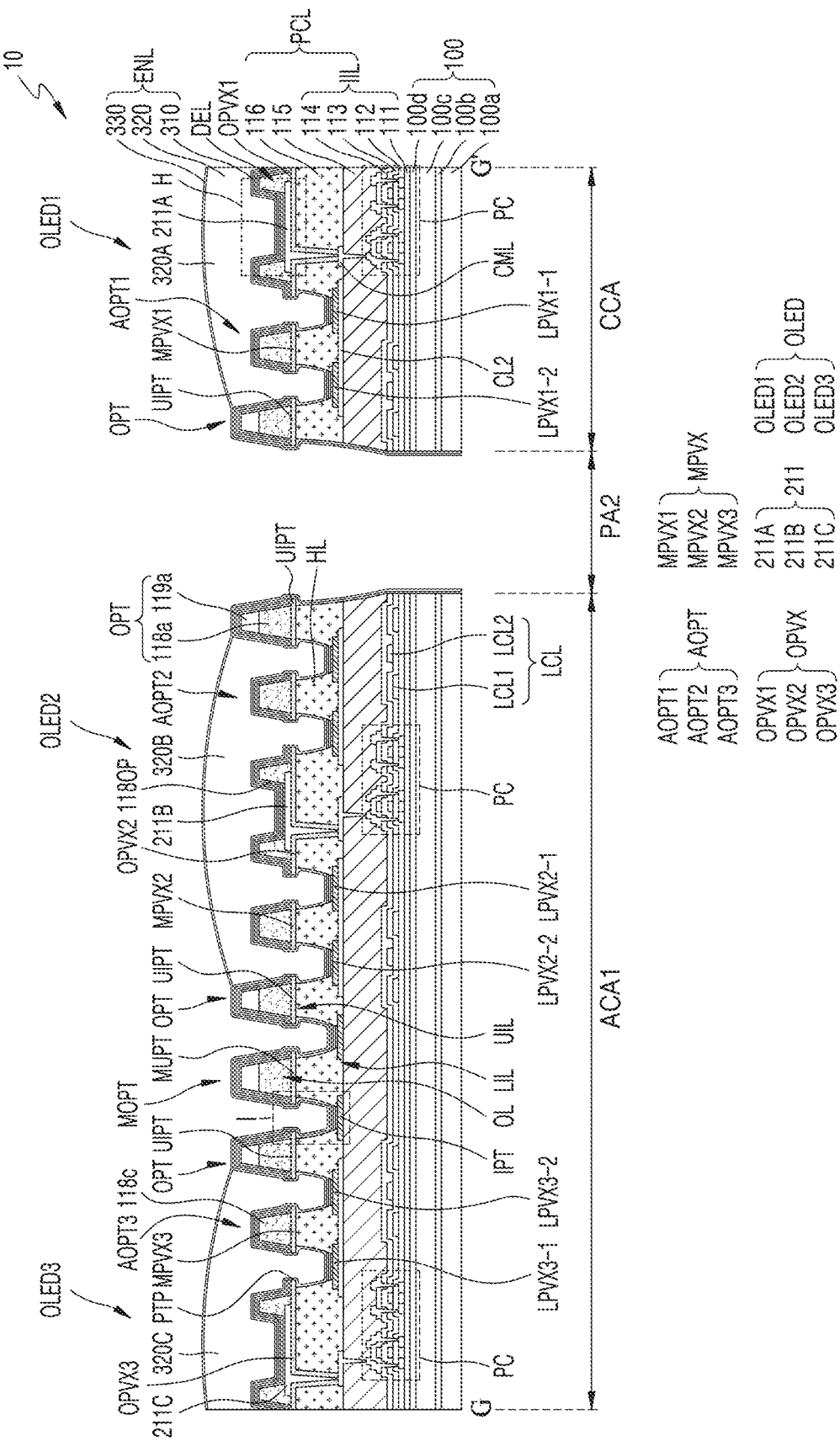
FIG. 8A is a cross-sectional view schematically illustrating the display panel taken along line G-G' of FIG. 7.
Figure 8B:
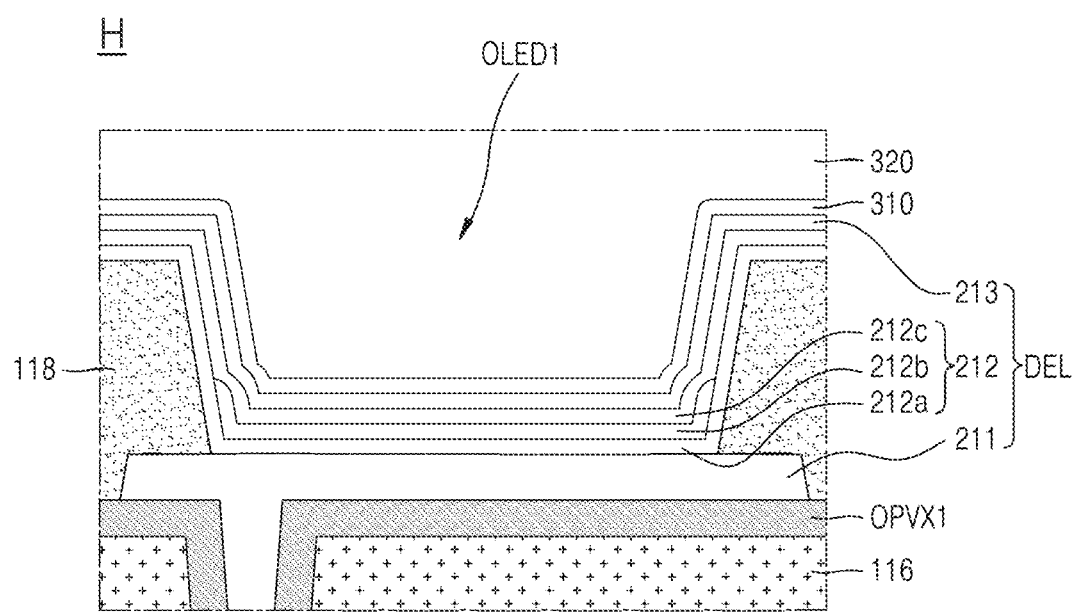
FIG. 8B is an enlarged view of portion H of the display panel of FIG. 8A.
Figure 8C:
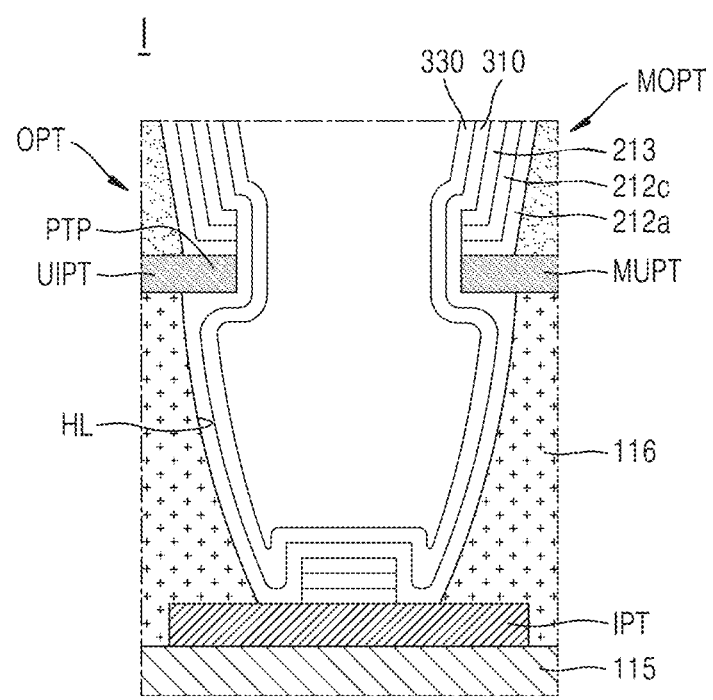
FIG. 8C is an enlarged view of portion I of the display panel of FIG. 8A.

FIG. 8A is a cross-sectional view schematically illustrating the display panel 10 taken along line G-G' of FIG. 7. FIG. 8B is an enlarged view of portion H of the display panel of FIG. 8A. FIG. 8C is an enlarged view of portion I of the display panel of FIG. 8A. In FIGS. 8A through 8C, the same reference numerals as those of FIG. 7 refer to the same elements and thus, a redundant description thereof will be omitted.

Referring to FIGS. 8A through 8C, the display panel 10 may include a substrate 100, a pixel circuit layer PCL, a lower inorganic layer LIL, an upper inorganic layer UIL, a display element layer DEL, and an encapsulating layer ENL. The substrate 100 may include a central corner area CCA and a first adjacent corner area ACA1. A second penetration area PA2 may be arranged between the central corner area CCA and the first adjacent corner area ACA1. The display element layer DEL may include a plurality of organic light emitting diodes OLED as a plurality of display elements. In an embodiment, the plurality of organic light emitting diodes OLED may include a first organic light emitting diode OLED1 arranged in the central corner area CCA, and a second organic light emitting diode OLED2 and a third organic light emitting diode OLED3 arranged in the first adjacent corner area ACA1.

The pixel circuit layer PCL may include a lower connection line LCL, a pixel circuit PC, an inorganic insulating layer IIL, a lower organic insulating layer 115, and an organic insulating layer 116. The inorganic insulating layer IIL may include a buffer layer 111, a first gate insulating layer 112, a second gate insulating layer 113, and an interlayer insulating layer 114. In an embodiment, the inorganic insulating layer IIL may be arranged between a plurality of organic light emitting diodes OLED as a plurality of display elements and the substrate 100. The lower organic insulating layer 115 and the organic insulating layer 116 may be arranged between the inorganic insulating layer IIL and the plurality of organic light emitting diodes OLED as a plurality of display elements.

In an embodiment, the lower connection line LCL may include a first lower connection line LCL1 and a second lower connection line LCL2. In an embodiment, the first lower connection line LCL1 may be arranged between the first gate insulating layer 112 and the second gate insulating layer 113. The second lower connection line LCL2 may be arranged between the second gate insulating layer 113 and the interlayer insulating layer 114. In an embodiment, the first lower connection line LCL1 and the second lower connection line LCL2 may be alternately arranged. Thus, an area occupied by the first lower connection line LCL1 and the second lower connection line LCL2 may be reduced.

The lower organic insulating layer 115 may cover the lower connection line LCL and the pixel circuit PC. The second connection line CL2 and the connection electrode CML may be arranged on the lower organic insulating layer 115.

The inorganic insulating layer IIL and the lower organic insulating layer 115 arranged in the central corner area CCA and the first adjacent corner area ACA1 may be each disconnected with the second penetration area PA2 interposed therebetween. For example, a portion of the inorganic insulating layer IIL arranged in the central corner area CCA may be spaced apart from the other portion of the inorganic insulating layer IIL arranged in the first adjacent corner area ACA1. A portion of the lower organic insulating layer 115 arranged in the central corner area CCA may be spaced apart from the other portion of the lower organic insulating layer 115 arranged in the first adjacent corner area ACA1. Thus, shrinkage stress or shrinkage strain generated when the central corner area CCA is bent, may be minimized.

In an embodiment, the inorganic insulating layer IIL and the lower organic insulating layer 115 may each continuously extend from the first adjacent corner area ACA1. Each of the inorganic insulating layer IIL and the lower organic insulating layer 115 may not be disconnected in the first adjacent corner area ACA1.

The lower inorganic layer LIL may be arranged on the second connection line CL2 and/or the lower organic insulating layer 115. In an embodiment, the lower inorganic layer LIL may include a first inner inorganic pattern LPVX1-1, a second inner inorganic pattern LPVX2-1, and a third inner inorganic pattern LPVX3-1. In an embodiment, the lower inorganic layer LIL may include a first outer inorganic pattern LPVX1-2, a second outer inorganic pattern LPVX2-2, and a third outer inorganic pattern LPVX3-2. The lower inorganic layer LIL may include an inorganic pattern IPT.

The first inner inorganic pattern LPVX1-1, the second inner inorganic pattern LPVX2-1, and the third inner inorganic pattern LPVX3-1 may each surround the first organic light emitting diode OLED1, the second organic light emitting diode OLED2, and the third organic light emitting diode OLED3.

The first outer inorganic pattern LPVX1-2, the second outer inorganic pattern LPVX2-2, and the third outer inorganic pattern LPVX3-2 may each surround the first inner inorganic pattern LPVX1-1, the second inner inorganic pattern LPVX2-1, and the third inner inorganic pattern LPVX3-1.

The inorganic pattern IPT may be arranged between the second organic light emitting diode OLED2 and the third organic light emitting diode OLED3. In an embodiment, the inorganic pattern IPT may be arranged between the second outer inorganic pattern LPVX2-2 and the third outer inorganic pattern LPVX3-2.

The organic insulating layer 116 may be arranged on the inorganic pattern IPT. The organic insulating layer 116 may be arranged on the inorganic pattern IPT, the second connection line CL2, the connection electrode CML, and the lower organic insulating layer 115. In an embodiment, the organic insulating layer 116 may include a hole HL. In an embodiment, a plurality of holes HL may be provided and may overlap the lower inorganic layer LIL. For example, at least a portion of the inorganic pattern IPT may overlap the hole HL. The hole HL may expose at least a portion of the lower inorganic layer LIL. For example, the hole HL may expose the inorganic pattern IPT.

The hole HL may be a passage through which gas generated from the lower organic insulating layer 115 and/or the organic insulating layer 116 is discharged. Thus, the reliability of the display panel 10 may be increased.

In an embodiment, the hole HL of the organic insulating layer 116 may be formed through an etching process. If the lower inorganic layer LIL is omitted, the second connection line CL2 and/or the lower organic insulating layer 115 may be over-etched through the etching process. When the second connection line CL2 is over-etched, the resistance of the second connection line CL2 may be increased. In the present embodiment, because the lower inorganic layer LIL is arranged on the second connection line CL2 and/or the lower organic insulating layer 115, over-etching of the second connection line CL2 and the lower organic insulating layer 115 may be prevented or reduced.

The organic insulating layer 116 arranged in the central corner area CCA may be disconnected from the organic insulating layer 116 arranged in the first adjacent corner area ACA1 with the second penetration area PA2 interposed therebetween. In other words, a portion of the organic insulating layer 116 arranged in the central corner area CCA may be spaced apart from the other portion of the organic insulating layer 116 arranged in the first adjacent corner area ACA1.

The display element layer DEL may be arranged on the pixel circuit layer PCL. The display element layer DEL may include a plurality of organic light emitting diodes OLED as a plurality of display elements and an organic layer OL. The plurality of organic light emitting diodes OLED may include a first organic light emitting diode OLED1 including a first pixel electrode 211A, a second organic light emitting diode OLED2 including a second pixel electrode 211B, and a third organic light emitting diode OLED3 including a third pixel electrode 211C. The first organic light emitting diode OLED1 may be arranged in the central corner area CCA. The second organic light emitting diode OLED2 and the third organic light emitting diode OLED3 may be arranged in the first adjacent corner area ACA1.

The organic light emitting diode OLED may include a pixel electrode 211, an intermediate layer 212, and an opposite electrode 213. In an embodiment, the intermediate layer 212 may include a first functional layer 212a, an emission layer 212b, and a second functional layer 212c.

The organic layer OL may include a pixel-defining layer 118, an organic pattern OPT, an auxiliary organic pattern AOPT, and a middle organic pattern MOPT. The pixel-defining layer 118 may cover an edge of the pixel electrode 211. An opening 118OP of the pixel-defining layer 118 may define an emission area of the organic light emitting diode OLED.

The organic pattern OPT may be arranged on the substrate 100 and may surround each of the first organic light emitting diode OLED1, the second organic light emitting diode OLED2, and the third organic light emitting diode OLED3. In an embodiment, the organic pattern OPT arranged in the central corner area CCA and the organic pattern OPT arranged in the first adjacent corner area ACA1 that face each other may be spaced apart from each other with the second penetration area PA2 interposed therebetween. In an embodiment, the middle organic pattern MOPT may be arranged between the organic patterns OPT arranged in the first adjacent corner area ACA1 that face each other.

In an embodiment, the organic pattern OPT may include a first layer 118a and a second layer 119a arranged on the first layer 118a. In an embodiment, the first layer 118a of the organic pattern OPT may include the same material as that of the pixel-defining layer 118. The second layer 119a of the organic pattern OPT may include the same material as that of a spacer (see 119 of FIG. 5).

The auxiliary organic pattern AOPT may be spaced apart from the organic pattern OPT. In an embodiment, the auxiliary organic pattern AOPT may include a first auxiliary organic pattern AOPT1, a second auxiliary organic pattern AOPT2, and a third auxiliary organic pattern AOPT3. The first auxiliary organic pattern AOPT1 may be arranged between the organic pattern OPT and the first organic light emitting diode OLED1 in the central corner area CCA. The second auxiliary organic pattern AOPT2 may be arranged between the organic pattern OPT and the second organic light emitting diode OLED2 in the first adjacent corner area ACA1. The third auxiliary organic pattern AOPT3 may be arranged between the organic pattern OPT and the third organic light emitting diode OLED3 in the first adjacent corner area ACA1.

The auxiliary organic pattern AOPT may include a first layer 118c. In an embodiment, the first layer 118c of the auxiliary organic pattern AOPT may include the same material as that of the pixel-defining layer 118.

In an embodiment, the thickness of the organic pattern OPT may be greater than the thickness of the auxiliary organic pattern AOPT. For example, the organic pattern OPT includes the first layer 118a and the second layer 119a. However, the auxiliary organic pattern AOPT may include the first layer 118c so that the organic pattern OPT and the auxiliary organic pattern AOPT may have different thicknesses. The thickness of the organic pattern OPT may be a distance from an upper surface of the upper inorganic layer UIL to an upper surface of the organic pattern OPT. The thickness of the auxiliary organic pattern AOPT may be a distance from the upper surface of the upper inorganic layer UIL to an upper surface of the auxiliary organic pattern AOPT.

In an embodiment, a distance from an upper surface of the substrate 100 to an upper surface of the organic pattern OPT may be greater than a distance from the upper surface of the substrate 100 to the upper surface of the auxiliary organic pattern AOPT.

The organic pattern OPT may function similarly to the spacer 119 of FIG. 5. In the method of manufacturing the display panel 10, the organic pattern OPT may prevent at least one of the pixel circuit layer PCL and the display element layer DEL from being damaged by a mask sheet. When the display panel 10 is manufactured, the organic pattern OPT may be in contact with the mask sheet and thus, the shape of the organic pattern OPT may be deformed. When the shape of the upper surface of the organic pattern OPT is deformed, the first inorganic encapsulating layer 310 may be formed along the deformed shape of the organic pattern OPT, and barrier characteristics may be deteriorated.

In the present embodiment, the auxiliary organic pattern AOPT may be arranged between the organic pattern OPT and the organic light emitting diode OLED. Because the thickness of the auxiliary organic pattern AOPT is less than the thickness of the organic pattern OPT, the auxiliary organic pattern AOPT may not be in contact with the mask sheet. Thus, the first inorganic encapsulating layer 310 may be formed on an upper surface of the auxiliary organic pattern AOPT that is flat. Thus, time when external air or moisture from the outside reaches the organic light emitting diode OLED, may be delayed, and the barrier characteristics of the first inorganic encapsulating layer 310 may be increased. In some alternative implementations, the thickness of the auxiliary organic pattern AOPT may be the same as the thickness of the organic pattern OPT.

In an embodiment, the middle organic pattern MOPT may be arranged in the first adjacent corner area ACA1. The middle organic pattern MOPT may be arranged between the organic patterns OPT facing each other. In some embodiments, the middle organic pattern MOPT and the organic pattern OPT may be integrally provided.

The upper inorganic layer UIL may be arranged between the organic insulating layer 116 and the display element layer DEL. In an embodiment, the upper inorganic layer UIL may include a first overlapping inorganic pattern OPVX1 that overlaps the first organic light emitting diode OLED1, a second overlapping inorganic pattern OPVX2 that overlaps the second organic light emitting diode OLED2, and a third overlapping inorganic pattern OPVX3 that overlaps the third organic light emitting diode OLED3. In an embodiment, the upper inorganic layer UIL may include an upper inorganic pattern UIPT that overlaps the organic pattern OPT. The upper inorganic pattern UIPT may be arranged between the organic insulating layer 116 and the organic pattern OPT. In an embodiment, the upper inorganic layer UIL may include an auxiliary inorganic pattern MPVX that overlaps the auxiliary organic pattern AOPT. The auxiliary inorganic pattern MPVX may include a first auxiliary inorganic pattern MPVX1 that overlaps the first auxiliary organic pattern AOPT1, a second auxiliary inorganic pattern MPVX2 that overlaps the second auxiliary organic pattern AOPT2, and a third auxiliary inorganic pattern MPVX3 that overlaps the third auxiliary organic pattern AOPT3. In an embodiment, the upper inorganic layer UIL may include a middle upper inorganic pattern MUPT that overlaps the middle organic pattern MOPT.

The upper inorganic layer UIL may provide a protruding tip PTP that protrudes in a center direction of the hole HL. In an embodiment, the upper inorganic pattern UIPT may include a protruding tip PTP that protrudes in the center direction of the hole HL. The center direction of the hole HL may be a direction from an inner surface of the organic insulating layer 116 for defining the hole HL to a central axis of the hole HL. Thus, a lower surface of the protruding tip PTP may be exposed to the hole HL. That is, the hole HL of the organic insulating layer 116 may have an undercut structure.

The first functional layer 212a, the second functional layer 212c, and the opposite electrode 213 may be entirely arranged in the central corner area CCA and the first adjacent corner area ACA1. In an embodiment, each of the first functional layer 212a, the second functional layer 212c, and the opposite electrode 213 may be disconnected based on the hole HL. For example, a portion of the first functional layer 212a may be spaced apart from the other portion of the first functional layer 212a based on the hole HL. The lower surface of the protruding tip PTP that overlaps the hole HL may not be in contact with the first functional layer 212a, the second functional layer 212c, and the opposite electrode 213. At least one of the first functional layer 212a and the second functional layer 212c may include an organic material, and external foreign substances or moisture may be introduced into the organic light emitting diode OLED through the first functional layer 212a and the second functional layer 212c. In the present embodiment, because each of the first functional layer 212a and the second functional layer 212c are disconnected based on the hole HL, moisture or foreign substances may be prevented or reduced from being introduced into the organic light emitting diode OLED.

The encapsulating layer ENL may cover the display element layer DEL. The encapsulating layer ENL may cover a plurality of organic light emitting diodes OLED. The encapsulating layer ENL may include at least one inorganic encapsulating layer and at least one organic encapsulating layer. FIGS. 8A through 8C illustrate that the encapsulating layer ENL includes a first inorganic encapsulating layer 310, an organic encapsulating layer 320, and a second inorganic encapsulating layer 330.

The first inorganic encapsulating layer 310 may entirely and continuously cover the central corner area CCA and the first adjacent corner area ACA1. In an embodiment, the first inorganic encapsulating layer 310 may entirely and continuously cover a plurality of organic light emitting diodes OLED, the hole HL, the auxiliary organic pattern AOPT, the organic pattern OPT, and the middle organic pattern MOPT. The first inorganic encapsulating layer 310 may be in contact with the upper inorganic layer UIL. For example, the first inorganic encapsulating layer 310 may be in contact with the lower surface of the protruding tip PTP. Thus, external moisture and foreign substances may be prevented or reduced from being introduced into the central corner area CCA and/or the first adjacent corner area ACA1 through at least one of the first functional layer 212a and the second functional layer 212c including an inorganic material, and the reliability of the display panel 10 may be increased.

The organic encapsulating layer 320 may cover a plurality of organic light emitting diodes OLED as a plurality of display elements. In an embodiment, the organic encapsulating layer 320 may fill the hole HL. In an embodiment, the organic encapsulating layer 320 may fill a plurality of holes HL. In an embodiment, the organic encapsulating layer 320 may fill any one of the plurality of holes HL and may not fill the other one of the plurality of holes HL. In some embodiments, the organic encapsulating layer 320 may not fill the hole HL.

The organic encapsulating layer 320 may include a first encapsulating area 320A, a second encapsulating area 320B, and a third encapsulating area 320C. In an embodiment, the first encapsulating area 320A may overlap the central corner area CCA and may cover the first organic light emitting diode OLED1 as a first display element. The second encapsulating area 320B may overlap the first adjacent corner area ACA1 and may cover the second organic light emitting diode OLED2 as a second display element. The third encapsulating area 320C may overlap the first adjacent corner area ACA1 and may cover the third organic light emitting diode OLED3 as a third display element.

The first encapsulating area 320A, the second encapsulating area 320B, and the third encapsulating area 320C may be separated from each other based on the organic pattern OPT. The first encapsulating area 320A may extend from the first organic light emitting diode OLED1 to the organic pattern OPT. The second encapsulating area 320B may extend from the second organic light emitting diode OLED2 to the organic pattern OPT. The third encapsulating area 320C may extend from the third organic light emitting diode OLED3 to the organic pattern OPT.

In the present embodiment, the organic encapsulating layer 320 may include the first encapsulating area 320A, the second encapsulating area 320B, and the third encapsulating area 320C, which are separated from each other. The organic encapsulating layer 320 may be formed by discharging monomer including an organic material onto the plurality of organic light emitting diodes OLED. If, unlike in the present embodiment, the second encapsulating area 320B and the third encapsulating area 320C are integrally formed, the amount of monomer discharged to the second organic light emitting diode OLED2 and the third organic light emitting diode OLED3 may be greater than the amount of monomer discharged to the first organic light emitting diode OLED1. In this case, monomer discharged to the first adjacent corner area ACA1 may overflow to reach the second penetration area PA2, and an organic encapsulating layer may be formed in the second penetration area PA2. Thus, the central corner area CCA and the first adjacent corner area ACA1 may not be separated from each other so that stress generated when the central corner area CCA is bent may be increased. In the present embodiment, similar to the central corner area CCA, the organic pattern OPT that each surrounds the second organic light emitting diode OLED2 and the third organic light emitting diode OLED3 may be arranged in the first adjacent corner area ACA1, and monomer may be discharged to the first adjacent corner area ACA1. In this case, monomer discharged to the first adjacent corner area ACA1 may be prevented or reduced from overflowing into the second penetration area PA2. Thus, the central corner area CCA may be bent without damage.

As in the first inorganic encapsulating layer 310, the second inorganic encapsulating layer 330 may entirely and continuously cover the central corner area CCA and the first adjacent corner area ACA1. In an embodiment, the second inorganic encapsulating layer 330 may be in contact with the first inorganic encapsulating layer 310 on the organic pattern OPT.

Figure 10A:
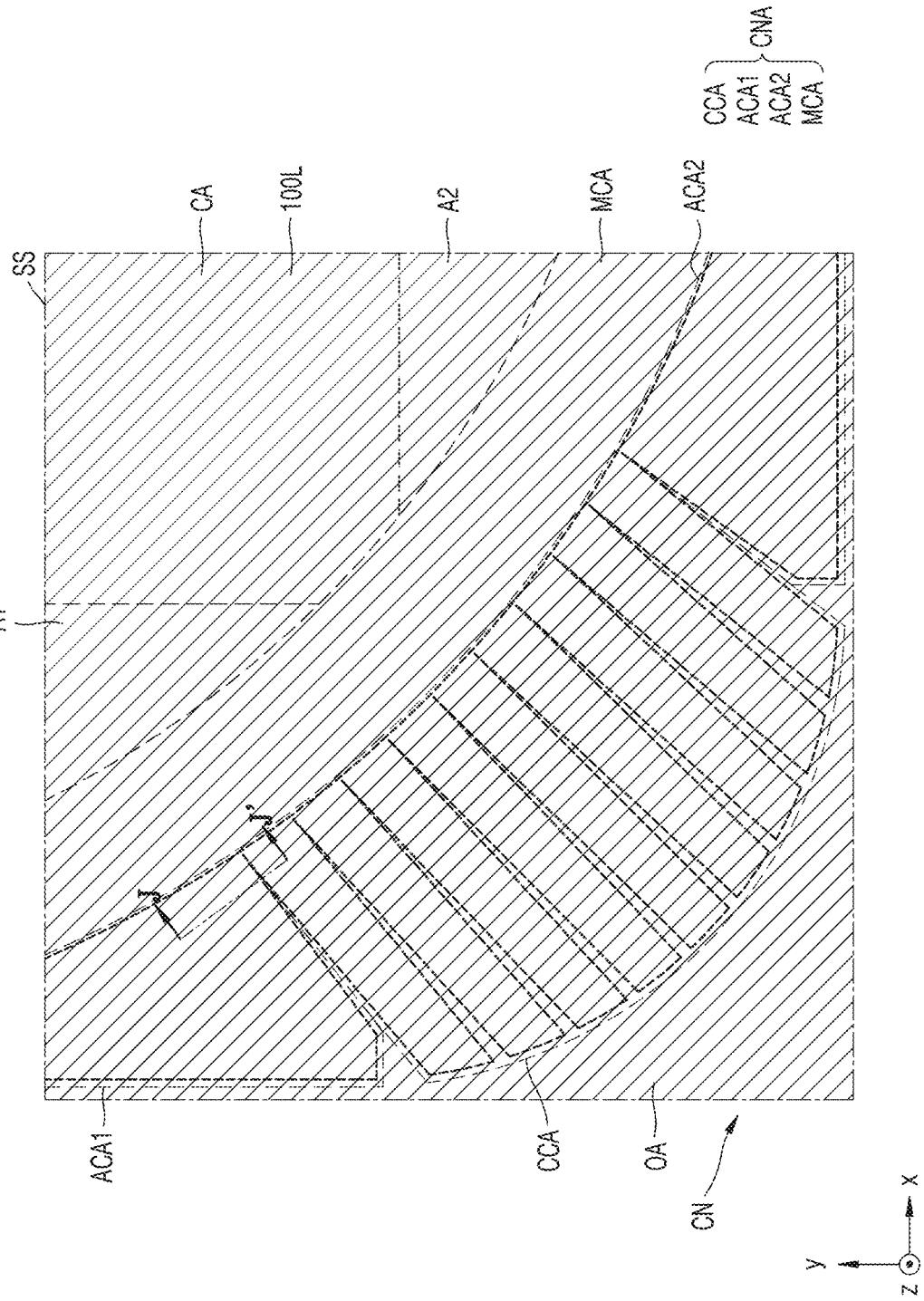
FIG. 10A is a plan view illustrating a method of manufacturing a display device according to an embodiment.
Figure 10B:
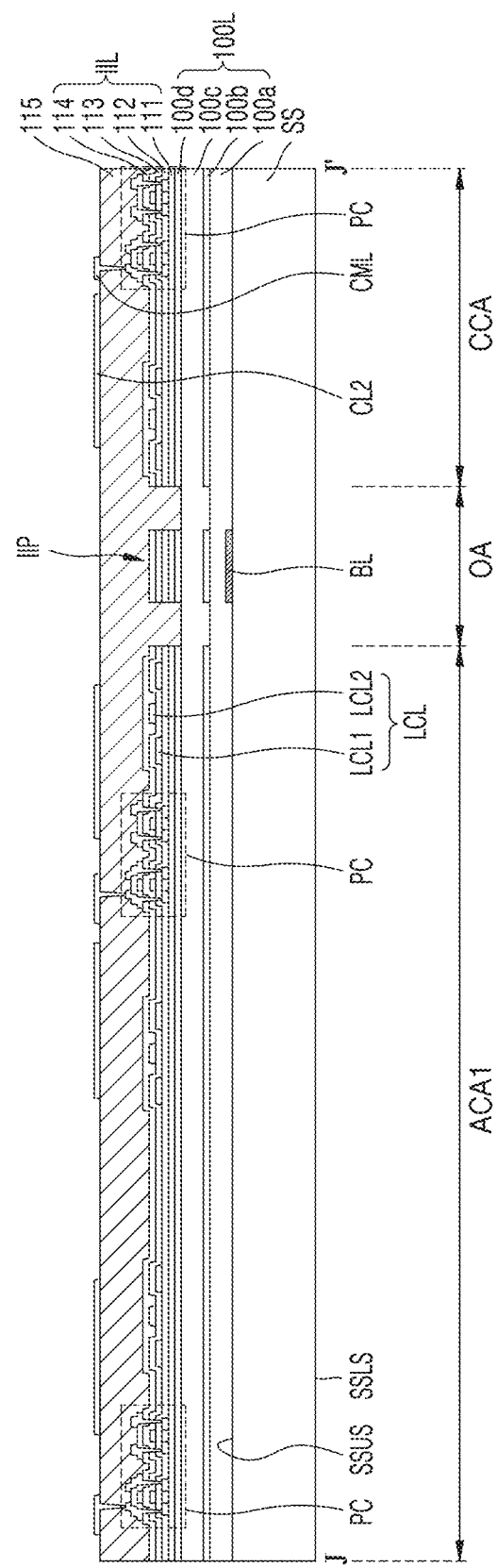
FIG. 10B is a cross-sectional view of a display device under manufacture taken along line J-J' of FIG. 10A.

FIG. 9 is a plan view illustrating a method of manufacturing a display device according to an embodiment. FIG. 10A is a plan view illustrating a method of manufacturing a display device according to an embodiment. FIG. 10B is a cross-sectional view of a display device under manufacture taken along line J-J' of FIG. 10A.

Referring to FIG. 9, a blocking layer BL may be formed on a support substrate SS. The support substrate SS may include a material having hardness and rigidity sufficient to support the manufactured display panel and/or display device, and may include, for example, a glass material. The blocking layer BL may be formed to correspond to the corner CN in the display panel and/or display device under manufacture.

The blocking layer BL may include a material capable of blocking laser used in separating the display panel and/or the display device under manufacture from the support substrate SS. In an embodiment, the blocking layer BL may include a material having an absorptivity of 90% or more (or a transmittance of 10% or less) in a wavelength of 300 nm. For example, the blocking layer BL may include at least one of amorphous silicon (a-Si), polysilicon (Poly-Si), crystalline-Si, ZnO, and IZO. In an embodiment, when an excimer laser having a wavelength of 308 nm is used, a-Si may be used to form the blocking layer BL.

The blocking layer BL may be formed by patterning through exposure and development processes using a photoresist. In an embodiment, the blocking layer BL may include a plurality of extension portions.

Referring to FIGS. 10A and 10B, a substrate layer 100L may be formed on the support substrate SS. The support substrate SS may include an upper surface SSUS of the support substrate SS and a lower surface SSLS of the support substrate SS. The blocking layer BL may be formed on the upper surface SSUS of the support substrate SS, and the substrate layer 100L may be formed on the support substrate SS and the blocking layer BL.

The substrate layer 100L may include a central area CA, a first area A1, a second area A2, a corner area CNA, and an outer area OA. The first area A1 may extend from the central area CA in the first direction (for example, an x-direction or an −x-direction). The second area A2 may extend from the central area CA in the second direction (for example, a y-direction or a −y-direction).

The corner area CNA may surround at least a portion of the central area CA, the first area A1, and the second area A2. The corner area CNA may include the central corner area CCA, the first adjacent corner area ACA1, the second adjacent corner area ACA2, and the middle corner area MCA.

The outer area OA may be arranged outside the corner area CNA. In an embodiment, the outer area OA may be arranged between the central corner area CCA and the first adjacent corner area ACA1. The outer area OA may be an area overlapping the blocking layer BL.

In an embodiment, the substrate layer 100L may include a first base layer 100a, a first barrier layer 100b, a second base layer 100c, and a second barrier layer 100d, which are sequentially stacked. In an embodiment, the first base layer 100a and the second base layer 100c may be continuously arranged in the central corner area CCA, the outer area OA, and the first adjacent corner area ACA1. In an embodiment, the first barrier layer 100b that overlaps the central corner area CCA, the first barrier layer 100b that overlaps the outer area OA, and the first barrier layer 100b that overlaps the first adjacent corner area ACA1 may be spaced apart from one another. In an embodiment, the second barrier layer 100d that overlaps the central corner area CCA, the second barrier layer 100d that overlaps the outer area OA, and the second barrier layer 100d that overlaps the first adjacent corner area ACA1 may be spaced apart from one another.

The inorganic insulating layer IIL, the pixel circuit PC, and the lower connection line LCL may be formed on the substrate layer 100L. In an embodiment, the inorganic insulating layer IIL arranged in the central corner area CCA and the inorganic insulating layer IIL arranged in the first adjacent corner area ACA1 may be spaced apart from each other. In an embodiment, the inorganic insulating pattern IIP may be arranged in the outer area OA. The inorganic insulating pattern IIP may be spaced apart from each of the inorganic insulating layer IIL arranged in the central corner area CCA and the inorganic insulating layer IIL arranged in the first adjacent corner area ACA1.

In an embodiment, the lower connection line LCL may include a first lower connection line LCL1 and a second lower connection line LCL2. In an embodiment, the first lower connection line LCL1 may be arranged between the first gate insulating layer 112 and the second gate insulating layer 113. The second lower connection line LCL2 may be arranged between the second gate insulating layer 113 and the interlayer insulating layer 114.

The lower organic insulating layer 115 may be formed on the inorganic insulating layer IIL and the pixel circuit PC. The lower organic insulating layer 115 may be continuously arranged in the central corner area CCA, the outer area OA, and the first adjacent corner area ACA1.

The second connection line CL2 and the connection electrode CML may be formed on the lower organic insulating layer 115.

Figure 11A:
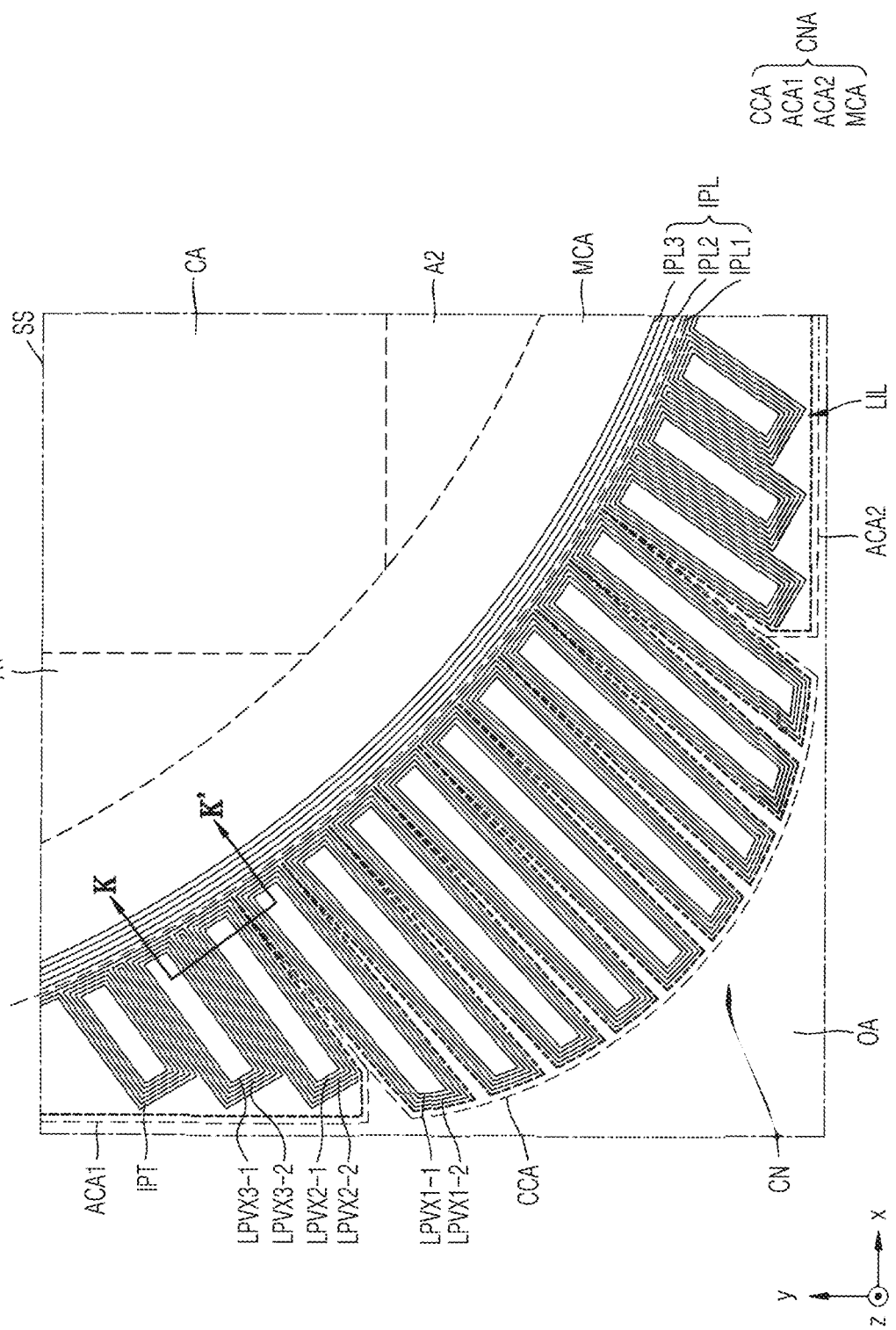
FIG. 11A is a plan view illustrating a method of manufacturing a display device according to an embodiment.
Figure 11B:
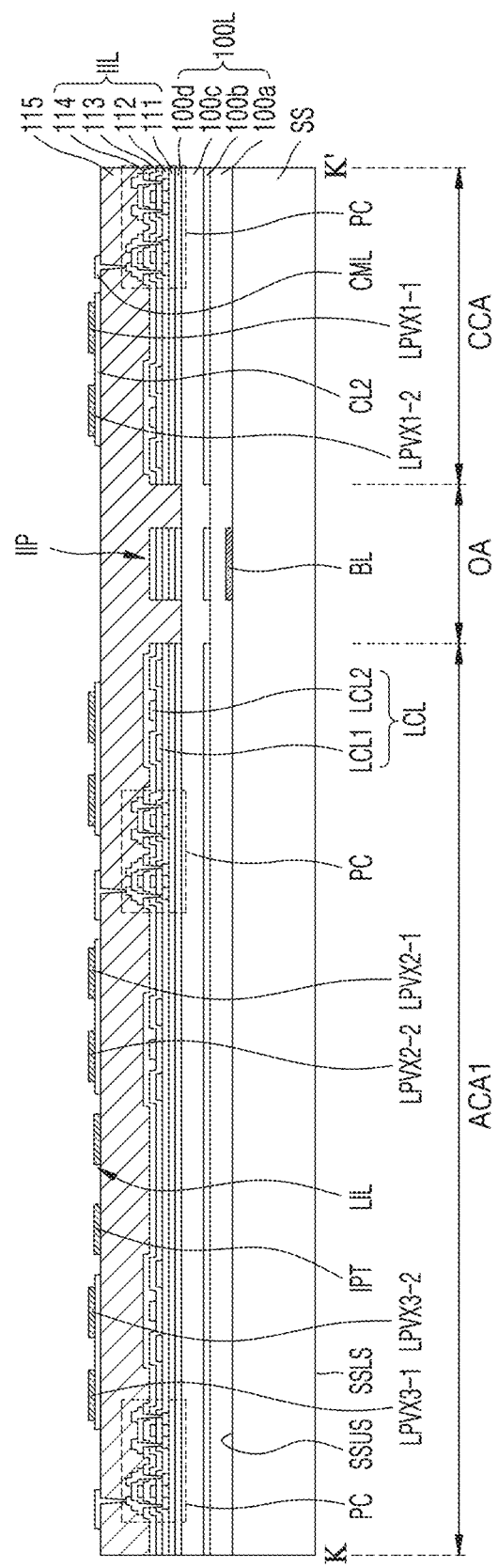
FIGS. 11B and 11C are cross-sectional views of a display device under manufacture taken along line K-K' of FIG. 11A.
Figure 11C:
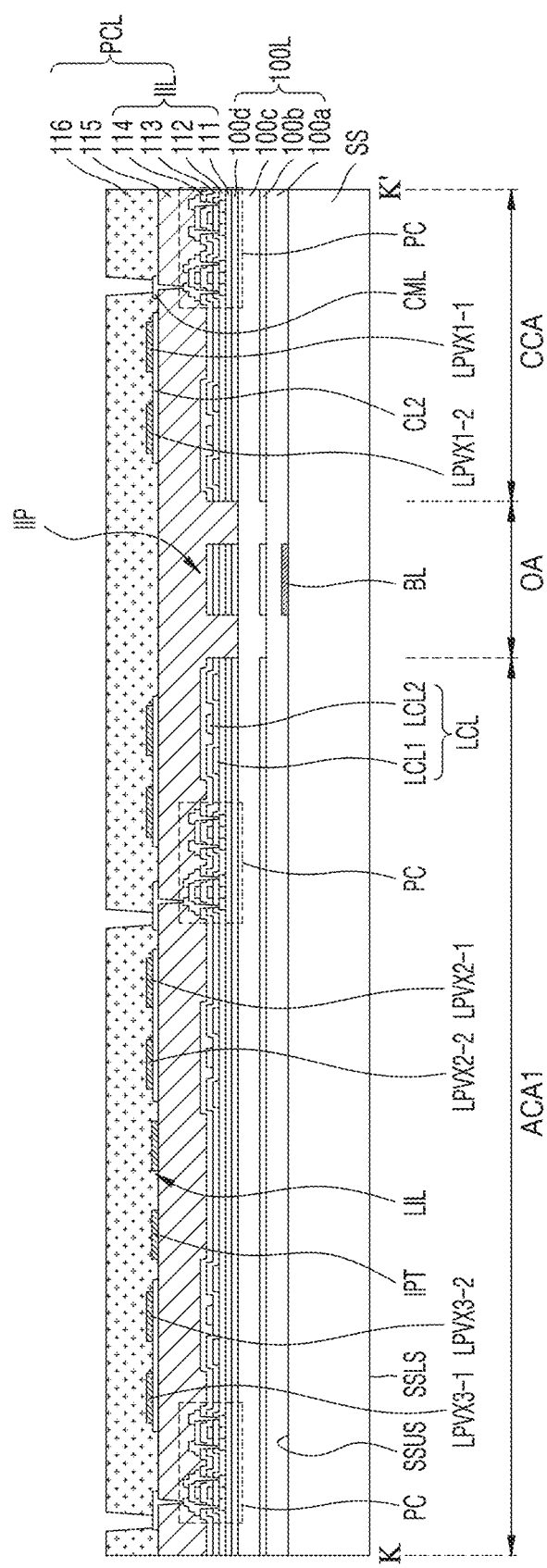

FIG. 11A is a plan view illustrating a method of manufacturing a display device according to an embodiment. FIGS. 11B and 11C are cross-sectional views of a display device under manufacture taken along line K-K' of FIG. 11A.

Referring to FIGS. 11A and 11B, the lower inorganic layer LIL may be formed on the lower organic insulating layer 115 and/or the second connection line CL2. The lower inorganic layer LIL may overlap the corner area CNA. In an embodiment, the lower inorganic layer LIL may not overlap the central area CA. In an embodiment, the lower inorganic layer LIL may not overlap the outer area OA. The lower inorganic layer LIL may include a first inner inorganic pattern LPVX1-1, a second inner inorganic pattern LPVX2-1, and a third inner inorganic pattern LPVX3-1. The lower inorganic layer LIL may include a first outer inorganic pattern LPVX1-2, a second outer inorganic pattern LPVX2-2, and a third outer inorganic pattern LPVX3-2. The lower inorganic layer LIL may include an inorganic pattern line IPL, an inorganic pattern IPT, and a lower inorganic pattern portion (not shown). In an embodiment, the lower inorganic layer LIL may be entirely formed on the lower organic insulating layer 115 and then may be patterned.

In an embodiment, each of the first inner inorganic pattern LPVX1-1, the second inner inorganic pattern LPVX2-1, and the third inner inorganic pattern LPVX3-1 may be formed in a closed curve shape. Each of the first inner inorganic pattern LPVX1-1, the second inner inorganic pattern LPVX2-1, and the third inner inorganic pattern LPVX3-1 may extend in a direction away from the central area CA. The first inner inorganic pattern LPVX1-1 may be formed in the central corner area CCA. The second inner inorganic pattern LPVX2-1 and the third inner inorganic pattern LPVX3-1 may be formed in the first adjacent corner area ACA1.

In an embodiment, each of the first outer inorganic pattern LPVX1-2, the second outer inorganic pattern LPVX2-2, and the third outer inorganic pattern LPVX3-2 may be formed in a closed curve shape. Each of the first outer inorganic pattern LPVX1-2, the second outer inorganic pattern LPVX2-2, and the third outer inorganic pattern LPVX3-2 may extend in a direction away from the central area CA. The first outer inorganic pattern LPVX1-2, the second outer inorganic pattern LPVX2-2, and the third outer inorganic pattern LPVX3-2 may each surround the first inner inorganic pattern LPVX1-1, the second inner inorganic pattern LPVX2-1, and the third inner inorganic pattern LPVX3-1.

The inorganic pattern line IPL may extend between the central corner area CCA and the middle corner area MCA. The inorganic pattern line IPL may surround at least one of the central area CA, the first area A1, the second area A2, and the middle corner area MCA.

The inorganic pattern line IPL may include a first inorganic pattern line IPL1, a second inorganic pattern line IPL2, and a third inorganic pattern line IPL3. The first inorganic pattern line IPL1 and the second inorganic pattern line IPL2 may surround at least a portion of the third inorganic pattern line IPL3. The first inorganic pattern line IPL1 may surround at least a portion of the second inorganic pattern line IPL2.

The inorganic pattern IPT may be formed in at least one of the first adjacent corner area ACA1 and the second adjacent corner area ACA2. The inorganic pattern IPT may extend in a serpentine shape. The inorganic pattern IPT may surround at least a portion of each of the second outer inorganic pattern LPVX2-2 and the third outer inorganic pattern LPVX3-2.

The inorganic pattern IPT may include a first portion, a curved portion, and a second portion. The first portion may extend in a direction closer to the central area CA. The curved portion may extend from the first portion in a curve shape. Thus, the extension direction of the inorganic pattern IPT may be changed in the curved portion. The second portion may extend in a direction away from the central area CA in the curved portion.

Referring to FIG. 11C, the organic insulating layer 116 may be formed on the lower organic insulating layer 115, the lower inorganic layer LIL, the second connection line CL2, and the connection electrode CML. In an embodiment, the organic insulating layer 116 may be formed on the inorganic pattern IPT. The organic insulating layer 116 may be continuously arranged on the central corner area CCA, the outer area OA, and the first adjacent corner area ACA1. In an embodiment, the organic insulating layer 116 may have a hole exposing the connection electrode CML.

Figure 12A:
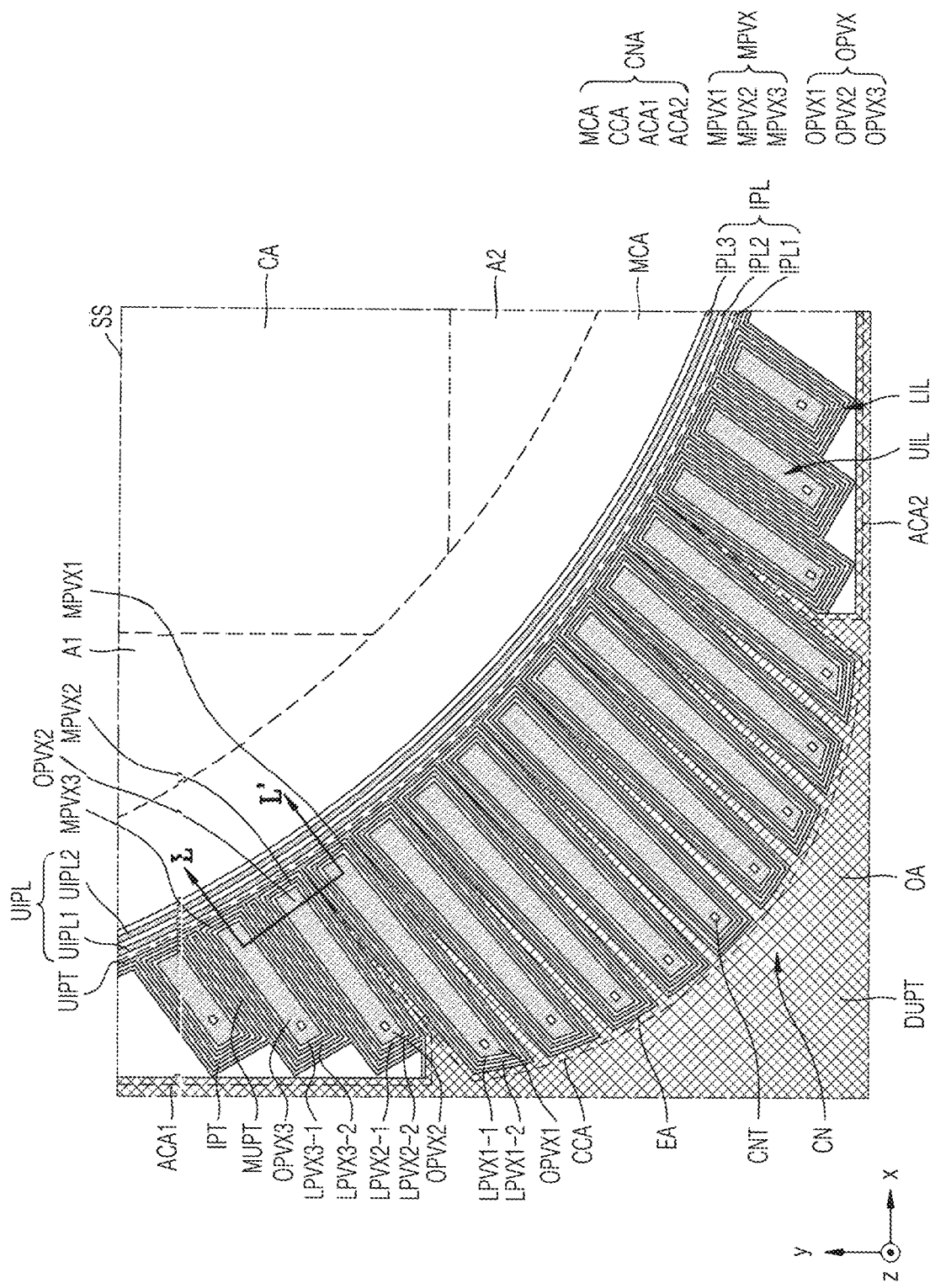
FIG. 12A is a plan view illustrating a method of manufacturing a display device according to an embodiment.
Figure 12B:
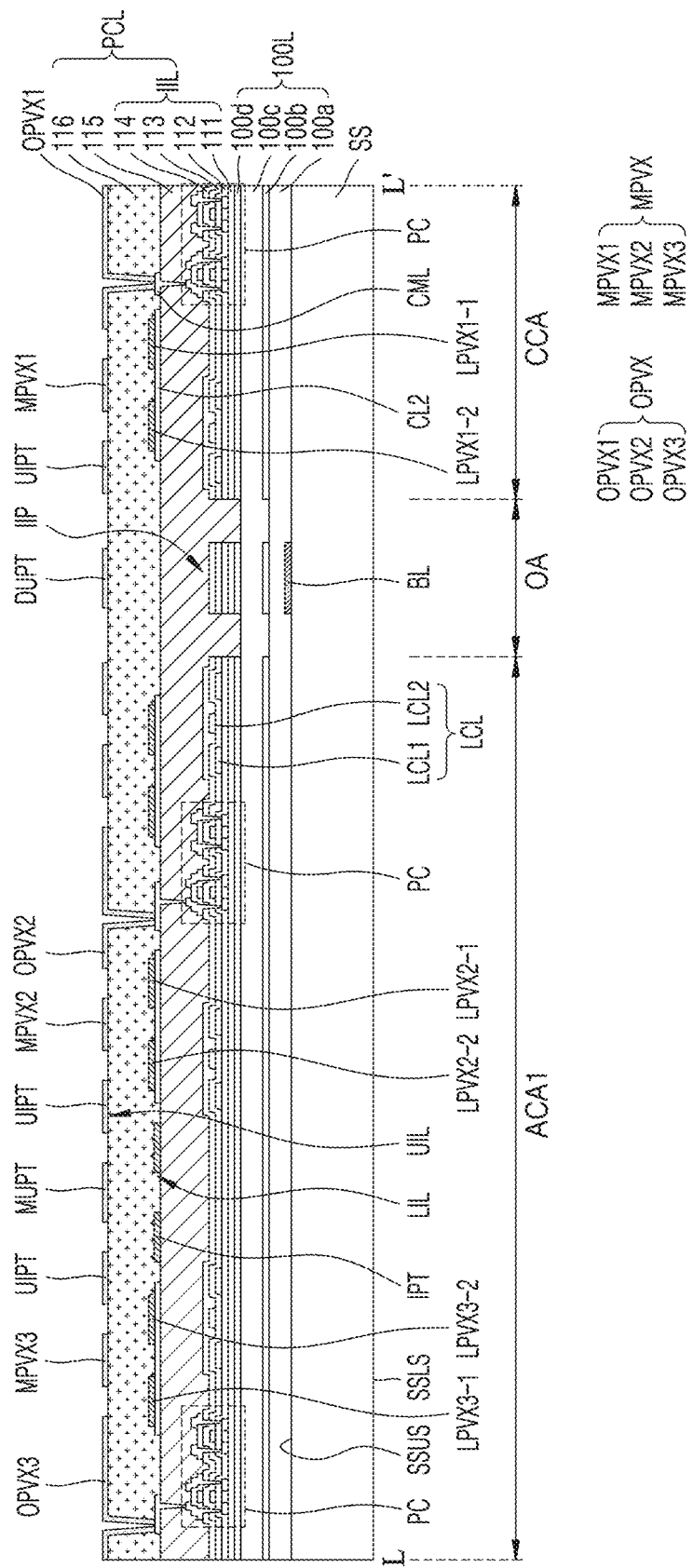
FIGS. 12B and 12C are cross-sectional views of a display device under manufacture taken along line L-L' of FIG. 12A.
Figure 12C:
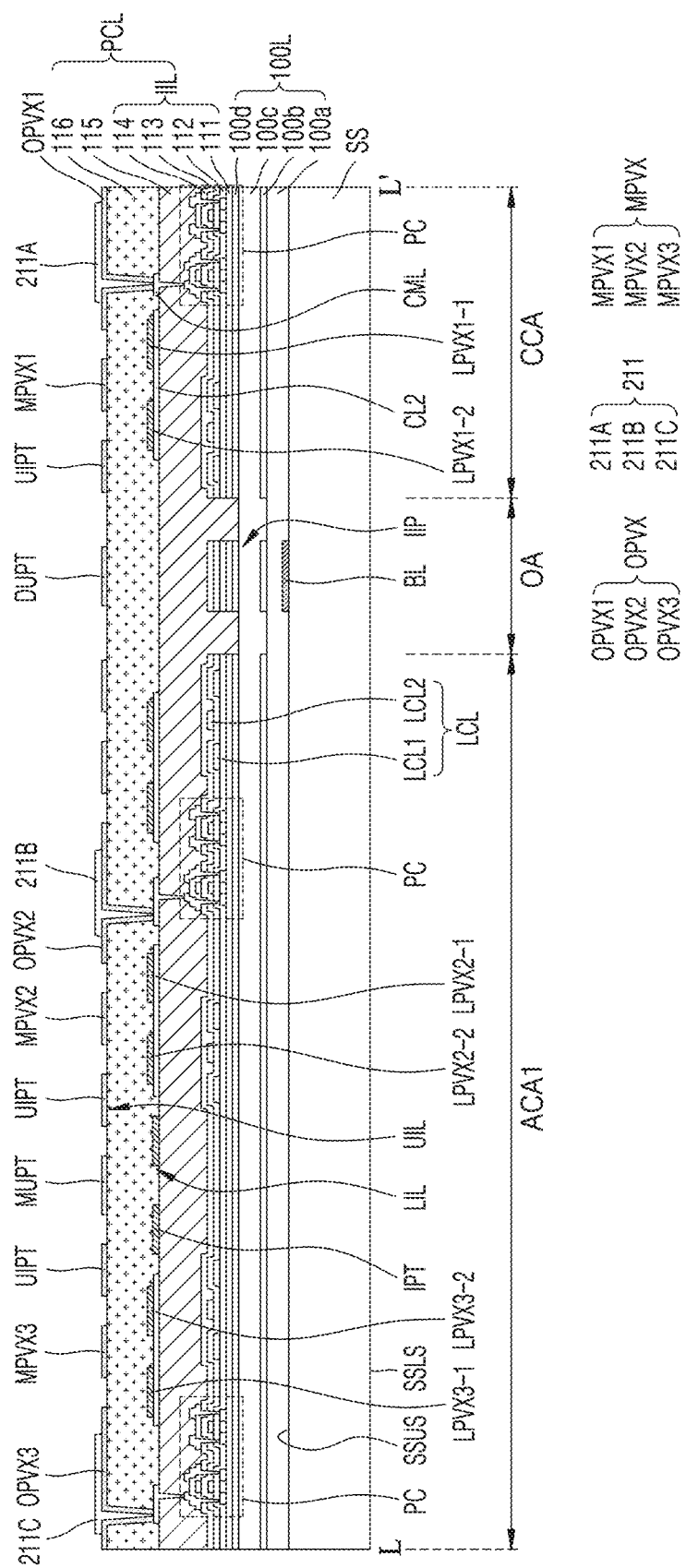

FIG. 12A is a plan view illustrating a method of manufacturing a display device according to an embodiment. FIGS. 12B and 12C are cross-sectional views of a display device under manufacture taken along line L-L' of FIG. 12A.

Referring to FIGS. 12A and 12B, the upper inorganic layer UIL may be formed on the organic insulating layer 116. In an embodiment, the upper inorganic layer UIL may overlap the corner area CNA and/or the outer area OA. In an embodiment, the upper inorganic layer UIL may not overlap the central area CA. The upper inorganic layer UIL may include an overlapping inorganic pattern OPVX, an upper inorganic pattern UIPT, an auxiliary inorganic pattern MPVX, an upper inorganic pattern line UIPL, a middle upper inorganic pattern MUPT, and a dummy upper inorganic pattern DUPT. In an embodiment, the overlapping inorganic pattern OPVX, the upper inorganic pattern UIPT, the auxiliary inorganic pattern MPVX, the upper inorganic pattern line UIPL, the middle upper inorganic pattern MUPT, and the dummy upper inorganic pattern DUPT may be simultaneously formed.

The overlapping inorganic pattern OPVX may be arranged in the corner area CNA. The overlapping inorganic pattern OPVX may not overlap at least one of the central area CA, the first area A1, and the second area A2.

The overlapping inorganic pattern OPVX may include an inorganic pattern opening (not shown). The overlapping inorganic pattern opening (not shown) may be a passage which is arranged under the overlapping inorganic pattern OPVX and through which gas generated from a layer including an organic material is discharged.

The overlapping inorganic pattern OPVX may include a contact hole CNT arranged at a distal end of the overlapping inorganic pattern OPVX.

A plurality of overlapping inorganic patterns OPVX may be provided, and each of the plurality of overlapping inorganic patterns OPVX may extend in a direction away from the central area CA. The plurality of overlapping inorganic patterns OPVX may include a first overlapping inorganic pattern OPVX1, a second overlapping inorganic pattern OPVX2, and a third overlapping inorganic pattern OPVX3. The first overlapping inorganic pattern OPVX1 may be arranged in the central corner area CCA. The second overlapping inorganic pattern OPVX2 and the third overlapping inorganic pattern OPVX3 may be arranged in the first adjacent corner area ACA1.

The auxiliary inorganic pattern MPVX may be spaced apart from the overlapping inorganic pattern OPVX and may surround the overlapping inorganic pattern OPVX. In an embodiment, the auxiliary inorganic pattern MPVX may include a first auxiliary inorganic pattern MPVX1, a second auxiliary inorganic pattern MPVX2, and a third auxiliary inorganic pattern MPVX3. The first auxiliary inorganic pattern MPVX1 may be spaced apart from the first overlapping inorganic pattern OPVX1 and may surround the first overlapping inorganic pattern OPVX1. The second auxiliary inorganic pattern MPVX2 may be spaced apart from the second overlapping inorganic pattern OPVX2 and may surround the second overlapping inorganic pattern OPVX2. The third auxiliary inorganic pattern MPVX3 may be spaced apart from the third overlapping inorganic pattern OPVX3 and may surround the third overlapping inorganic pattern OPVX3.

The upper inorganic pattern UIPT may be arranged in the corner area CNA. The upper inorganic pattern UIPT arranged in the central corner area CCA may define edges of the plurality of extension areas EA. The upper inorganic pattern UIPT may be spaced apart from the overlapping inorganic pattern OPVX and the auxiliary inorganic pattern MPVX and may surround the overlapping inorganic pattern OPVX and the auxiliary inorganic pattern MPVX. In an embodiment, the upper inorganic pattern UIPT may surround each of the first overlapping inorganic pattern OPVX1, the second overlapping inorganic pattern OPVX2, and the third overlapping inorganic pattern OPVX3.

In an embodiment, a portion of the upper inorganic pattern UIPT may extend between the central corner area CCA and the middle corner area MCA. A portion of the upper inorganic pattern UIPT may surround at least one of the central area CA, the first area A1, the second area A2, and the middle corner area MCA.

The upper inorganic pattern line UIPL may extend between the central corner area CCA and the middle corner area MCA. The upper inorganic pattern line UIPL may surround at least one of the central area CA, the first area A1, the second area A2, and the middle corner area MCA. The upper inorganic pattern line UIPL may be spaced apart from the upper inorganic pattern UIPT. The upper inorganic pattern line UIPL may include a first upper inorganic pattern line UIPL1 and a second upper inorganic pattern line UIPL2. The upper inorganic pattern line UIPL1 may surround the second upper inorganic pattern line UIPL2.

The middle upper inorganic pattern MUPT may be arranged in the first adjacent corner area ACA1. The middle upper inorganic pattern MUPT may be arranged between the upper inorganic patterns UIPT facing each other. In an embodiment, the middle upper inorganic pattern MUPT and the upper inorganic pattern UIPT may be integrally provided.

The dummy upper inorganic pattern DUPT may be arranged in the outer area OA. In an embodiment, the dummy upper inorganic pattern DUPT may be arranged between a plurality of adjacent upper inorganic patterns UIPT arranged in the central corner area CCA. The dummy upper inorganic patterns DUPT may be arranged between the upper inorganic pattern UIPT arranged in the central corner area CCA and the upper inorganic pattern UIPT arranged in the first adjacent corner area ACA1. The dummy upper inorganic pattern DUPT and the upper inorganic pattern UIPT may be spaced apart from each other.

Referring to FIG. 12C, the pixel electrode 211 may be formed on the overlapping inorganic pattern OPVX. In an embodiment, the plurality of pixel electrodes 211 may be formed on the overlapping inorganic pattern OPVX. In an embodiment, the plurality of pixel electrodes 211 may be formed on the substrate 100. The pixel electrode 211 may include a first pixel electrode 211A, a second pixel electrode 211B, and a third pixel electrode 211C. The first pixel electrode 211A may be arranged in the central corner area CCA and may be formed on the first overlapping inorganic pattern OPVX1. The second pixel electrode 211B may be arranged in the first adjacent corner area ACA1 and may be formed on the second overlapping inorganic pattern OPVX2. The third pixel electrode 211C may be arranged in the first adjacent corner area ACA1 and may be formed on the third overlapping inorganic pattern OPVX3.

Figure 13A:
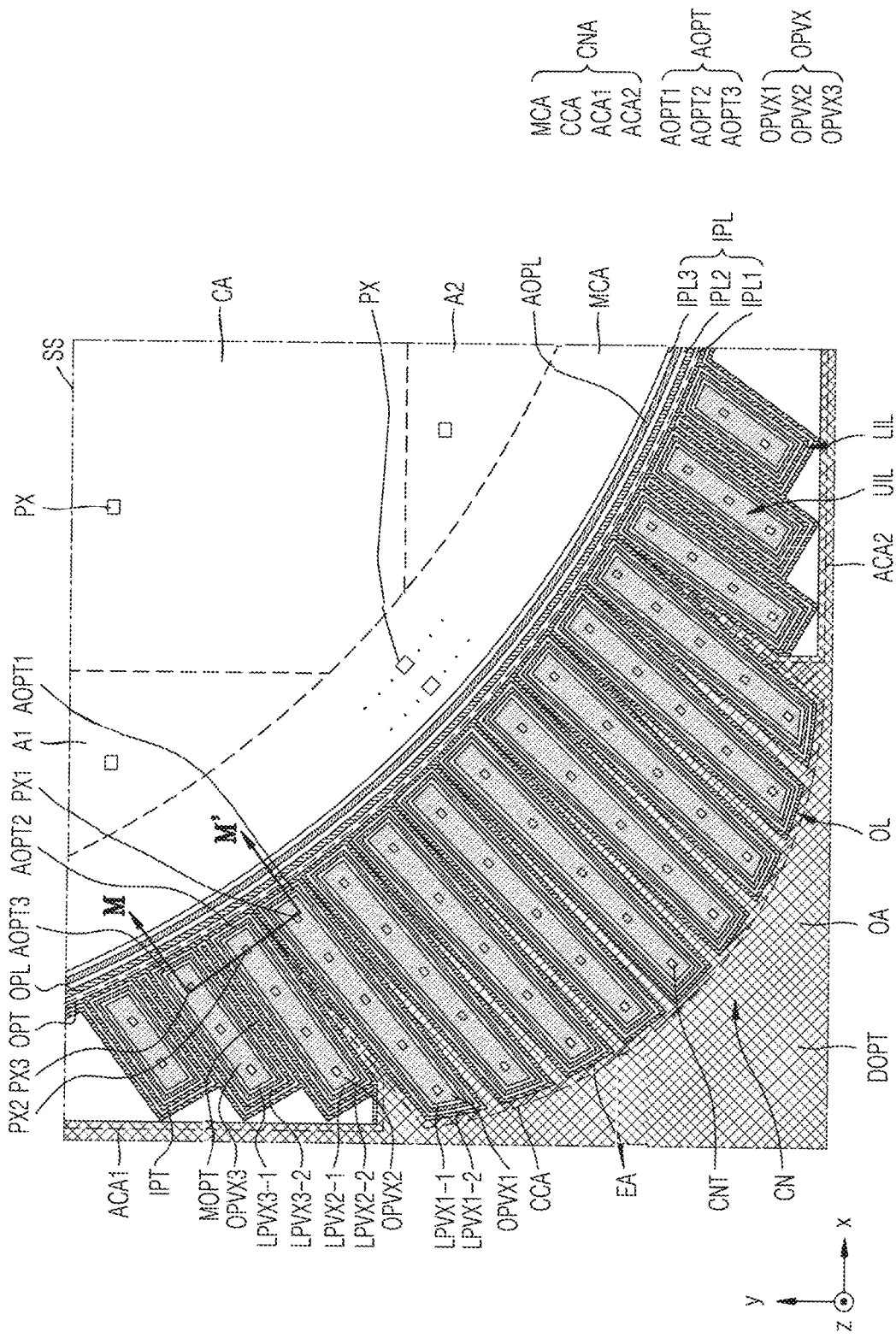
FIG. 13A is a plan view illustrating a method of manufacturing a display device according to an embodiment.
Figure 13B:
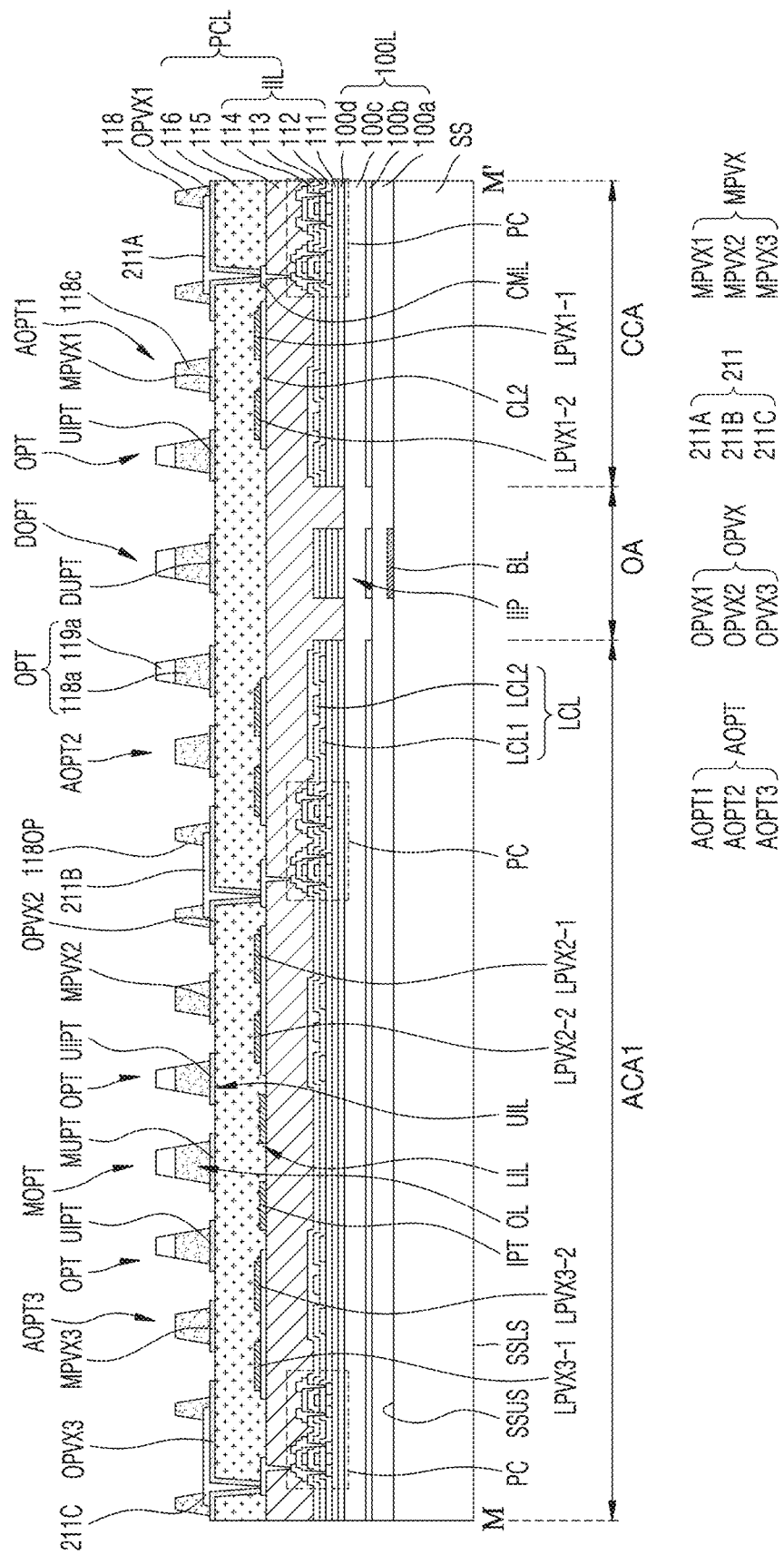
FIGS. 13B, 13C, 13D, 13E, and 13F are cross-sectional views of a display device under manufacture taken along line M-M' of FIG. 13A.

FIG. 13A is a plan view illustrating a method of manufacturing a display device according to an embodiment. FIGS. 13B through 13F are cross-sectional views of a display device under manufacture taken along line M-M' of FIG. 13A. FIG. 13G is an enlarged view of portion N of the display device under manufacture of FIG. 13F. FIG. 13H is an enlarged view of portion O of the display device under manufacture of FIG. 13F. FIG. 13I is a cross-sectional view of a display device under manufacture taken along line M-M' of FIG. 13A;

Referring to FIGS. 13A and 13B, the organic layer OL may be formed on the upper inorganic layer UIL. The organic layer OL may include a pixel-defining layer 118, an organic pattern OPT, an organic pattern line OPL, an auxiliary organic pattern AOPT, an auxiliary organic pattern line AOPL, a middle organic pattern MOPT, and a dummy organic pattern DOPT.

The pixel-defining layer 118 may cover edges of the pixel electrode 211. In an embodiment, the pixel-defining layer 118 may cover edges of the first pixel electrode 211A, edges of the second pixel electrode 211B, and edges of the third pixel electrode 211C. The opening 118OP of the pixel-defining layer 118 may overlap the pixel electrode 211.

In an embodiment, an organic pattern OPT may be formed to surround the first pixel electrode 211A, the second pixel electrode 211B, and the third pixel electrode 211C. The organic pattern OPT may be formed on the upper inorganic pattern UIPT. The organic pattern OPT that overlaps the central corner area CCA may define edges of a plurality of extension areas EA. In an embodiment, the organic pattern OPT may include a first layer 118*a* and a second layer 119*a* arranged on the first layer 118*a*.

In an embodiment, a portion of the organic pattern OPT may extend between the central corner area CCA and the middle corner area MCA. A portion of the organic pattern OPT may surround at least one of the central area CA, the first area A1, the second area A2, and the middle corner area MCA.

The organic pattern line OPL may extend between the central corner area CCA and the middle corner area MCA. The organic pattern line OPL may be arranged on the upper inorganic pattern line. The organic pattern line OPL may surround at least one of the central area CA, the first area A1, the second area A2, and the middle corner area MCA. The organic pattern line OPL may be spaced apart from the organic pattern OPT.

The auxiliary organic pattern AOPT may be spaced apart from the organic pattern OPT. The organic pattern OPT may surround the auxiliary organic pattern AOPT. The auxiliary organic pattern AOPT may be arranged on the auxiliary inorganic pattern MPVX. In an embodiment, the auxiliary organic pattern AOPT may include a first auxiliary organic pattern AOPT1, a second auxiliary organic pattern AOPT2, and a third auxiliary organic pattern AOPT3. The auxiliary organic pattern AOPT may include a first layer 118*c*.

The first auxiliary organic pattern AOPT1, the second auxiliary organic pattern AOPT2, and the third auxiliary organic pattern AOPT3 may be arranged on the first auxiliary inorganic pattern MPVX1, the second auxiliary inorganic pattern MPVX2, and the third auxiliary inorganic pattern MPVX3, respectively.

The auxiliary organic pattern line AOPL may extend between the central corner area CCA and the middle corner area MCA. The organic pattern line OPL may surround the auxiliary organic pattern line AOPL. The auxiliary organic pattern line AOPL may extend similar to the organic pattern line OPL. The auxiliary organic pattern line AOPL may be spaced apart from the auxiliary organic pattern AOPT.

The middle organic pattern MOPT may be arranged in the first adjacent corner area ACA1. The middle organic pattern MOPT may be arranged on the middle upper inorganic pattern MDPT. The middle organic pattern MOPT may be arranged between the organic patterns OPT facing each other. In some embodiments, the middle organic pattern MOPT and the organic pattern OPT may be integrally provided.

The dummy organic pattern DOPT may be arranged in the outer area OA. The dummy organic pattern DOPT may be arranged on the dummy upper inorganic pattern DUPT. In an embodiment, the dummy organic pattern DOPT may be arranged between the organic pattern OPT arranged in the central corner area CCA and the organic pattern OPT arranged in the first adjacent corner area ACA1.

Figure 13C:
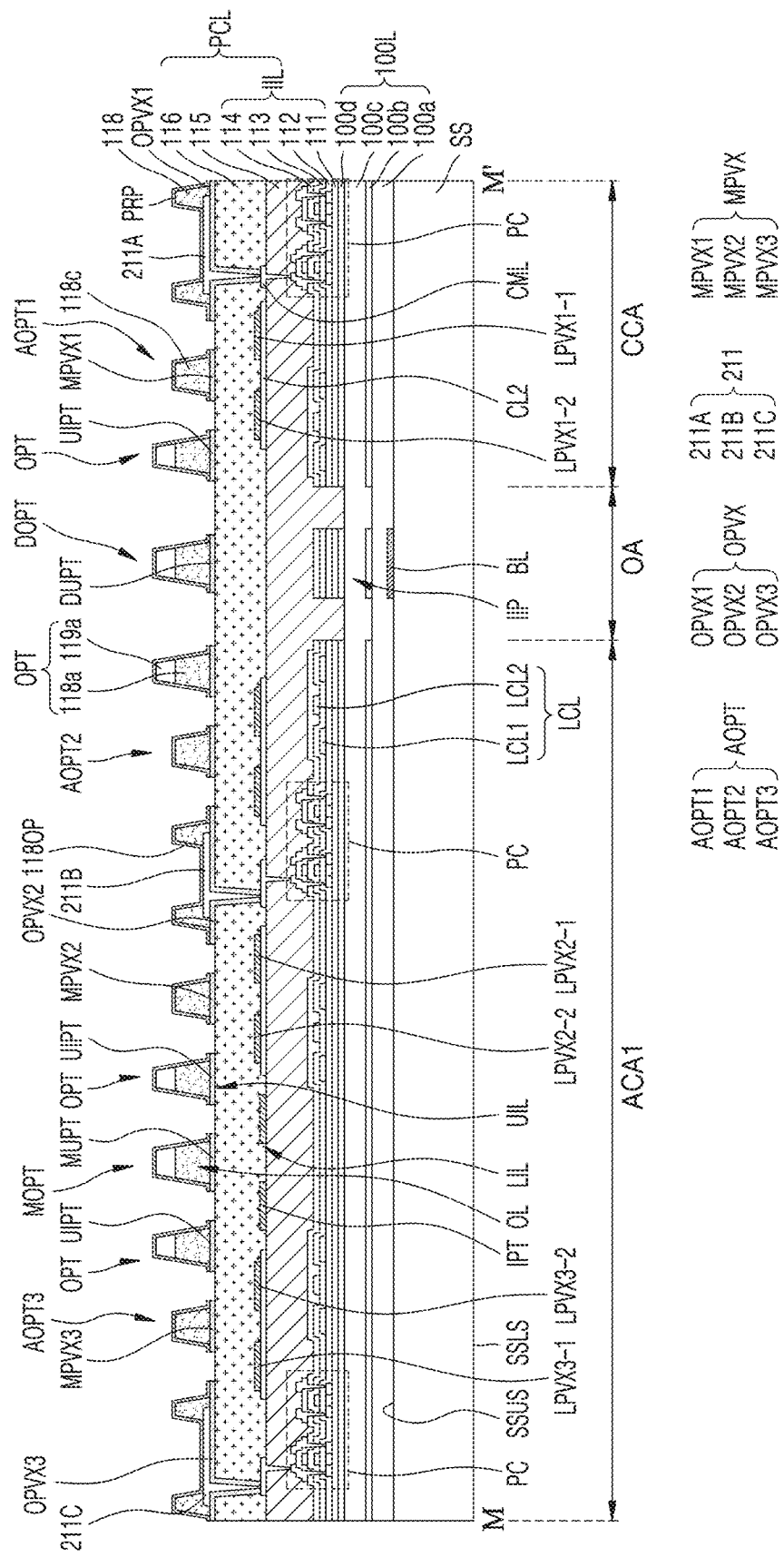
Figure 13D:
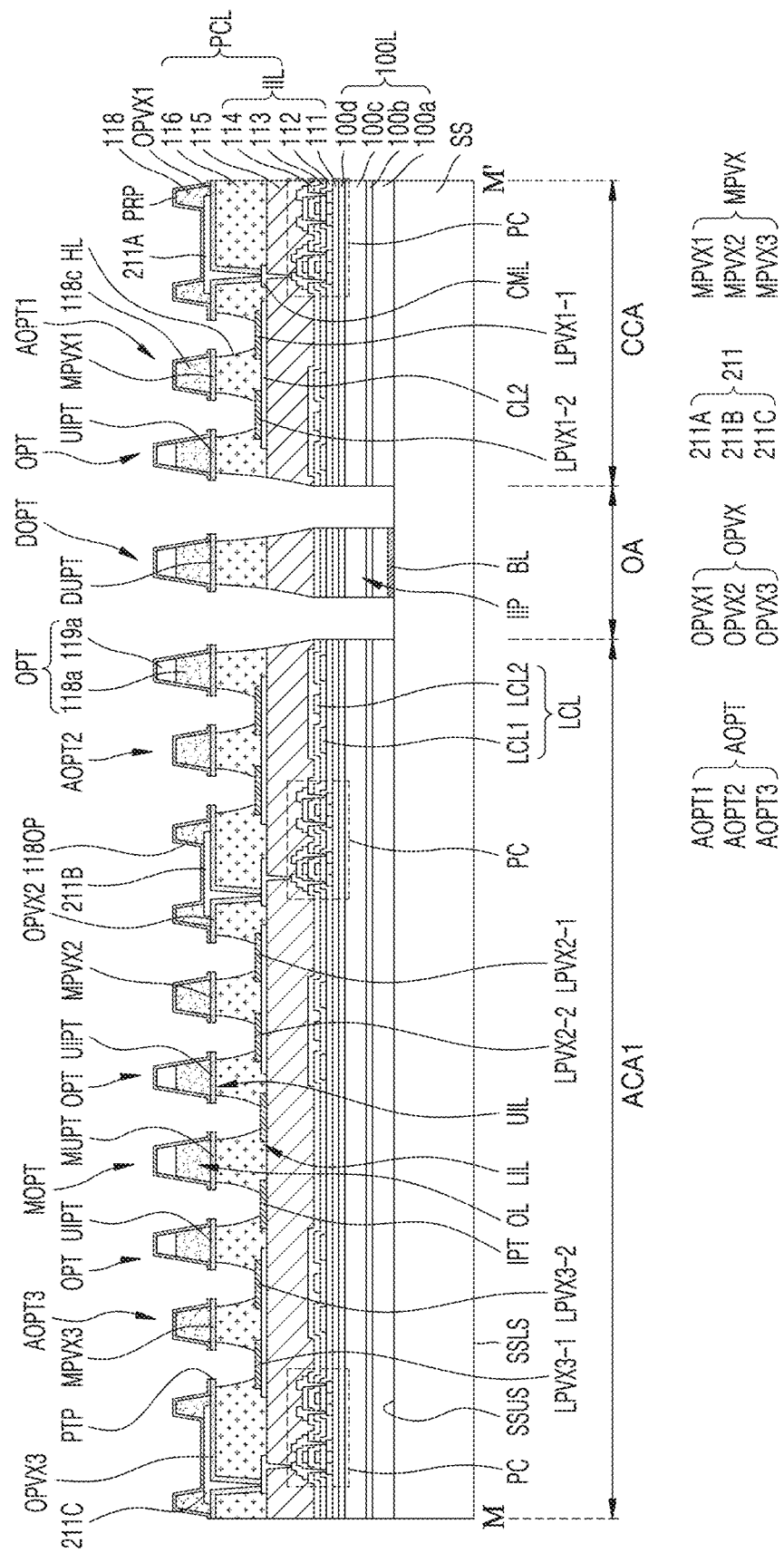
Figure 13E:
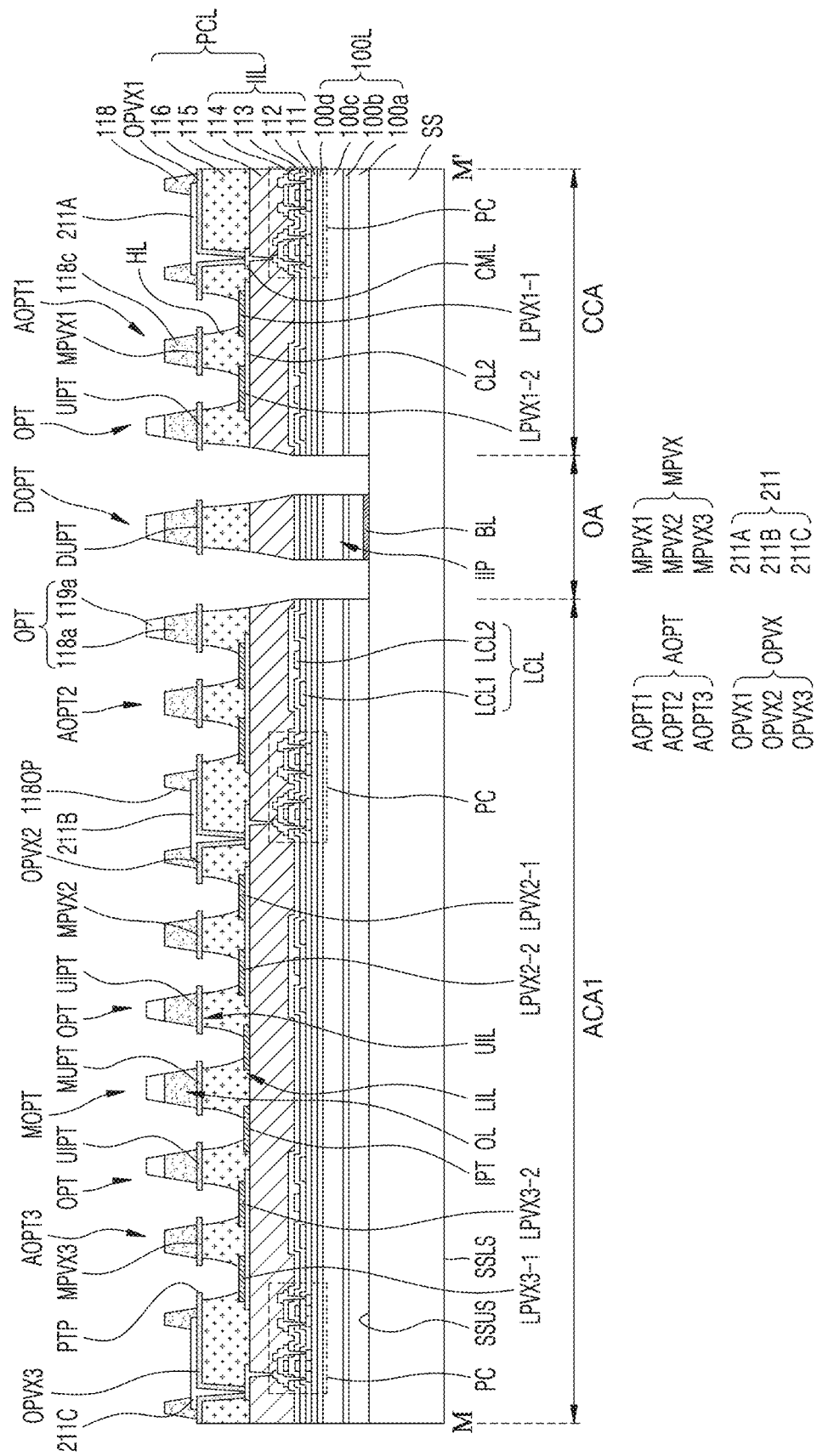

Referring to FIGS. 13C through 13E, at least a portion of the substrate layer 100L between the central corner area CCA and the first adjacent corner area ACA1 may be removed. Also, when at least a portion of the substrate layer 100L is removed, a hole HL exposing at least a portion of the lower inorganic layer LIL may be formed.

Referring to FIG. 13C, a protective pattern PRP may be formed. In an embodiment, the protective pattern PRP may be formed in the central corner area CCA, the first adjacent corner area ACA1, and the outer area OA. Although not shown, the protective pattern PRP may be entirely formed in the central area CA, the first area A1, the second area A2, and the middle corner area MCA.

A plurality of protective patterns PRP may be provided. Each of the plurality of protective patterns PRP may cover the upper inorganic layer UIL, the pixel electrode 211, and the organic layer OL. An upper surface of the organic insulating layer 116 may be exposed between the plurality of adjacent protective patterns PRP. The protective pattern PRP may include an etch-resistant material. For example, the protective pattern PRP may include indium zinc oxide (IZO).

Referring to FIG. 13D, at least a portion of the substrate layer 100L that overlaps the outer area OA may be removed. In an embodiment, at least a portion of a first base layer 100*a* and a second base layer 100*c* that overlap the outer area OA may be removed. In an embodiment, at least a portion of the lower organic insulating layer 115 and the organic insulating layer 116 that overlap the outer area OA may be removed. In an embodiment, the lower organic insulating layer 115 and the organic insulating layer 116 that overlap the dummy upper inorganic pattern DUPT and the dummy organic pattern DOPT may not be removed.

The hole HL may be formed in the organic insulating layer 116. The hole HL may be formed in the central corner area CCA and the first adjacent corner area ACA1. A plurality of holes HL may be provided. In an embodiment, because the inorganic pattern IPT, the upper inorganic pattern UIPT and the middle upper inorganic pattern MUPT are arranged between the second pixel electrode 211B and the third pixel electrode 211C, the substrate layer 100L and the lower organic insulating layer 115, which are arranged under the organic pattern IPT, the upper inorganic pattern UIPT and the middle upper inorganic pattern MUPT, may not be etched. Thus, the substrate layer 100L, the inorganic insulating layer IIL, and the lower organic insulating layer 115 may be continuously arranged in the first adjacent corner area ACA1.

The hole HL may be a passage through which gas generated from the lower organic insulating layer 115 and/or the organic insulating layer 116 is discharged. In an embodiment, the plurality of holes HL may be arranged in the first adjacent corner area ACA1. Thus, gas generated from the lower organic insulating layer 115 and/or the organic insulating layer 116 may be entirely discharged from the inside of the first adjacent corner area ACA1 and edges of the first adjacent corner area ACA1 facing edges of the central corner area CCA. Thus, the reliability of a manufactured display panel and/or display device may be increased.

In an embodiment, the hole HL may be formed through a dry etching process. In an embodiment, the organic insulating layer 116 exposed between the plurality of adjacent protective patterns PRP may be etched.

The hole HL may expose at least a portion of the lower inorganic layer LIL. In an embodiment, the hole HL may expose at least a portion of the inorganic pattern IPT. The lower organic layer LIL may prevent or reduce the second connection line CL2 and/or the lower organic insulating layer 115 arranged under the lower inorganic layer LIL from being over-etched.

The pixel electrode 211, the upper inorganic layer UIL, and the organic layer OL may be covered by the protective pattern PRP, and the protective pattern PRP may prevent or reduce the pixel electrode 211, the upper inorganic layer UIL, and the organic layer OL from being etched while the hole HL is formed in the organic insulating layer 116.

In an embodiment, the organic insulating layer 116 may be over-etched. Thus, the organic insulating layer 116 may have an undercut structure. In an embodiment, a lower surface of an end of the upper inorganic layer UIL may be exposed. In an embodiment, a lower surface of the protruding tip PTP of the upper inorganic layer UIL that overlaps the hole HL may be exposed.

Referring to FIG. 13E, the protective pattern PRP may be removed. In an embodiment, the protective pattern PRP may be removed through a wet etching process.

Figure 13F:
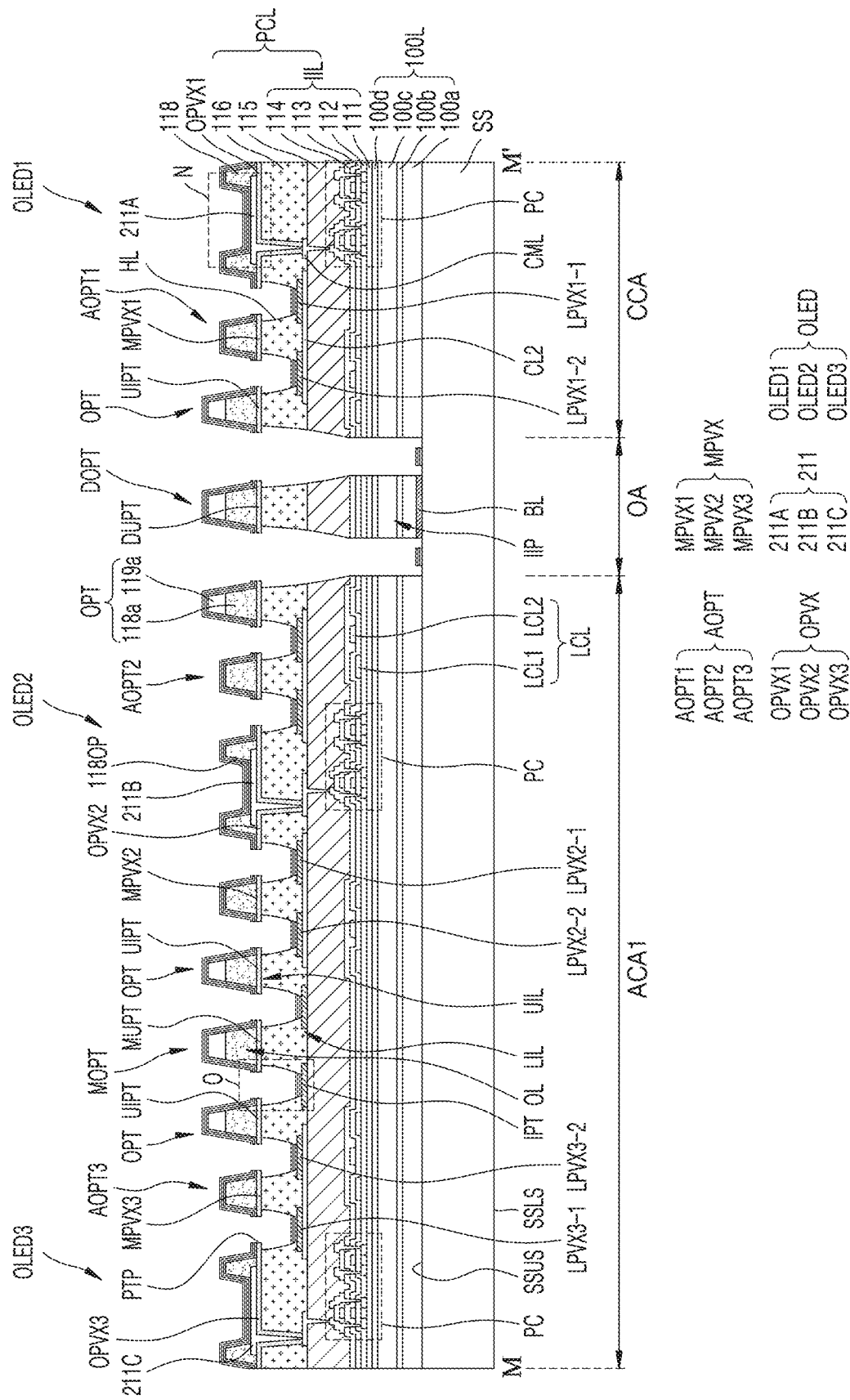
Figure 13G:
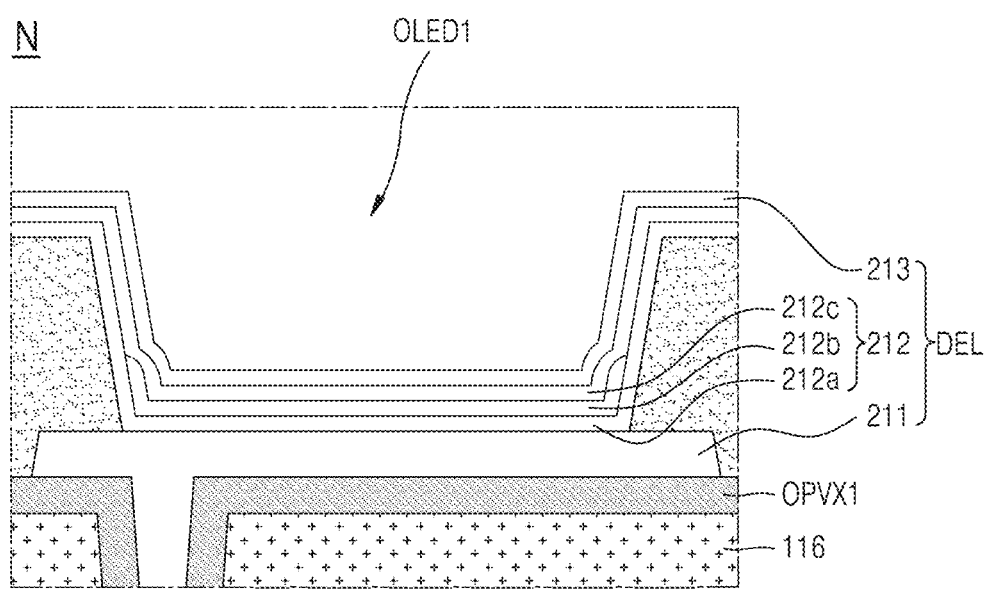
FIG. 13G is an enlarged view of portion N of the display device under manufacture of FIG. 13A.
Figure 13H:
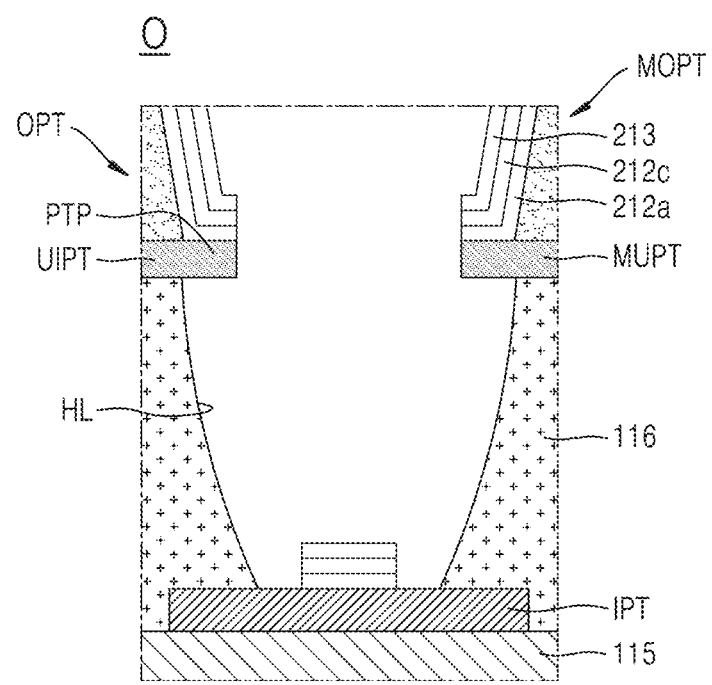
FIG. 13H is an enlarged view of portion O of the display device under manufacture of FIG. 13F.
Figure 13I:
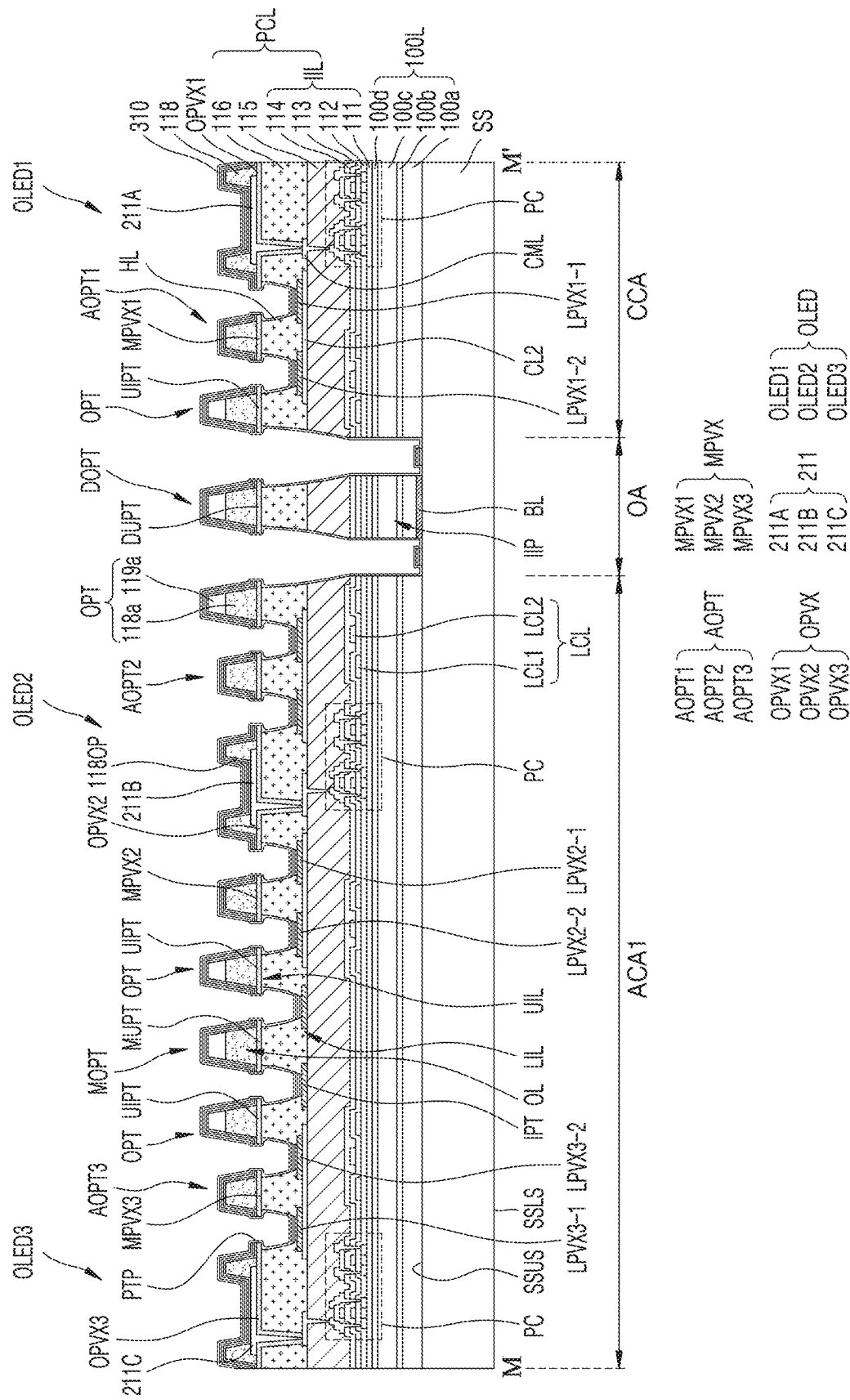
FIG. 13I is a cross-sectional view of a display device under manufacture taken along line M-M' of FIG. 13A.

Referring to FIGS. 13F through 13H, a plurality of organic light emitting diodes OLED as a plurality of display elements may be formed by forming an intermediate layer 212 and an opposite electrode 213 in each of a plurality of pixel electrodes 211. In an embodiment, the intermediate layer 212 including the first functional layer 212a, the emission layer 212b, and the second functional layer 212c may be formed on the plurality of pixel electrodes 211. The opposite electrode 213 may be formed on the intermediate layer 212. Thus, a first organic light emitting diode OLED1 as a first display element, a second organic light emitting diode OLED2 as a second display element, and a third organic light emitting diode OLED3 may be formed.

The upper inorganic layer UIL may include the protruding tip PTP that protrudes in the center direction of the hole HL of the organic insulating layer 116, and each of the first functional layer 212a, the second functional layer 212c, and the opposite electrode 213 may be disconnected based on the hole HL. Also, a lower surface of the protruding tip PTP that overlaps the hole HL may not be in contact with the first functional layer 212a, the second functional layer 212c, and the opposite electrode 213. Thus, external moisture and foreign substances may be prevented or reduced from being introduced into the central corner area CCA and the first adjacent corner area ACA1 through at least one of the first functional layer 212a and the second functional layer 212c. The reliability of the display panel and/or the display device may be increased.

Referring to FIG. 13I, at least one inorganic encapsulating layer may be formed on the plurality of organic light emitting diodes OLED as a plurality of display elements. At least one inorganic encapsulating layer may be entirely and continuously formed in the central corner area CCA and the first adjacent corner area ACA1. In an embodiment, the first inorganic encapsulating layer 310 may be formed on the plurality of organic light emitting diodes OLED. In an embodiment, the first inorganic encapsulating layer 310 may be in contact with the protruding tip PTP. The first inorganic encapsulating layer 310 may be in contact with the inorganic insulating layer IIL. Thus, external moisture and foreign substances may be prevented from being introduced into the central corner area CCA and the first adjacent corner area ACA1, or introduction may be reduced.

Figure 14A:
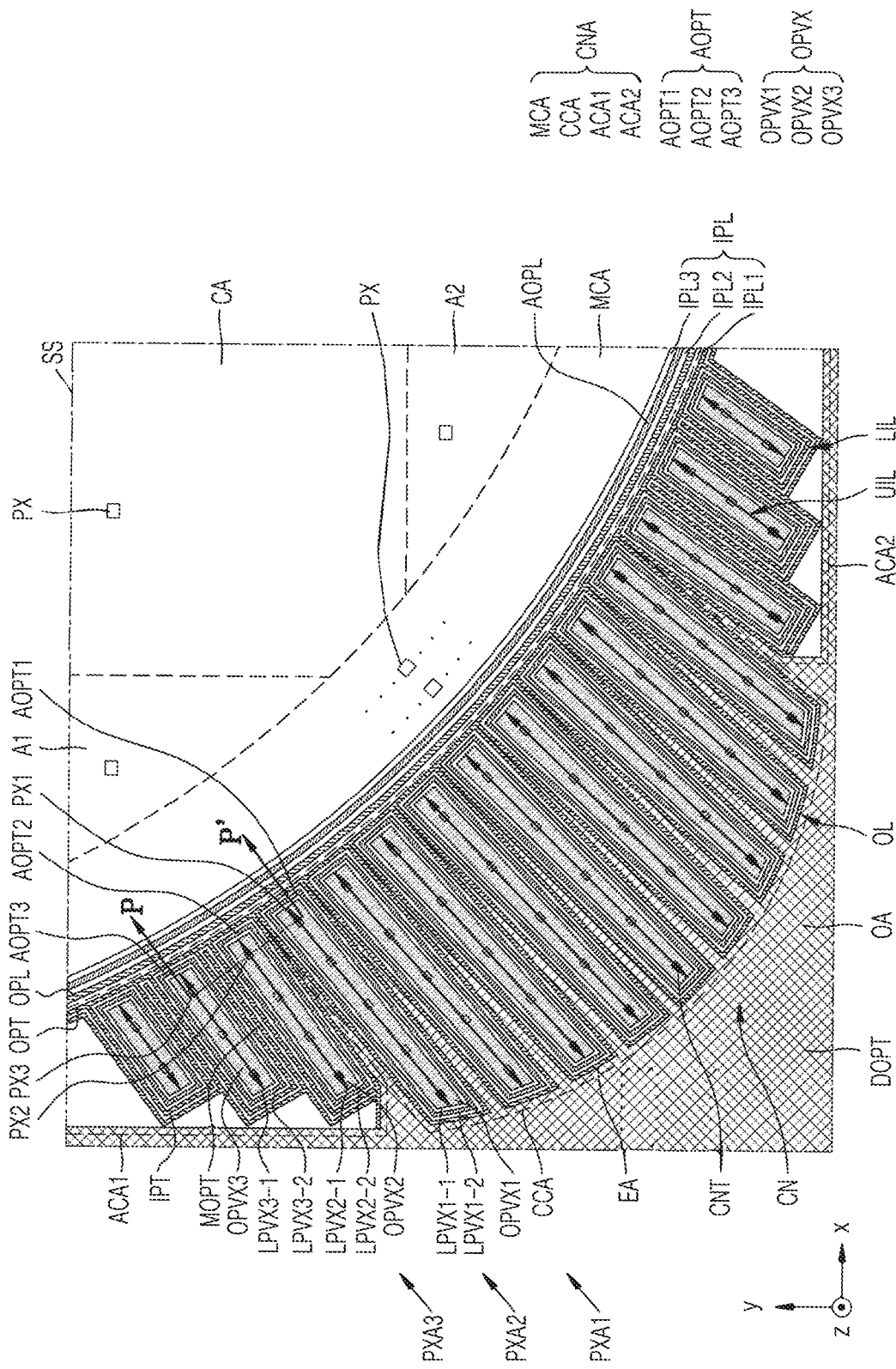
FIG. 14A is a plan view illustrating a method of manufacturing a display device according to an embodiment.
Figure 14B:
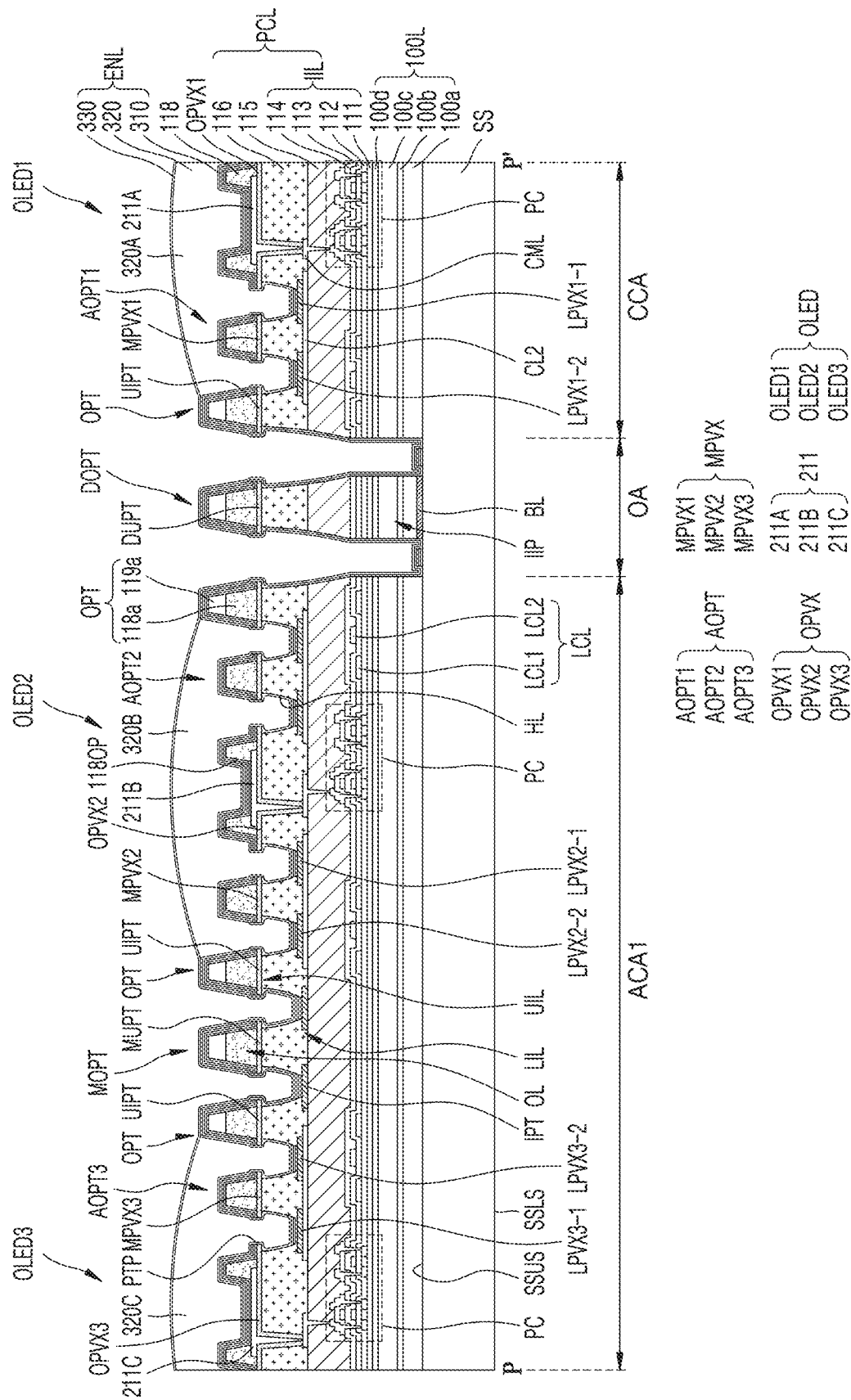
FIGS. 14B and 14C are cross-sectional views of a display device under manufacture taken along line P-P' of FIG. 14A.
Figure 14C:
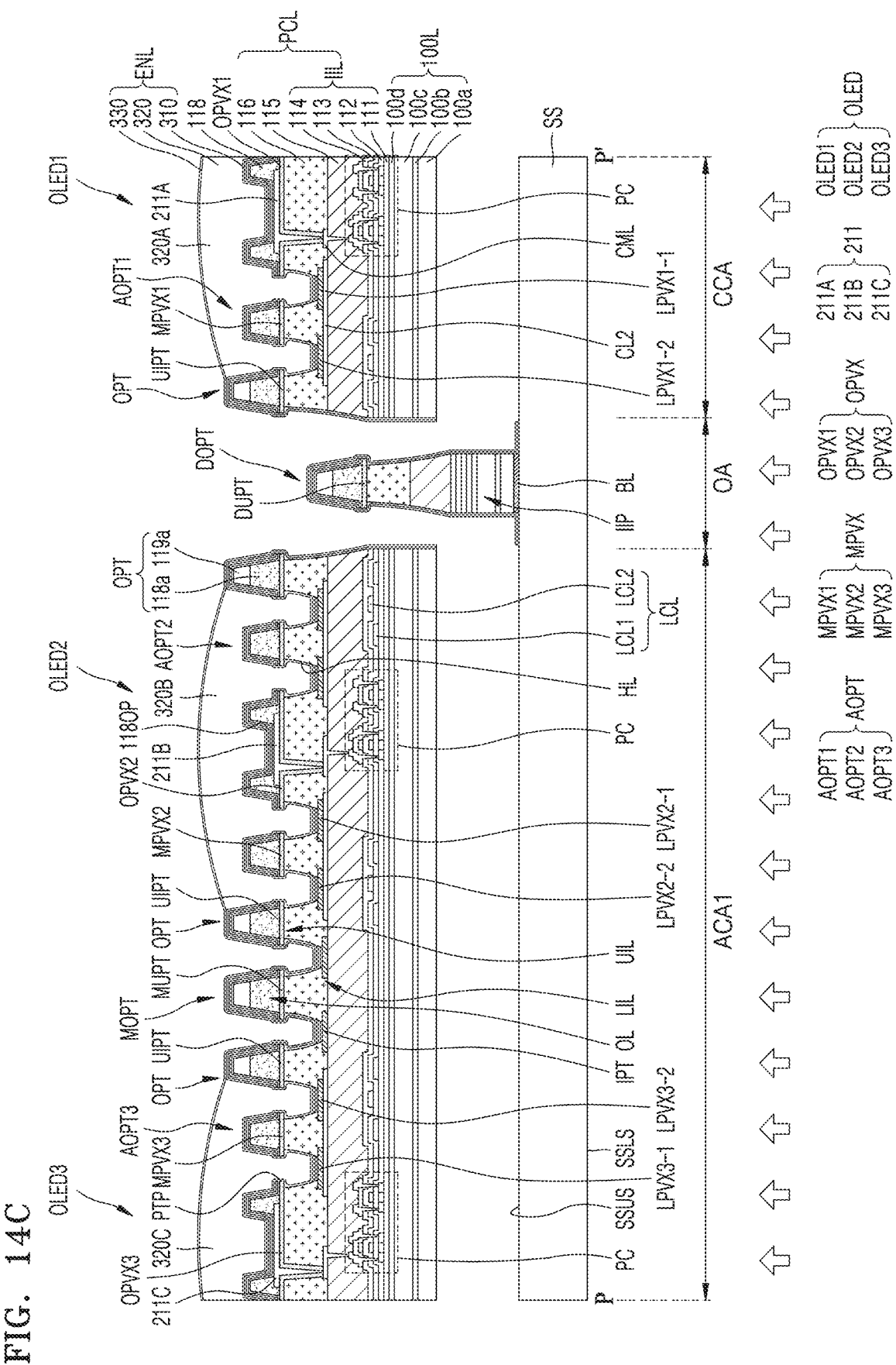
Figure 15:
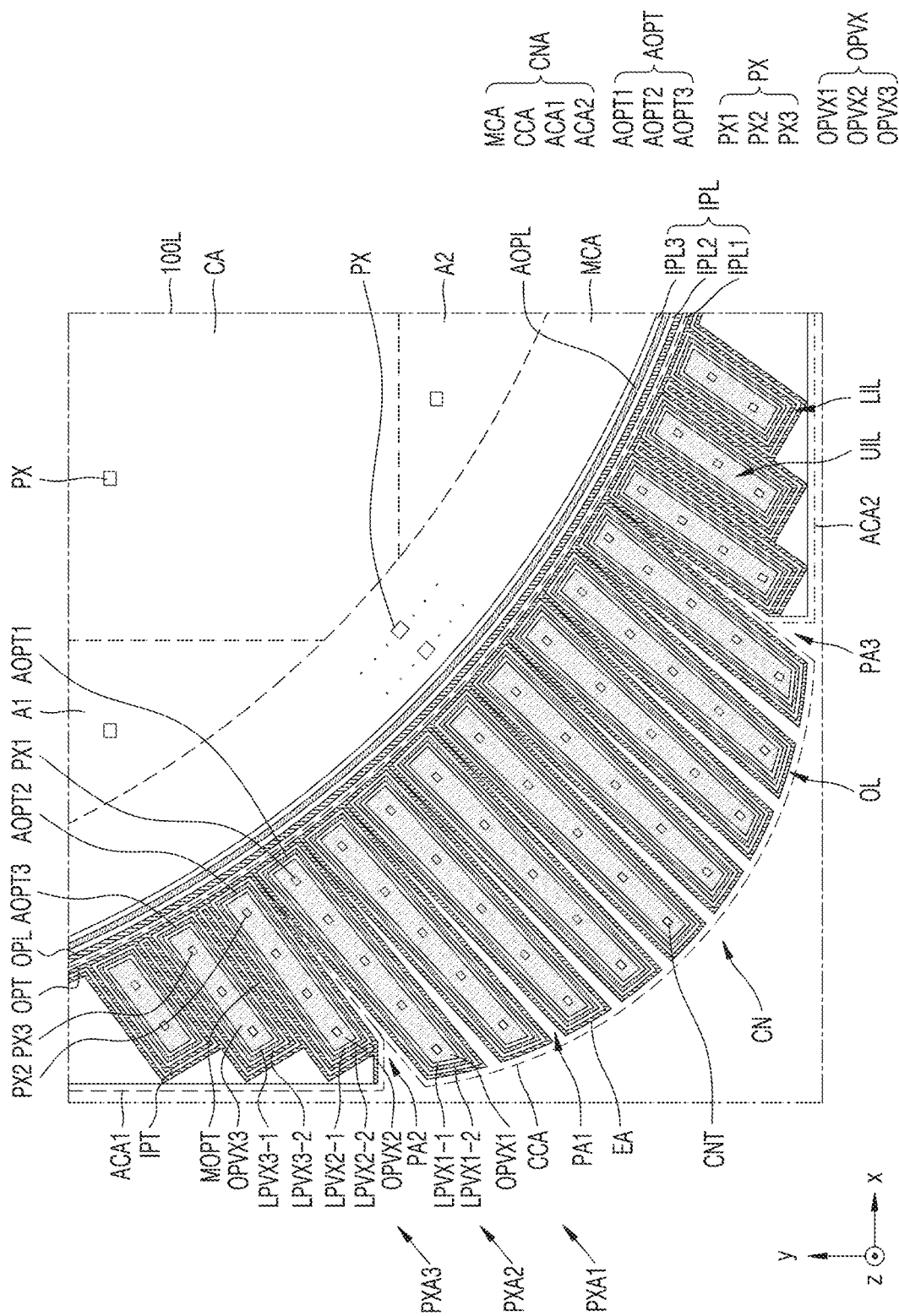
FIG. 15 is a plan view illustrating a method of manufacturing a display device according to an embodiment.

FIG. 14A is a plan view illustrating a method of manufacturing a display device according to an embodiment. FIGS. 14B and 14C are cross-sectional views of a display device under manufacture taken along line P-P' of FIG. 14A. FIG. 15 is a plan view illustrating a method of manufacturing a display device according to an embodiment.

Referring to FIGS. 14A and 14B, at least one organic encapsulating layer may be formed on at least one inorganic encapsulating layer. In an embodiment, the organic encapsulating layer 320 may be formed on the first inorganic encapsulating layer 310.

When at least one organic encapsulating layer is formed, the first pixel array PXA1, a second pixel array PXA2, and a third pixel array PXA3 may be checked. In an embodiment, it may be checked in which direction each of the first pixel array PXA1, the second pixel array PXA2 and the third pixel array PXA3 extends.

In an embodiment, the shapes of the central area CA, the first area A1, the second area A2, and the middle corner area MCA may be checked. In an embodiment, the shape of at least one of the organic pattern line OPL and the auxiliary organic pattern line AOPL may be checked.

Then, monomer may be discharged in consideration of the first pixel array PXA1, the second pixel array PXA2, and the third pixel array PXA3. In an embodiment, the monomer may be discharged in the extended direction in consideration of a direction in which each of the first pixel array PXA1, the second pixel array PXA2 and the third pixel array PXA3 extends. The monomer may be a material included in at least one organic encapsulating layer.

In an embodiment, the monomer may be discharged to the central area CA, the first area A1, the second area A2, and the middle corner area MCA. In an embodiment, the monomer may be discharged in consideration of the shape of at least one of the organic pattern line OPL and the auxiliary organic pattern line AOPL. For example, the monomer may be discharged so that at least one organic encapsulating layer may be formed similarly to the shape of the organic pattern line OPL.

In an embodiment, the organic encapsulating layer 320 may fill the hole HL. In an embodiment, the organic encapsulating layer 320 may fill a plurality of holes HL. In an embodiment, the organic encapsulating layer 320 may fill any one of the plurality of holes HL and may not fill the other one of the plurality of holes HL. In some embodiments, the organic encapsulating layer 320 may not fill the hole HL.

At least one organic encapsulating layer may include a first encapsulating area covering the first display element, a second encapsulating area covering the second display element, and a third encapsulating area covering a third display element. In an embodiment, the organic encapsulating layer 320 may include a first encapsulating area 320A covering the first organic light emitting diode OLED1 as a first display element, a second encapsulating area 320B covering the second organic light emitting diode OLED2 as a second display element, and a third encapsulating area 320C covering the third organic light emitting diode OLED3 as a third display element.

The first encapsulating area 320A, the second encapsulating area 320B, and the third encapsulating area 320C may be separated from each other based on the organic pattern OPT. For example, the first encapsulating area 320A may extend from the first organic light emitting diode OLED1 to the organic pattern OPT arranged in the central corner area CCA. The second encapsulating area 320B may extend from the second organic light emitting diode OLED2 to the organic pattern OPT adjacent to the second organic light emitting diode OLED2. The third encapsulating area 320C may extend from the third organic light emitting diode OLED3 to the organic pattern OPT adjacent to the third organic light emitting diode OLED3.

Unlike in the present embodiment, when the organic pattern OPT entirely surrounds the second organic light emitting diode OLED2 and the third organic light emitting diode OLED3, or when the organic pattern OPT entirely surrounds the second pixel array PXA2 and the third pixel array PXA3, or when the organic pattern OPT extends along edges of the first adjacent corner area ACA1, the monomer may be discharged in consideration of edges of the first adjacent corner area ACA1. In this case, the amount of monomer to be discharged to the first adjacent corner area ACA1 or a method of discharging monomer may need to be separately set. Also, the amount of monomer discharged to the first adjacent corner area ACA1 may be greater than the amount of monomer discharged to one extension area EA, and monomer discharged to the first adjacent corner area ACA1 may overflow beyond the organic pattern OPT. In this case, at least one organic encapsulating layer may be formed even in the outer area OA. At least one organic encapsulating layer formed in the outer area OA may connect the central corner area CCA and the first adjacent corner area ACA1 to each other. Thus, stress applied when the central corner area CCA is bent, may be increased so that the display panel and/or the display device may be damaged.

In the present embodiment, in the first adjacent corner area ACA1, the organic pattern OPT may surround each of the second organic light emitting diode OLED2 and the third organic light emitting diode OLED3. Alternatively, in the first adjacent corner area ACA1, the organic pattern OPT may surround each of the second pixel array PXA2 and the third pixel array PXA3. In this case, the amount of monomer to be discharged to the first adjacent corner area ACA1, the second adjacent corner area ACA2, and the central corner area CCA and/or a method of discharging monomer may be simultaneously set. Also, monomer may be discharged in consideration of the extension direction of the second pixel array PXA2 and the third pixel array PXA3, and at least one organic encapsulating layer may be prevented or reduced from being formed in the outer area OA. Thus, stress applied when the central corner area CCA is bent may be reduced.

The second inorganic encapsulating layer 330 may be formed on the organic encapsulating layer 320. The second inorganic encapsulating layer 330 may be entirely and continuously formed in the first adjacent corner area ACA1 and the central corner area CCA similarly to the first inorganic encapsulating layer 310. In an embodiment, the second inorganic encapsulating layer 330 may be in contact with the first inorganic encapsulating layer 310 on the organic pattern OPT.

Referring to FIGS. 14C and 15, the substrate layer 100L may be detached from the support substrate SS. In an embodiment, the substrate layer 100L may be detached from the support substrate SS according to a laser releasing method of irradiating laser onto the substrate layer 100L. Laser may be irradiated in a direction from the lower surface SSLS of the support substrate SS to the upper surface SSUS of the support substrate SS. Thus, the laser may be irradiated toward the lower surface of the substrate layer 100 that faces the upper surface SSUS of the support substrate SS. The laser may be, for example, an excimer laser having a wavelength of 308 nm, or a solid ultraviolet (UV) laser having a wavelength of 343 nm or 355 nm.

A first penetration area PA1 in which adjacent ends of the plurality of extension areas EA are spaced apart from each other, may be formed. The first penetration area PA1 may be an empty area of the display panel 10. Elements of the display panel 10 may not be arranged in the first penetration area PA1. In other words, adjacent edges of the plurality of extension areas EA may be defined by the first penetration area PA1. Because the adjacent ends of the plurality of extension areas EA are spaced apart from each other by the first penetration area PA1, the plurality of extension areas EA may be contracted. Thus, the display panel 10 may be bent in the central corner area CCA without damage.

A second penetration area PA2 in which an end of the adjacent central corner area CCA and an end of the first adjacent corner area ACA1 are spaced apart from each other, may be formed. The second penetration area PA2 may be an empty area of the display panel 10. Elements of the display panel 10 may not be arranged in the second penetration area PA2. In other words, an edge of the first adjacent corner area ACA1 and an edge of the extension area EA of the central corner area CCA that face each other may be defined by the second penetration area PA2.

A third penetration area PA3 in which the end of the adjacent central corner area CCA and the end of the second adjacent corner area ACA2 are spaced apart from each other, may be formed. The third penetration area PA3 may be an empty area of the display panel 10. Elements of the display panel 10 may not be arranged in the third penetration area PA3. In other words, the edge of the second adjacent corner area ACA2 and the edge of the extension area EA of the central corner area CCA that face each other may be defined by the third penetration area PA3.

The blocking layer BL may be arranged below the inorganic insulating pattern IIP, the dummy upper inorganic pattern DUPT, and the dummy organic pattern DOPT and absorb the laser. Thus, even when laser is irradiated, the organic insulating pattern IIP, the dummy upper inorganic pattern DUPT, and the dummy organic pattern DOPT may not be detached from the support substrate SS.

Figure 16:
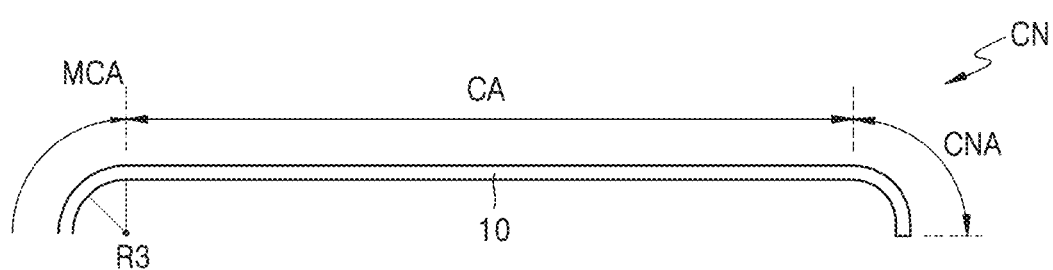
FIGS. 16 and 17 are cross-sectional views illustrating a method of manufacturing a display device according to an embodiment.
Figure 17:
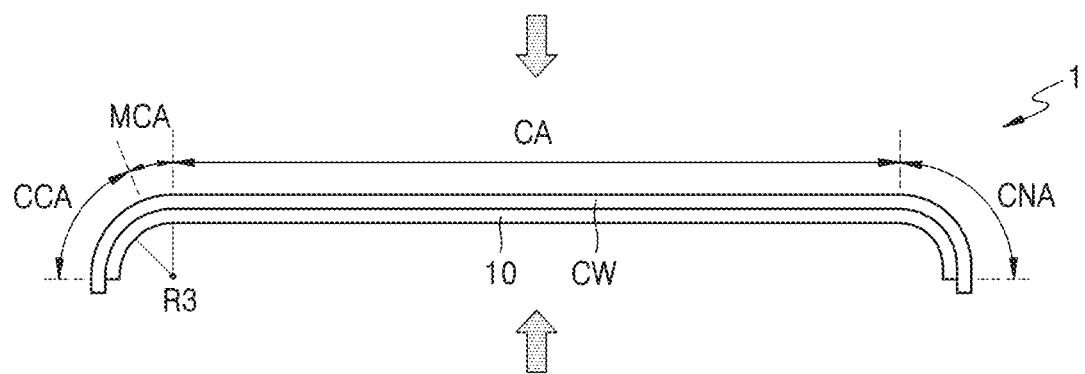

FIGS. 16 and 17 are cross-sectional views illustrating a method of manufacturing a display device according to an embodiment.

Referring to FIG. 16, a display panel 10 may be bent. In an embodiment, the corner area CNA that overlaps the corner CN of the display panel 10 may be bent. In an embodiment, in the corner area CNA, a guide film may be arranged under the display panel 10 and may be bent in a vacuum state. In an embodiment, the corner area CNA may be bent by a thermoforming manner.

In an embodiment, the central corner area CCA may be bent. In an embodiment, the corner area CNA may include a third curvature radius R3.

Referring to FIG. 17, a cover window CW may be arranged on the display panel 10 manufactured as described above. In an embodiment, the cover window CW may be arranged in the central area CA and the corner area CNA. In an embodiment, the cover window CW may be arranged in the central area CA and the central corner area CCA.

In an embodiment, the display panel 10 and the cover window CW may be bonded together. The display panel 10 and the cover window CW may be connected to each other by an optical transparent adhesive (not shown). The display panel 10 may be bonded to the cover window CW through a lamination process. Thus, the cover window CW may be arranged in the corner area CNA of the display panel 10. In the display device 1 according to an embodiment, the corner area CNA may be bent so that the sense of aesthetics may be enhanced.

Figure 18:
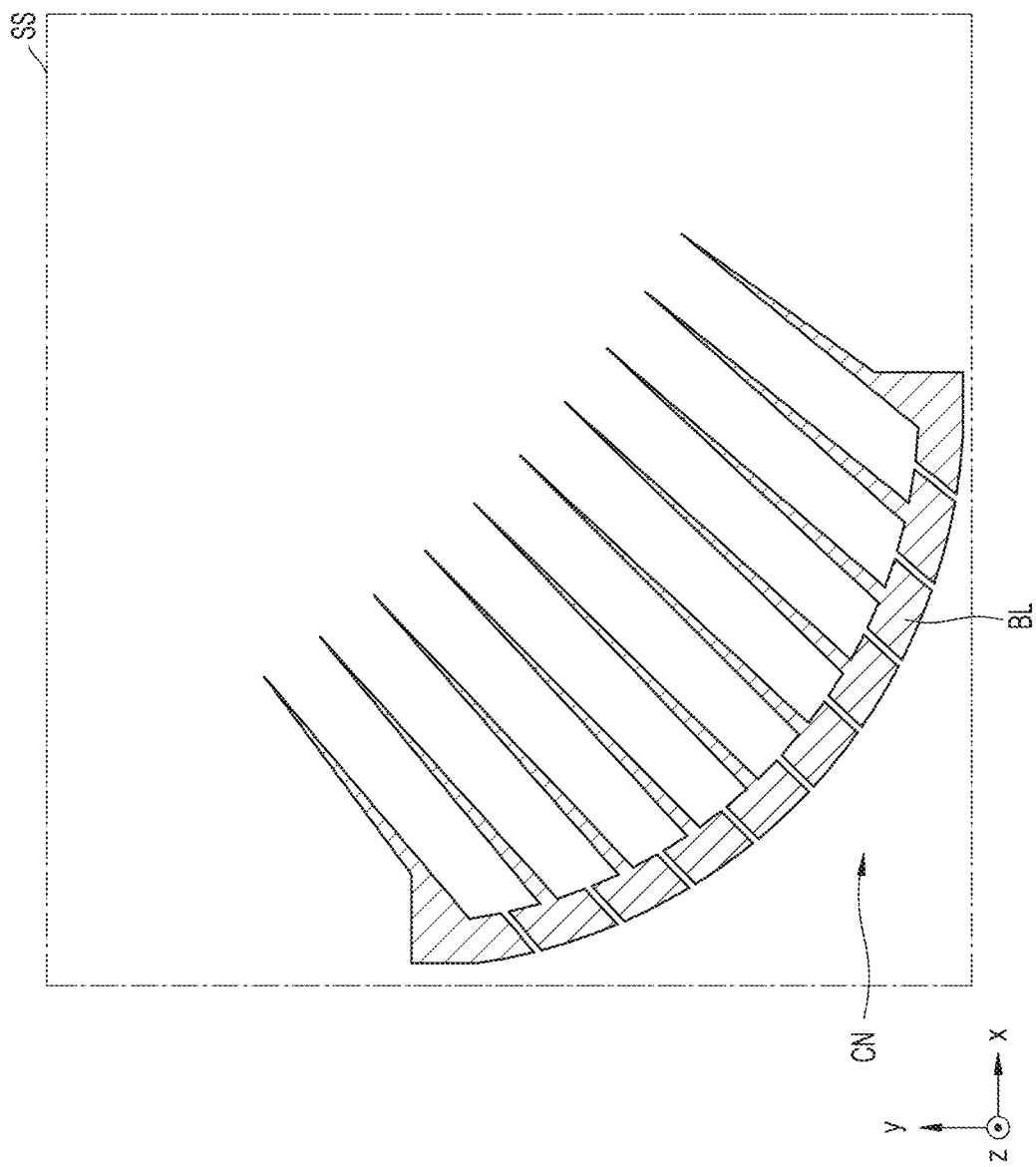
Figure 19:
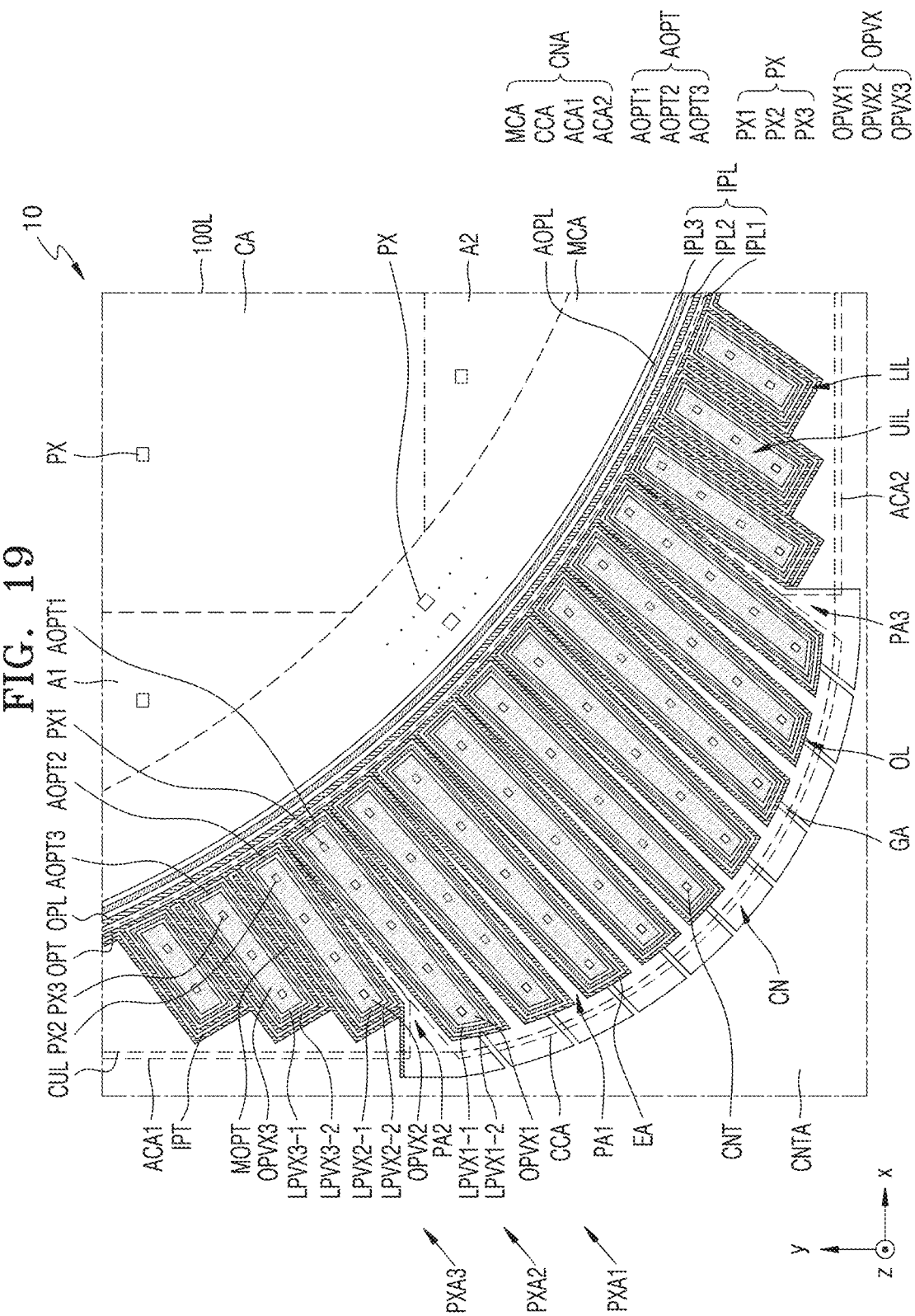

FIGS. 18 through 20 are plan views illustrating a method of manufacturing a display device according to another embodiment. In FIGS. 18 through 20, the same reference numerals as those of FIGS. 9 and 15 refer to the same elements, and thus a redundant description thereof will be omitted.

Referring to FIG. 18, the blocking layer BL may be formed on the support substrate SS. The blocking layer BL may be formed to correspond to the corner CN in the display panel and/or the display device under manufacture. In an embodiment, a plurality of blocking layers BL may be provided. The plurality of blocking layers BL may be spaced apart from each other. Each of the plurality of blocking layers BL may include an extension portion.

Then, a substrate layer may be formed on the blocking layer BL and the support substrate SS. Subsequently, a method of forming a display panel and/or a display device is similar to FIGS. 11A through 14C and thus, a detailed description thereof will be omitted.

Then, the substrate layer may be detached from the support substrate SS.

Referring to FIGS. 19 and 20, a first penetration area PA1 in which adjacent ends of the plurality of extension areas EA are spaced apart from each other, may be formed. A second penetration area PA2 in which the end of the adjacent central corner area CCA and the end of the first adjacent corner area ACA1 are spaced apart from each other, may be formed. A third penetration area PA3 in which the end of the adjacent central corner area CCA and the end of the second adjacent corner area ACA2 are spaced apart from each other, may be formed.

The substrate layer 100L detached from the support substrate may include a central area CA, a first area A1, a second area A2, a corner area CNA, a guide area GA, and a connection area CNTA. The corner area CNA may surround at least a portion of the central area CA, the first area A1, and the second area A2. The corner area CNA may include a central corner area CCA, a first adjacent corner area ACA1, a second adjacent corner area ACA2, and a middle corner area MCA. The central corner area CCA may include a plurality of extension areas EA.

The guide area GA may be an area that extends from an end of the extension area EA. A plurality of guide areas GA may be provided. In an embodiment, the guide area GA may be between adjacent first penetration areas PA1, between the first penetration area PA1 and the second penetration area PA2, and between the first penetration area PA1 and the third penetration area PA3.

The connection area CNTA may connect a plurality of guide areas GA, the first adjacent corner area ACA1, and the second adjacent corner area ACA2. In an embodiment, the connection area CNTA, the plurality of guide areas GA, the first adjacent corner area ACA1, and the second adjacent corner area ACA2 may be integrally provided.

In an embodiment, the first penetration area PA1, the second penetration area PA2, and the third penetration area PA3 may be spaced apart from each other. Each of the first penetration area PA1, the second penetration area PA2, and the third penetration area PA3 may have a single closed curve shape. In an embodiment, the plurality of extension areas EA, the plurality of guide areas GA, the first adjacent corner area ACA1, and the second adjacent corner area ACA2 may define the first penetration area PA1, the second penetration area PA2, and the third penetration area PA3 each having a single closed curve shape.

When the substrate layer 100L is separated from the support substrate, the guide area GA may fix the extension area EA to the connection area CNTA. Thus, when the substrate layer 100L is separated from the support substrate, damage of the extension area EA or unintended deformation may be prevented or reduced.

Then, at least a portion of the connection area CNTA may be removed. In an embodiment, the connection area CNTA may be cut along a cutting line CUL. For example, the connection area CNTA may be laser-cut along the cutting line CUL. In an embodiment, when at least a portion of the connection area CNTA is removed, a portion of the guide area GA may also be removed. In an embodiment, the other portion of the guide area GA may remain in the end of the extension area EA and may be an auxiliary extension area AEA.

As described above, a display panel and a display device according to one or more embodiments may include a first display element arranged in a central corner area extending in a direction away from a central area, a second display element and a third display element, which are arranged in a first adjacent corner area adjacent to the central corner area, and each of the first display element, the second display element, and the third display element may be surrounded by an organic pattern. Thus, because a second penetration area between the central corner area and the first adjacent corner area may be maintained as an empty area, the reliability of the display panel and the display device may be increased.

Also, in a method of manufacturing a display device according to one or more embodiment, a display device in which a second penetration area is maintained as an empty area by an organic pattern, may be easily manufactured.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
a substrate including a central area and a corner area, wherein the corner area includes a central corner area including a plurality of extension areas extending in a direction away from the central area and a first adjacent corner area adjacent to the central corner area;
a plurality of display elements including a first display element arranged in the plurality of extension areas and a second display element and a third display element arranged in the first adjacent corner area; and
an organic pattern arranged on the substrate and surrounding each of the first display element, the second display element, and the third display element,
wherein:
ends of the plurality of adjacent extension areas are spaced apart from each other by a first penetration area; and
an end of the central corner area and an end of the first adjacent corner area that are adjacent to each other are spaced apart from each other by a second penetration area.

2. The display panel of claim 1, further comprising an inorganic pattern arranged in the first adjacent corner area, wherein:
each of the first display element, the second display element, and the third display element is provided in plurality to constitute a first pixel array, a second pixel array, and a third pixel array, respectively;
the organic pattern surrounds each of the first pixel array, the second pixel array, and the third pixel array; and
the inorganic pattern extends between the second pixel array and the third pixel array.

3. The display panel of claim 2, wherein the inorganic pattern surrounds at least a portion of each of the second pixel array and the third pixel array.

4. The display panel of claim 2, wherein the inorganic pattern comprises:
a first portion extending in a direction closer to the central area;
a curved portion extending from the first portion in a curve shape; and
a second portion extending from the curved portion in a direction away from the central area.

5. The display panel of claim 1, further comprising an inorganic pattern arranged in the first adjacent corner area; and
an organic insulating layer arranged on the inorganic pattern and having a hole overlapping at least a portion of the inorganic pattern,
wherein the plurality of display elements and the organic pattern are arranged on the organic insulating layer.

6. The display panel of claim 5, further comprising an upper inorganic pattern arranged between the organic insulating layer and the organic pattern and having a protruding tip protruding in a center direction of the hole.

7. The display panel of claim 1, further comprising an encapsulating layer covering the plurality of display elements and comprising at least one inorganic encapsulating layer and at least one organic encapsulating layer,
wherein:
the at least one organic encapsulating layer comprises a first encapsulating area covering the first display element, a second encapsulating layer covering the second display element, and a third encapsulating area covering the third display element; and
the first encapsulating area, the second encapsulating area, and the third encapsulating area are separated from each other based on the organic pattern.

8. The display panel of claim 1, further comprising:
an inorganic insulating layer arranged between the substrate and the plurality of display elements; and
a lower organic insulating layer arranged between the inorganic insulating layer and the plurality of display elements,
wherein the inorganic insulating layer and the lower organic insulating layer arranged in the central corner area are disconnected from the inorganic insulating layer and the lower organic insulating layer arranged in the first adjacent corner area with the second penetration area therebetween, and the inorganic insulating layer and the lower organic insulating layer arranged in the first adjacent corner area are respectively continuously arranged.

9. The display panel of claim 1, wherein the substrate comprises:
a first area extending from the central area in a first direction; and
a second area extending from the central area in a second direction crossing the first direction,
the corner area surrounds at least a portion of the first area, the second area, and the central area, and
at least a portion of the first area is arranged between the central area and the first adjacent corner area in the first direction.

10. The display panel of claim 9, wherein:
the corner area further comprises a second adjacent corner area adjacent to the central corner area;
an end of the central corner area and an end of the second adjacent corner area are spaced apart from each other by a third penetration area; and
at least a portion of the second area is arranged between the central area and the second adjacent corner area in the second direction.

11. Display device comprising:
a display panel; and
a cover window arranged on the display panel,
wherein the display panel comprises:
a substrate including a central area and a corner area being bent, wherein the corner area includes a central corner area including a plurality of extension areas extending in a direction away from the central area and a first adjacent corner area adjacent to the central corner area;
a plurality of display elements comprising a first display element arranged in the plurality of extension areas and a second display element and a third display element arranged in the first adjacent corner area; and
an organic pattern arranged on the substrate and surrounding each of the first display element, the second display element, and the third display element,
wherein:
ends of the plurality of adjacent extension areas are spaced apart from each other by a first penetration area; and
an end of the central corner area and an end of the first adjacent corner area are spaced apart from each other by a second penetration area.

12. The display device of claim 11, wherein:
the display panel further comprises an inorganic pattern arranged on the substrate;
each of the first display element, the second display element, and the third display element is provided in plurality to constitute a first pixel array, a second pixel array, and a third pixel array, respectively; and
the inorganic pattern comprises a first portion extending between the second pixel array and the third pixel array and extending in a direction closer to the central area, a curved portion extending from the first portion in a curve shape, and a second portion extending from the curved portion in a direction away from the central area.

13. The display device of claim 11, wherein:
the display panel further comprises an encapsulating layer covering the plurality of display elements and comprising at least one inorganic encapsulating layer and at least one organic encapsulating layer;
the at least one organic encapsulating layer comprises a first encapsulating area covering the first display element, a second encapsulating area covering the second display element, and a third encapsulating area covering the third display element; and
the first encapsulating area, the second encapsulating area, and the third encapsulating area are spaced apart from each other based on the organic pattern.

14. The display device of claim 11, wherein the substrate further comprises:
a first area extending from the central area in a first direction; and
a second area extending from the central area in a second direction crossing the first direction,
wherein:
the corner area surrounds at least a portion of the first area, the second area, and the central area; and
at least a portion of the first area and the first adjacent corner area are arranged and bent in the first direction.

15. The display device of claim 14, wherein:
the corner area further comprises a second adjacent corner area adjacent to the central corner area;
an end of the central corner area and an end of the second adjacent corner area are spaced apart from each other by a third penetration area; and
at least a portion of the second area and the second adjacent corner area are arranged and bent in the second direction.

* * * * *